(12) United States Patent
Amanullah et al.

(10) Patent No.: US 9,934,565 B2
(45) Date of Patent: Apr. 3, 2018

(54) SYSTEMS AND METHODS FOR AUTOMATICALLY VERIFYING CORRECT DIE REMOVAL FROM FILM FRAMES

(71) Applicant: ASTI HOLDINGS LIMITED, Singapore (SG)

(72) Inventors: Ajharali Amanullah, Singapore (SG); Tim Hing Lai, Singapore (SG); Jing Lin, Singapore (SG); Lian Seng Ng, Singapore (SG); Soon Guan Tan, Singapore (SG)

(73) Assignee: Asti Holdings Limited, Singapore (SG)

( * ) Notice: Subject to any disclaimer, the term of this patent is extended or adjusted under 35 U.S.C. 154(b) by 86 days.

(21) Appl. No.: 14/896,311

(22) PCT Filed: Jun. 6, 2014

(86) PCT No.: PCT/SG2014/000262
§ 371 (c)(1),
(2) Date: Dec. 4, 2015

(87) PCT Pub. No.: WO2014/209226
PCT Pub. Date: Dec. 31, 2014

(65) Prior Publication Data
US 2016/0125583 A1    May 5, 2016

Related U.S. Application Data

(60) Provisional application No. 61/832,153, filed on Jun. 7, 2013.

(51) Int. Cl.
*H04N 9/47* (2006.01)
*H04N 17/00* (2006.01)
(Continued)

(52) U.S. Cl.
CPC ............ *G06T 7/001* (2013.01); *G06K 9/4604* (2013.01); *G06K 9/4661* (2013.01);
(Continued)

(58) Field of Classification Search
CPC  H04N 9/47; H04N 7/18; H04N 17/00; H04N 17/02
(Continued)

(56) References Cited

U.S. PATENT DOCUMENTS 7,729,528 B2    6/2010  O'Dell et al.
2003/0010657 A1    1/2003  Zabka et al.
(Continued)

FOREIGN PATENT DOCUMENTS

JP    2004288792 A    10/2004
JP    2007033070 A    2/2007
(Continued)

*Primary Examiner* — Daquan Zhao
(74) *Attorney, Agent, or Firm* — The Webb Law Firm

(57) ABSTRACT

A skeleton wafer inspection system includes an expansion table displaceable relative to a camera configured for capturing segmental images of a skeleton wafer on a film frame. During segmental image capture, illumination is directed to the top and/or bottom of the film frame. Segmental images are digitally stitched together to produce a composite image, which can be processed to identify die presence or absence therein at active area die positions having counterpart die positions in a process wafer map. A composite image of a diced wafer on a film frame can also be generated, and used as a navigation aid or guide during die sort operations, or to verify whether a die sort apparatus has correctly detected a reference die prior to die sort operations. A composite image of a skeleton wafer can similarly be generated for use as a navigation aid or guide for film frame repopulation operations.

25 Claims, 28 Drawing Sheets

(51) Int. Cl.
  *H04N 7/18* (2006.01)
  *G06T 7/00* (2017.01)
  *H01L 21/67* (2006.01)
  *G06K 9/46* (2006.01)
  *G06T 11/60* (2006.01)
  *H04N 5/225* (2006.01)
  *G06T 7/33* (2017.01)
  *G06T 7/73* (2017.01)
  *G06T 7/13* (2017.01)
  *H04N 17/02* (2006.01)

(52) U.S. Cl.
  CPC .............. *G06T 7/0008* (2013.01); *G06T 7/13* (2017.01); *G06T 7/337* (2017.01); *G06T 7/74* (2017.01); *G06T 11/60* (2013.01); *H01L 21/67259* (2013.01); *H01L 21/67271* (2013.01); *H04N 5/2256* (2013.01); *G06T 2207/20221* (2013.01); *G06T 2207/30148* (2013.01)

(58) Field of Classification Search
  USPC ................ 348/87, 86, 61, 92, 180, 181
  See application file for complete search history.

(56) References Cited

U.S. PATENT DOCUMENTS

| | | |
|---|---|---|
| 2005/0000866 A1* | 1/2005 | Caparro .................... B07C 5/36 209/552 |
| 2007/0275541 A1 | 11/2007 | Harris et al. |
| 2008/0032203 A1* | 2/2008 | Phillipps ............. G03F 7/70475 430/5 |
| 2008/0095600 A1 | 4/2008 | Hagio et al. |
| 2009/0034831 A1 | 2/2009 | Amanullah et al. |
| 2010/0080445 A1 | 4/2010 | Polonsky et al. |
| 2010/0188486 A1 | 7/2010 | Amanullah et al. |
| 2010/0232915 A1 | 9/2010 | Jin et al. |
| 2013/0248709 A1* | 9/2013 | Yamamoto ............. H01J 37/26 250/309 |
| 2015/0214090 A1 | 7/2015 | Jin et al. |

FOREIGN PATENT DOCUMENTS

| | | |
|---|---|---|
| KR | 1020120056404 A | 6/2012 |
| SG | 2011034253 | 12/2012 |
| WO | 2009128790 A2 | 10/2009 |
| WO | 2010082901 A2 | 7/2010 |
| WO | 2014035346 A1 | 3/2014 |

* cited by examiner

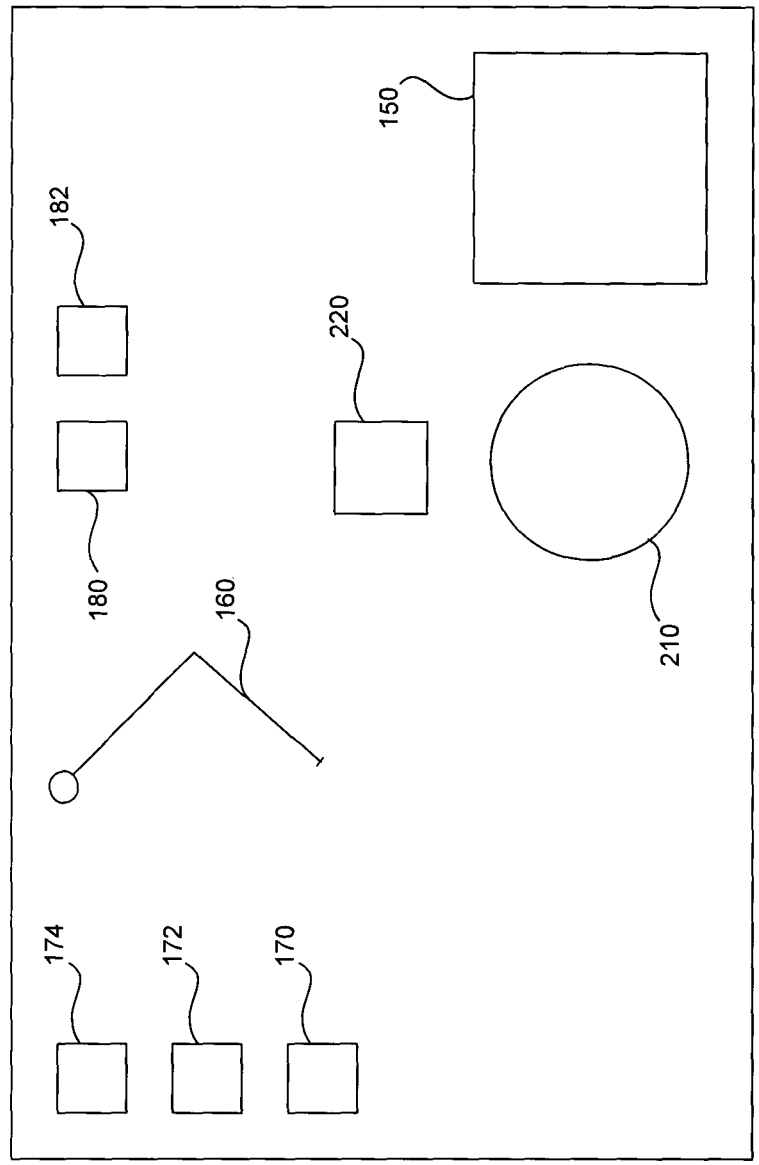

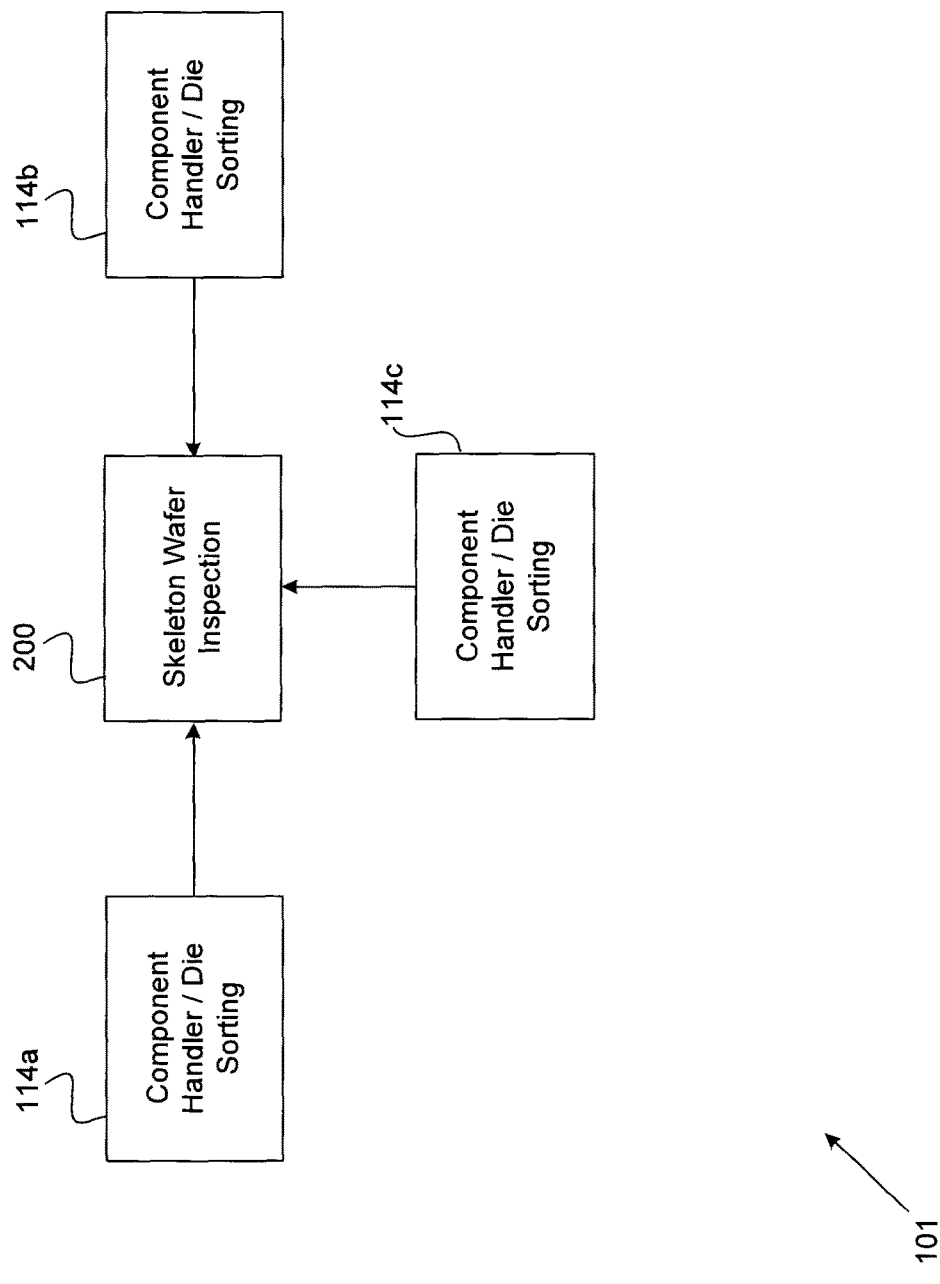

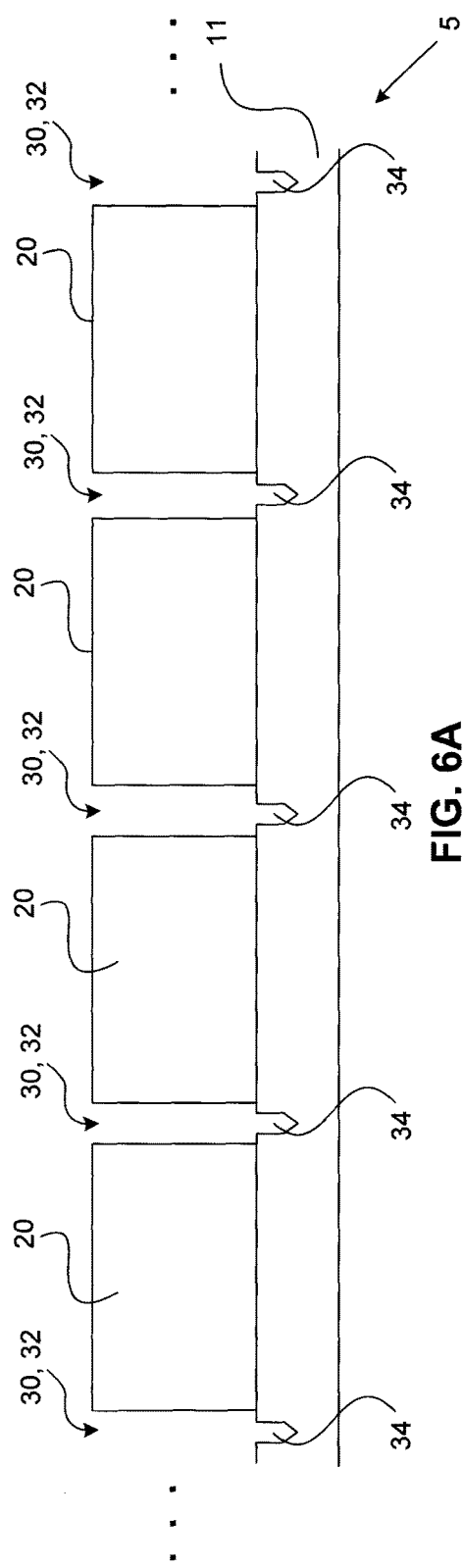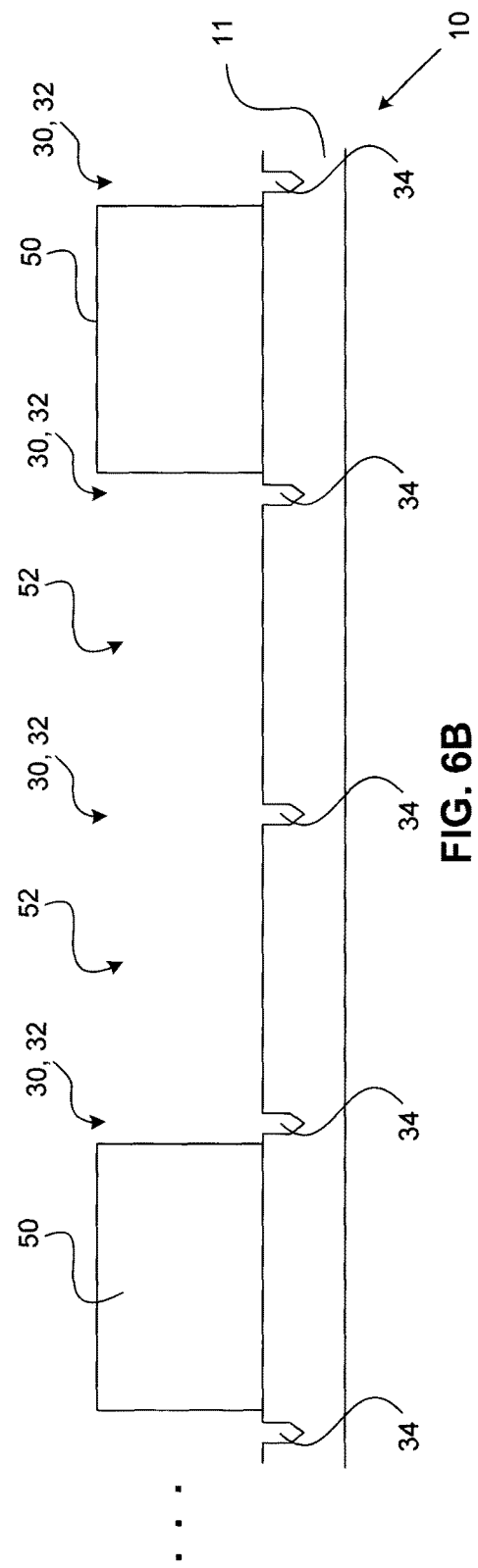

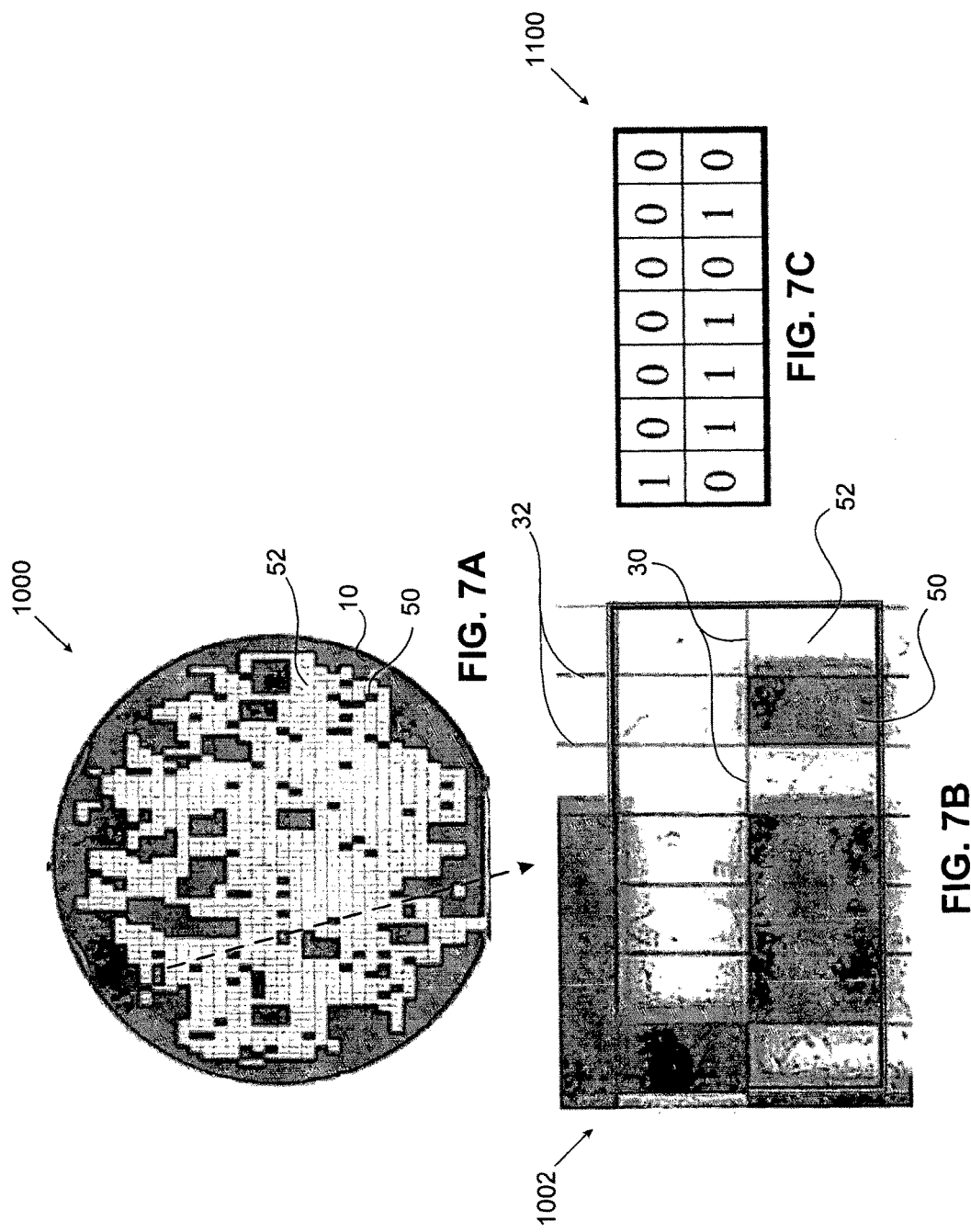

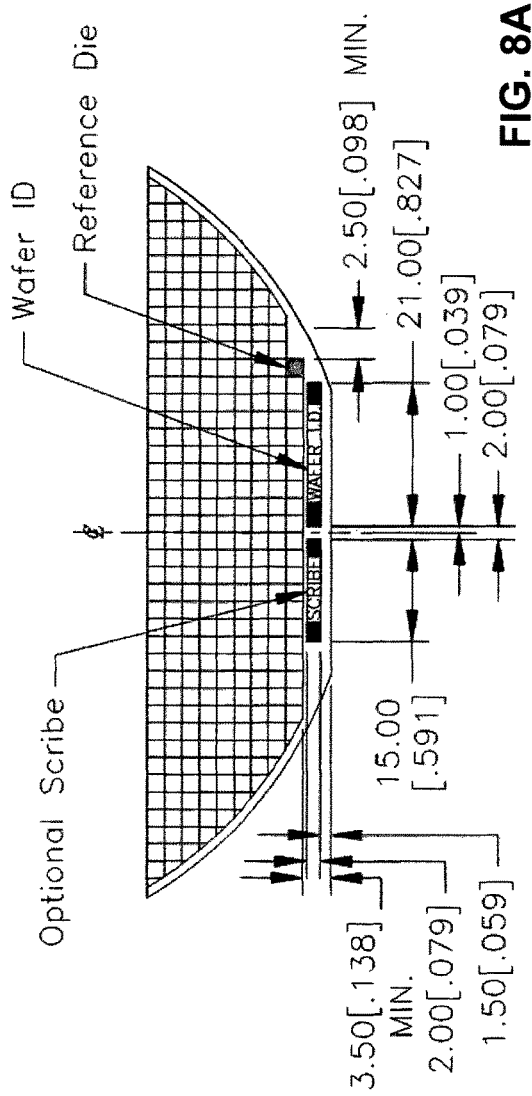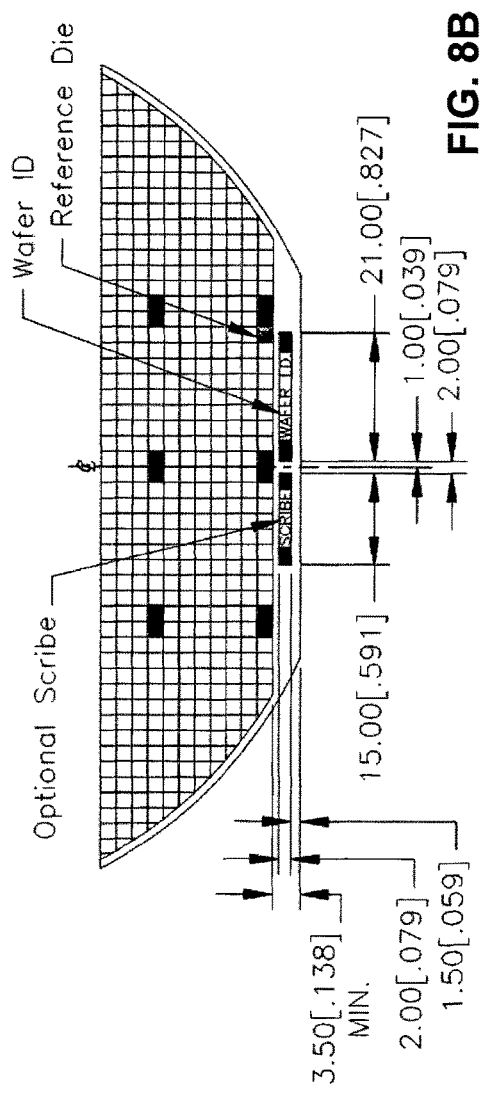
FIG. 8A
FIG. 8B

SYSTEMS AND METHODS FOR AUTOMATICALLY VERIFYING CORRECT DIE REMOVAL FROM FILM FRAMES

CROSS-REFERENCE TO RELATED APPLICATIONS

This application is the United States national phase of International Application No. PCT/SG2014/000251 filed Jun. 6, 2014, and claims priority to U.S. Provisional Patent Application No. 61/832,153 filed Jun. 7, 2013, the disclosures of which are hereby incorporated in their entirety by reference.

TECHNICAL FIELD

The present disclosure relates generally to a system and a method for verifying whether die carried by a film frame (e.g., provided by a wafer mounted to the film frame) have been correctly removed from the film frame during die sort operations.

BACKGROUND

Semiconductor component manufacturing involves multiple types of processes, which can generally be categorized as front-end processes or back-end processes. Front-end processing includes fabrication of multi-layer semiconductor devices starting from a bare semiconductor wafer to form an array of components or die on the wafer, where each die corresponds to a distinct semiconductor component (e.g., an integrated circuit chip that is intended for incorporation into an integrated circuit package). After front-end processing, the wafer undergoes back-end processing which includes electrical testing of fabricated semiconductor die to determine if the fabricated dies are electrically good or bad; and visual inspection of the fabricated die in accordance with predetermined test criteria.

Process Wafer Map

For each wafer, during an initial front end processing step a "process map" or "processed wafer map" (PW map) is created. The PW map is a digital dataset that provides a record of which of the wafer's die are good, and which are defective, based upon the results of electrical tests and visual inspections performed during front-end and back-end processing.

Typically, wafers are circular. Die at the edges or situated at the outermost borders of a wafer are typically not usable for manufacture. Consequently, a PW map typically stores information for or defining a collective or total interior area or "active area" or "active die area" of the wafer within which processed dies are to be manufactured, where this active area typically spans less than the wafer's total surface area. Die within the active area can be referred to as active die; and die outside of the active area can be referred to unprocessed die, dummy die, or mirror die due to their having a "mirror like" reflective unprocessed surface. In most cases, the PW map contains a dataset principally relating only to die within the wafer's active area, along with some information on dummy or mirror die for purpose of determining and counterchecking the position of one or more reference die. Therefore, the PW Map for a wafer does not represent or completely map to every grid position on the physical wafer, but rather represents a subset of the whole wafer, substantially or essentially corresponding to the wafer's active area in which die 20 have been fabricated.

Each wafer carries an associated physical wafer identifier (ID) such as a barcode, and each wafer's PW map is digitally linked to the physical wafer ID. The wafer's PW map "follows" the wafer during front end and back end processing, and is updated on an ongoing basis during each set of electrical tests and visual inspections to which the wafer is subjected. Within the PW map, a data field corresponding to each active area die position is updated with a specific and distinct code that describes in combination whether the corresponding die 20 is electrically good or bad, and whether it is visually good or visually defective.

FIG. 1 illustrates a block diagram organization of particular portions of one representative type of prior art semiconductor component manufacturing system 100 directed to aspects of back-end semiconductor manufacturing processes, as described hereafter.

First Visual Inspection

A first visual inspection system, apparatus, or module 102 is provided, which includes at least one image acquisition system, and which is configured for performing a first visual inspection upon a wafer to identify die on the wafer that are physically defective as a result of not being formed correctly, or having surface defects, or not having incorrect dimensions.

Bumping and Second Visual Inspection

For various types of components, after the first visual inspection, the wafer undergoes a bumping process in which solder bumps are disposed or "bumped" at predetermined positions onto wafer die. A "post-bump" second visual inspection module 104 is configured to visually inspect wafer die to assess the position and planarity of solder balls on the die, and identify those die having solder balls that are out of a predetermined planarity or dimension.

During the first and second visual inspections, should a die be identified as visually acceptable, a visual pass code is registered by the first and/or second visual inspection module 102, 104 within the PW map, in accordance with the die's location on the wafer. For a die that includes a particular type of visual defect, the first and/or second visual inspection modules 102, 104 register a corresponding visual reject code within the PW map.

First Partial Singulation

Following the post-bump second visual inspection, the wafer is mounted on a film frame by way of an adhesive or tacky film, and provided to a first singulation system, apparatus, or module 106, whereupon the wafer undergoes a partial or first singulation that involves physically separating the die on the wafer from each other along x-y gridlines defined thereon such that a physical gap exists between each die, and the die are thus essentially completely electrically isolated from one another. As a result of this partial singulation, the wafer is not completely diced through or singulated, and the dies are still carried by an underlying portion of the wafer.

Electrical Testing

After partial singulation, the wafer is transferred to an electrical testing system, apparatus, or module 108, which carries out a set of electrical tests on wafer die, such as by way of a wafer prober. For each die, a corresponding electrical testing pass or fail code as well as the die's electrical test results are registered within the PW map by the electrical testing module 108.

Final Singulation

After electrical testing, the wafer is transferred to a final or second singulation or dicing system, apparatus, or module 110, and undergoes a final singulation or dicing procedure whereby the wafer is completely diced through and individual die are completely separated or isolated from the wafer and each other. In association with the second singulation procedure, the adhesive film on which the die reside is radially stretched to increase the separation between individual die, to thereby facilitate selective die removal from the film frame during die sort operations, which are further described below. As a result of the second singulation procedure, individual die remain on the film frame in their overall relative positions they occupied on the wafer before and after the first singulation procedure, but with slightly greater inter-die separations. For instance, a wafer manufacturing process may establish on-wafer "streets" between die having a width of approximately 40 microns. After the second singulation procedure, the inter-die spacing on the film frame can be approximately 70-100 microns, depending upon the amount of stretch imparted to the film carrying the die.

FIG. 2A is an illustration of a representative fully diced wafer 5 and a corresponding plurality of singulated die 20 mounted on a film frame 12 by way of a thin adhesive film 11. In FIG. 2A, singulated die 20 are organized in accordance with the grid that defined their layout on the wafer prior to the singulation procedures. As indicated in FIG. 2A and described above, the singulated die 20 are separated from each other by horizontal and vertical dicing grooves or gridlines 30, 32 that correspond to the wafer streets between die 20 along which wafer sawing or dicing occurred. Any given die 20 can be defined to reside at a particular grid position with respect to the gridlines 30, 32. The as-manufactured wafer, and hence the diced wafer 5, can include a reference die 21, as further detailed below.

Die Sorting Operation Cum Third Visual Inspection

After the second singulation or dicing procedure, the diced wafer 5 on the film frame 12 is transferred to a third, subsequent, or final visual inspection module 112, which performs a third visual inspection procedure to identify visual defects imparted to the singulated die 20 as a result of singulation. During the third visual inspection, the PW map is once again updated in with an appropriate type of visual pass/reject code.

Thus, after the final/third visual inspection, the PW map indicates cumulatively the results of all prior electrical tests and visual inspections, indicating which die 20 on the film frame 12 are (a) electrically good/acceptable; (b) electrically bad; (c) visually good/acceptable; and (d) visually defective. With regard to visual defects, the PW map can indicate for each die 20 whether one or more specific types of defects were identified, such as dimensional defects, scratches, chipping, edge non-uniformity, solder bump co-planarity errors, and/or other types of errors, and whether such defects fall within predetermined tolerance criteria.

Based upon electrical testing and visual inspection results in the PW map, a component handler or die sort system, apparatus, or module 114 can perform a die sorting procedure involving the selective removal of die 20 from the film frame by way of a pick and place apparatus or mechanism, where such selective removal is based upon each die's prior electrical testing and visual inspection results. In association with die sort procedure, the PW map is updated to store pick and place encoder positions, values, or counts, which are typically referenced relative to the encoder positions for the reference die 21 (e.g., the center of the reference die 21). Such encoder positions correspond to real or physical space coordinates, i.e., a real/physical space position or location, of each die 20 considered during the die sort operations. The pick and place apparatus includes or is associated with a high resolution imaging system having an image capture device (e.g., a camera). The die sort apparatus 114 includes a film frame expansion table that carries the diced wafer 5 during pick and place operations, in a manner understood by one of ordinary skill in the relevant art.

During die sorting, die 20 that are electrically bad are intended to remain on the film frame 12, such that they will not be incorporated into downstream or final products. Die 20 that are both electrically good and visually acceptable relative to visual defect specifications are intended to be selectively picked from the film frame 12 and transferred to a particular destination, which is typically a tape reel assembly 120, such that they can be used in downstream or final products. In various situations, die 20 that are electrically good, but which may have one or more types of visual defects (e.g., which fall outside of specified tolerance criteria) can be selectively picked from the film frame 12 and transferred to one or more other particular destinations, such as a set of bins or visual reject trays 122, based upon visual defect type, after which such die 20 can be further evaluated or re-worked.

The die sort apparatus 114 selectively sorts die 20 to particular final destinations, such as the tape and reel assembly 120 or a particular reject bin or tray 122, in accordance with a set of selectable or programmably established sort codes that associates particular final die destinations with the PW map codes corresponding to electrical testing and visual inspection results. In a simplest scenario considered hereafter, a simplified set of sort can be defined, which as shown in Table 1 indicates that only electrically good and visually good die 20, i.e., "good die," are to be picked and transferred to the tape and reel assembly 120 ("PT"); and electrically bad die 20, as well as electrically good yet visually bad die 20, i.e., "bad die," are not to be picked ("NP"), and hence are to remain on the film frame 12.

TABLE 1

Representative Simplified PW Map Code - Sort Code Table

| | PW Map Code | | PW Map Code | |
| --- | --- | --- | --- | --- |
| | Electrically Bad | Sort Code | Electrically Good | Sort Code |
| Visually Good | 0 | NP | 1 | PT |
| Visually Rejected | | | | |
| Symbol/Mark | 0 | NP | 2 | NP |
| Bump Absence | 0 | NP | 3 | NP |
| Bump Planarity | 0 | NP | 4 | NP |
| Dimension | 0 | NP | 5 | NP |
| Scratches | 0 | NP | 6 | NP |
| Chipping | 0 | NP | 7 | NP |

A die 20 that is supposed to remain on the film frame 12 based on preselected criteria can be referred to as a "stay-behind" die. As a result of the selective picking, extraction, or removal of die 20 from the film frame 12 during die sorting, the diced wafer 5 evolves to have a "skeletonized" appearance, becoming a "skeleton wafer." Thus, prior to die sort operations on the diced wafer 5, the diced wafer 5 is "non-skeletonized," or is a "non-skeleton wafer"; during die sort operations on the diced wafer 5, the diced wafer 5 becomes progressively skeletonized as more and more die 20 are removed therefrom; and after die sorting operations on the diced wafer 5 are complete or substantially complete, the film frame 12 carries a skeleton wafer.

FIG. 2B is an illustration of a representative skeleton wafer 10 corresponding to the diced wafer 5 of FIG. 2A, from which die 20 have been selectively picked, and on which only die 20 that are (a) electrically bad, and (b) electrically good, yet visually defective, rejected, unacceptable, or unusable die should remain as stay-behind die on the skeleton wafer 10, in accordance with the set of simplified sort codes of Table 1. In FIG. 2B, (a) the presence of electrically defective stay-behind die 24 is indicated by shaded areas, (b) the presence of electrically viable yet visually defective stay-behind die 25 that are supposed to remain on the skeleton wafer 10 is indicated by cross-hatched areas; and (c) the absence of electrically good die 26 from the skeleton wafer 10, i.e., a skeleton wafer die position that is correctly "empty" 26, is indicated by lack of shading or blank areas.

Ideally, after die sorting is complete, (a) all electrically good die will have been correctly removed from the diced wafer 5; and (b) all stay-behind die that remain on the skeleton wafer 10 are die that are supposed to remain on the skeleton wafer 10. Unfortunately, multiple types of errors can occur during die sorting, resulting in stay-behind die being inadvertently picked from the film frame 12; and/or good die which were designated for picking inadvertently remaining on the film frame 12. Such die sorting errors can have significant adverse economic consequences. For instance, if a stay-behind die is incorporated into a downstream or final product, such as a packaged IC or circuit board, the resulting product will be incapable of reliably meeting one or more performance requirements, leading to a likelihood of downstream product failure. At this stage, the economic loss is not just the cost of the manufacturing the bad stay-behind die, but the cumulative cost of manufacturing a defective end product. The testing, recall, and reworking of such end products can result in great losses to all parties involved. Hence it is important to detect errors in die sorting prior to the distribution of tape reels downstream.

Types of Die Sorting Errors and how they Occur

In general, the causes of die sorting errors can be categorized as (A) reference die detection and retraining errors; (B) general die detection failures; (C) die edge translation errors; (D) other translation errors; and (E) other causes of errors, as described in detail hereafter.

(A) Reference Die Detection and Retraining Errors

In order to accurately perform die sort operations, the pick and place apparatus must first correctly identify a reference structure or reference die 21. Referring again to FIGS. 2A, and 2B, the reference die 21 corresponds to a specific wafer location relative to which the position or coordinates of (a) every other die 20 on the wafer, and hence the diced wafer 5, can be referenced or indexed; and (b) die-by-die PW map results can be reference or indexed such that the die sort apparatus 114 can selectively sort the die 20 to intended destinations defined by the sort codes. For instance, in accordance with the simplified sort codes of Table 1, the identification of the position of a reference die 21 is how the pick and place apparatus (a) references the positions of good die and stay-behind die on the diced wafer 5, and thus (b) identifies during die sort operations the die 20 to be picked from the diced wafer 5.

In many situations, the reference die 21 includes or is a unique structural feature on the wafer having a set of distinct patterns that can be automatically recognized by way of a machine vision/image processing algorithm. The unique structural feature can be, for instance, a distinct pattern on a particular die, or a notch or a specific corner of a flat on the outer edge of the wafer. Provided that an algorithm is sufficiently robust, the automatic identification of the reference die 21 is likely to be successful, and die sort operations can be accurately initiated. However, instances exist when the pick and place apparatus is unable to accurately locate or recognize the reference die 21. This can be due to one or more factors, such as:

(i) Lack of accuracy in wafer mounting on the film frame 12 prior to wafer dicing. In this case, the wafer is mounted slightly off of its supposed position by a small or minute amount, e.g., +/−1 mm in vertical and/or horizontal directions. As a result, the camera may not be able to detect the presence of the reference die 21 at an expected location, in which case pick and place operations would stop.

(ii) Stretching of the film. As previously indicated, the film 11 holding the diced wafer 5 is stretched to increase the inter-die separation on the film frame 12 (e.g., from originally about 40 microns to about 70-100 microns) to facilitate pick and place operations. The error in positional displacement for each die 20 is the net increase in inter-die separation resulting from the stretching. This error will be multiplied as the diced wafer 5 is indexed across multiple die positions. Consequently, the stretching of the film 11 on the film frame 12 can cause or contribute to the reference die 21 being indexed slightly off position with respect to the camera, resulting in the pick and place apparatus being unable to detect the presence of the reference die 21. Once again, the pick and place operations would stop.

(iii) The existence of foreign particles on the reference die 21 can cause an imaging system to be unable to detect the presence of the reference die 21 by distorting or changing the characteristic of the edge of the die being detecting, thus adversely affecting the edge detection algorithm(s) used for die detection.

In any of the above instances, die sort operations will not be able to start as the reference die 21 cannot be detected. User or operator intervention is required to teach or retrain the pick and place apparatus to identify a reference die 21. Through such operator intervention, a wrong reference die 21 can be selected, for instance, a die 20 that is adjacent to an originally intended reference die 21. If the wrong reference die 21 is selected, a serious systemic error arises, which results in the die sort apparatus 114 starting to pick die 20 from the wrong starting point or start die position on the diced wafer 5. As can be expected, bad stay-behind die can be picked in place of good die that are supposed to be picked, resulting in the transfer of bad stay-behind die, which are intended to remain as "NP" or no-pick die on the film frame 12, to the tape reel.

(B) General Die Detection Errors

After a reference die 21 has been identified, the die sort apparatus 114 sequentially displaces or indexes the expansion table to move the diced wafer 5 on a die by die basis (i.e., across an expected inter-die separation distance) and/or a next nearest die by next nearest die basis (when navigating or moving across one to more "empty" grid positions from which die 20 are absent) to ideally position each active area die 20 on the diced wafer 5 beneath the imaging system's camera. At each diced wafer location at which a die 20 is expected to reside, the imaging system attempts to automatically identify the borders, edges, or boundaries of the die 20. If the imaging system can successfully identify the die edges, the imaging system can determine the die's center point, and any die repositioning relative to the center of the camera's field of view (FOV) can occur. The die sort apparatus 114 can subsequently determine whether the die 20 beneath the camera is a good die or a stay-behind die in accordance with the die's location as indicated by the PW map, such that this die 20 can be selectively picked or left on the film frame 12. Based upon the determined die center point, the die sort apparatus 114 can then displace the diced wafer 5 by the inter-die separation distance to a location at which an adjacent die 20 is expected to reside, and so on.

If the imaging system cannot identify the edges of a die 20 that is present on the film frame 12 (e.g., at a grid position at which a die 20 resides, but for which automatic edge detection is not possible), for instance, as a result of foreign particles on the die 20, die sort operations stop. Operator intervention is then required in order to reposition or reindex the diced wafer 5 such that die presence and die detection beneath the imaging system's camera is verified. Such operator repositioning/reindexing of the diced wafer 5 can result in the wrong die 20 being positioned beneath the camera, for instance, a nearest neighbor to the die 20 that should actually be under the camera. As a result, picking operations are re-initiated and continue from the wrong die location, which gives rise to a systemic picking error from that die position onward. This systemic error can result in die 20 being picked to the wrong destination(s) (e.g., stay-behind die being picked and transferred to tape, or good die being picked to a reject bin), and/or good die being left on the skeleton wafer 10.

(C) Die Edge Translation Errors

During die sort operations, the expansion table is indexed to consecutively present each sequential die 20 to the imaging system's camera, such that a selective pick and place operation can take occur at each die location. As indicated above, the imaging system utilizes machine vision/image processing algorithms to recognize die features such as die edges, one or more types of intra-die structures or features, such as a column of solder bumps or circuit lines/metallization can have visual or optical characteristics that emulate the optical characteristics of die edges. FIG. 3 is a representative illustration of a row of die 20 in which each die 20 includes intra-die feature 40, such as one or more columns of solder bumps, which can be misinterpreted by an image processing algorithm as a die edge.

If the image processing algorithm incorrectly identifies a set of intra-die features 40 as a die edge, the image processing algorithm will incorrectly identify the position of the die center, and subsequent expansion table indexing to a next expected die position will include a translation error therein. Depending upon overall die size and intra-die feature positions, such die edge translation errors can amount to a significant fraction of the die's overall span (e.g., approximately 0.3 mm relative to the location of the die's center). Furthermore, by moving or indexing die-by-die across an entire die row, such die edge translation errors can accumulate because the imaging system can continue to incorrectly and unpredictably recognize intra-die features 40 as die edges. Moreover, the stretching of the film 11 on which the die 20 reside can add to and thereby worsen such accumulative die edge translation errors.

As indicated in FIG. 3, this problem normally arises when there are a number of consecutive stay-behind die 20 that are not to be picked within a row of die 20. In such a case, the pick and place apparatus "skips" the stay-behind die 20. In this skipping, the imaging system employs image processing algorithms to identify each die 20 along the row. However, due to the accumulative indexing error described above, the pick and place apparatus can index the diced wafer 5 to the location of the wrong die 20, and hence a stay-behind die can be incorrectly picked to tape.

(D) Other Translation Errors

If navigation or traversal from a current grid position across multiple intervening grid positions to a target grid position is required, a conventional die sort apparatus 114 navigates from the current grid position toward and to the target grid position on a next nearest die by next nearest die basis until reaching the target grid position. The conventional die sort apparatus 114 utilizes this type of navigation technique in order to verify the presence and position of multiple die 20 (e.g., as many die 20 as possible) along a navigation path from the current grid position to the target grid position in order to reduce or minimize the likelihood of accumulative indexing or positional translation errors, which can result in die positioning errors during picking operations. It is to be noted that empty grid positions render the automatic detection of die edges or boundaries within such grid positions for purpose of navigation position verification impossible, and hence traversing across multiple empty grid positions increases the likelihood of accumulative translation errors.

Unfortunately, a conventional die sorting apparatus is not capable of reliable, high accuracy navigation from a current grid position across multiple intervening grid positions directly to a target grid position. Additionally, the aforementioned next nearest die to next nearest die navigation technique is undesirably slow, adversely impacting throughput.

(E) Other Contributions to Die Sorting Errors

Other types of problems can give rise to die sorting errors. For example, the PW map used for die sorting is a local PW map generated from a host PW map that resides on a separate host system. In certain situations, the local PW map can become corrupted relative to the host PW map.

Current Die Sorting Error Detection Techniques

To verify that good die 20 have been correctly extracted from the diced wafer 5, skeleton wafer inspection can occur, either manually or by way of a specific automated procedure, as described in detail hereafter.

Manual Skeleton Wafer Inspection

After die sort operations have been completed for an entire cassette of diced wafers 10 mounted on film frames 12, an operator retrieves a skeleton wafer 10 from the cassette. The operator additionally obtains (e.g., from a back-end manufacturing system) a printout that provides a visual representation corresponding to the PW map. This printout has the same size or diameter as the skeleton wafer 10 itself, and visually indicates for each original die location on the skeleton wafer 10 whether the die 20 at that location should remain on the skeleton wafer 10.

The operator then superimposes the printout over the skeleton wafer 10 under backlit conditions to visually compare the physical skeleton wafer 10 with this printout to manually verify whether electrically bad die had been incorrectly removed from the skeleton wafer 10. Such manual verification is time consuming and prone to errors which adversely affect both throughput and yield. An operator's partial inspection of a single skeleton 10 wafer can require 5-20 minutes or longer, depending upon wafer size, die size, and the operator's manual inspection strategy. More particularly, the printout might not be a perfect match to the skeleton wafer 10, and/or skeleton wafer die 20 can be misaligned relative to the printout. Furthermore, such an operation is simplistic, and the chance of manual operator error can be substantial, particularly in view of technological evolution which has given rise to progressively larger diameter wafers and ever smaller component die sizes. For instance, 300 mm wafers on which 2 mm square or smaller die 20 have been fabricated carries thousands of die 20.

Furthermore, manual inspection takes place only after die sorting has been completed for the entire cassette of skeleton wafers 10. Consequently, if a systemic die picking error occurred that affected multiple diced wafers 5, preventative intervention to avoid the propagation of systemic die extraction errors from one diced wafer 5 to another diced wafer 5 within the cassette is not possible. Hence, large amounts of time, wafer processing resources, and associated manufacturing costs have been wasted.

Automated Skeleton Wafer Inspection

In other present situations, a particular type of automated optical procedure is performed after the die sort apparatus 114 has completed the extraction of die 20 from the diced wafer 5 based upon the wafer's PW map and the sort codes. In such a procedure, a skeleton wafer inspection system uses the same optical inspection system associated with the die sort apparatus 114 during the die sort operations. The skeleton wafer inspection system analyzes the PW map in view of the sort codes. Based upon this analysis, the optical inspection system determines a limited number of PW map zones for comparison against counterpart skeleton wafer zones, for purpose of determining whether die 20 within the skeleton wafer zones under consideration have been properly removed from the skeleton wafer 10. Any given PW map zone corresponds to an array of die 20 on the wafer. The sort codes corresponding to the PW map zone indicate which die 20 within the die array are good die that should have been extracted from the skeleton wafer 10, and which are stay-behind die that should remain on the skeleton wafer 10.

The optical inspection system identifies PW map zones 1, 2, 3, . . . , Z for consideration relative to counterpart skeleton wafer zones based upon predetermined criteria, such as zones having at least a predetermined percentage of no-pick or bad dies, or the largest percentage of bad die that should be present within each zone. For instance, the optical inspection system determines, based upon the data within the PW map and the set of sort codes, the set of PW map zones 1, 2, 3, . . . , Z having the highest count of bad die that should remain on the skeleton wafer 10. These Z PW map zones are selected for comparison with counterpart skeleton wafer zones. The total number of zones Z to be considered, and/or the total number of die D in each zone, can be predetermined or user selectable/programmable for each batch of skeleton wafers.

FIG. 4 illustrates a skeleton wafer 10 mounted on a film frame 12, and Z=5 representative skeleton wafer zones 18 for comparison relative to Z=5 corresponding PW map zones. Each zone corresponds to a 5×5 die array. The skeleton wafer 10 shown in FIG. 4 includes a number of stay-behind die 50, and a number of empty die positions 52; that is, die presence 50 in FIG. 4 is indicated by dark shading, and die absence 52 in FIG. 4 is indicated by lighter shading.

The skeleton wafer inspection system indexes the location of each skeleton wafer zone under consideration relative to the aforementioned reference die 21. More particularly, the optical inspection system determines the locations to which the skeleton wafer 10 should be indexed, relative to the location of the reference die 21, on an expected die position by expected die position or nearest die position by nearest die position basis for determining whether the stay-behind die 50 that reside within each of the Z=5 skeleton wafer zones 18 should actually remain at their respective skeleton wafer positions, and whether empty die positions 52 on the skeleton wafer 10 correspond to die that actually should have been picked in accordance with such die positions within the counterpart Z=5 PW map zones.

Specifically, the optical inspection system (a) selects a first PW map zone for consideration; and (b) displaces the skeleton wafer 10 based upon the skeleton wafer reference die location in accordance with the expected diced wafer inter-die separation distance along x and/or y axes to thereby position a first skeleton wafer zone 18 corresponding to the first PW map zone within the field of view of an image capture device. The optical inspection system then (c) positions a first expected die location within the first skeleton wafer zone 18 beneath the image capture device, and (d) attempts to determine whether a stay-behind 50 remains within this first expected die location, or whether the first expected die location is empty 52. The optical inspection system then (e) determines whether the PW map indicates, in accordance with the sort codes, that a die 20 should remain at or should be absent from the first expected die location; and (f) generates a die sorting error indicator corresponding to the first die location in the event that a die sorting error occurred (e.g., a bad die was inadvertently picked form the first expected die location, or a die 20 incorrectly remains at the first expected die location). The optical inspection system subsequently (g) moves to a next or adjacent expected die location within the first skeleton wafer zone 18 to determine die presence or absence at this die location, and the existence of any die sorting error; and so on for each die location within the first skeleton wafer zone 18.

Following its inspection of each die location within the first skeleton wafer zone 18, the optical inspection system (h) displaces the skeleton wafer 10 based upon the expected diced wafer inter-die separation distance to a second skeleton wafer zone 18, and repeats the foregoing die position by die position optical inspection and die sorting error determination for each die position within the second skeleton wafer zone 18. This procedure continues until the Z skeleton wafer zones 18 under consideration have been inspected relative to counterpart Z PW zones. The skeleton wafer 10 can then be unloaded from the die sort apparatus 114, and a next diced wafer 5 can be considered for selective die picking during die sort operations, followed by the above automated skeleton wafer inspection procedure.

Unfortunately, the foregoing conventional automated skeleton wafer inspection procedure suffers from a number of drawbacks. Firstly, the conventional skeleton wafer inspection uses the same reference die 21 used in the die sort operations, meaning that the skeleton wafer inspection system can suffer from a systemic reference die location error in the same manner as described above. Secondly, the accuracy of conventional automated skeletal wafer inspection depends on the number of wafer zones considered. The greater the number of wafer zones inspected, the more robust and accurate the assessment of whether wrong die 20 have been picked. In an ideal situation, each adjacent skeleton wafer zone 18 across the entire skeleton wafer 10 should be optically inspected relative to its counterpart PW map zone to verify whether all die 20 that were intended to be picked as identified by the PW map and sort codes have been correctly extracted from the skeleton wafer 10, and all bad die identified by the PW map and sort codes remain on the skeleton wafer 10. Unfortunately, inspection of all adjacent skeleton wafer zones 18 relative to the entire pool of adjacently defined PW map zones can take a very significant amount of time, for instance, between 10-20 minutes per skeleton wafer 10 depending upon wafer size and die size, which adversely impacts manufacturing process throughput. Consequently, in order to enhance throughput, only a limited number of zones (e.g., Z=5 die zones) are considered in association with an automated skeleton wafer sampling algorithm. Unfortunately, the inspection of fewer than all skeleton wafer zones 18 relative to their counterpart PW map zones means that die sorting errors can remain undetected. Thirdly, conventional skeleton wafer inspection based on wafer zones requires significant time because it captures images of each and every die individually within each selected zone. As there could be hundreds if not thousands of die 20 within each zone, the more zones selected, the more time is required for skeleton wafer inspection. Lastly, accurately positioning any given skeleton wafer zone 18 and individual die positions therein beneath the image capture device can be difficult because large numbers of die are likely to be absent from the skeleton wafer 10. As a result, indexing the skeleton wafer 10 based upon expected inter-die separation distances, rather than the detection of die edges, can result in skeleton wafer positioning inaccuracies or navigational difficulties, which often leads to inaccurate skeleton wafer inspection results.

A need exists for highly accurate, throughput efficient automated systems and methods of inspecting skeleton wafers 10 to determine whether die sorting errors occurred during the selective removal of die 20 from a diced wafer 5 during die sort operations.

SUMMARY

As thoroughly elaborated upon above, manual skeleton wafer inspection is slow and susceptible to error. The prior automated technique involves the use of a high resolution camera to perform a partial skeleton wafer inspection by using the high resolution camera to inspect, on a die-by-die/die-position-by-die-position basis, the presence or absence of individual die 20 within a limited number of die arrays or zones 18 on the skeleton wafer 10. The prior automated technique is prone to various types of errors previously described. Additionally, with respect to performing a 100% skeleton wafer inspection, the prior automated approach requires a large or very large amount of time since a high resolution image of each die location must be captured to verify the absence or presence of each die 20 at a grid position on the active die area of skeleton wafer 10. For this reason, although it is highly desirable, it is not possible or feasible using prior automated skeleton wafer inspection techniques to carry out 100% skeleton wafer inspection after die sort operations on every skeleton wafer 10.

The object of embodiments in accordance with the present disclosure is to overcome most if not all of the shortcomings of prior skeleton wafer inspection systems and techniques. Embodiments described herein provide a process for skeleton wafer inspection that makes such inspection much more robust, highly efficient, and significantly faster than current skeleton wafer inspection techniques, and which is technologically simple, inexpensive, and easy to implement on essentially any die sort apparatus 114, such that 100% skeleton wafer inspection can be carried out on each skeleton wafer 10 after die sorting, free or essentially free from systemic or other errors arising from human intervention or otherwise.

Particular embodiments of the present disclosure are directed to one or more of the following specific objectives:
(a) Enabling or performing skeleton wafer inspection without relying upon or using the same reference die utilized prior to skeleton wafer inspection during conventional test, inspection, and die sort procedures;
(b) Automatically performing 100% skeleton wafer inspection by way of an image capture device or camera having a relatively lower resolution and a relatively larger FOV than that of an image capture device used for inspection or die sorting processes prior to skeleton wafer inspection;
(c) Inspecting a skeleton wafer by way of
 (i) capturing of a set of segmental images of the skeleton wafer with the aforementioned lower resolution, larger FOV image capture device;
 (ii) generating a composite image by digitally "stitching" segmental images together;
 (iii) identifying a reference origin and/or a first/start die location/position within the composite image; and
 (iii) correlating information content within the composite image corresponding to individual active area die positions with information content in the skeleton wafer's PW map to rapidly and accurately determine whether die picking errors occurred during sort operations (e.g., whether any stay-behind die have been wrongly removed from the diced wafer);
(d) Generating a composite image of a diced wafer prior to skeleton wafer inspection corresponding to the diced wafer, and using this diced wafer composite image as an aid or guide for pick and place operations; and
(e) Adapting a conventional die sort apparatus to include a small number of structurally straightforward, low cost elements or devices to thereby implement an in-line or unified die sort/skeleton wafer inspection system or apparatus, which can perform die sort operations on a diced wafer 5 to generate a skeleton wafer 10 therefrom, and immediately thereafter automatically inspect this skeleton wafer 10 based upon a corresponding skeleton wafer composite image.

Additional objectives to which embodiments in accordance with the present disclosure can be directed include:
(f) directly navigating to one or more target die positions on an unpicked diced wafer 5 or a skeleton wafer 10 using a diced wafer composite image as a die sort apparatus/pick and place apparatus navigation guide; and
(g) automatically verifying whether a die sort apparatus has detected a correct reference die 21. Upon verification of die sort apparatus recognition of the correct reference die 21 on an unpicked diced wafer 5, die picking operations on the diced wafer 5 can be initiated. Upon verification of die sort apparatus recognition of the correct reference die 21 on a skeleton wafer 10, skeleton wafer repopulation operations can occur, during which die 20 previously picked from the skeleton wafer 10 are returned to the film frame 12 in accordance with their active area grid positions thereon, with high positional accuracy.

In accordance with an aspect of the present disclosure, an automated process for generating at least one composite image corresponding to at least one film frame carrying diced components includes: providing a film frame on which diced components are disposed in accordance with a plurality of grid positions including a set of active area grid positions within which manufactured components reside; capturing a set of segmental images of the film frame, each segmental image corresponding to a predetermined portion of the spatial area spanned by the film frame and including at least a subset of the active area grid positions; generating a composite image corresponding to the film frame from the set of segmental images, the composite image including image data indicative of (a) each active area grid position in which a component can reside, and (b) component presence at or component absence from each active area grid position; and processing the composite image by way of image processing techniques to determine within the composite image a reference origin and a location of a first active area grid position, wherein the reference origin can include or be a predetermined point or a predetermined active area grid position in the composite image that represents each of (a) a counterpart predetermined point or predetermined active area grid position on the film frame and (b) a predetermined active area grid position in a process map corresponding to the manufactured components, wherein the process map includes or is a data structure storing information content corresponding to each active area grid position indicating for each active area grid position whether a component residing thereat is acceptable or rejected.

Providing the film frame includes at least one of (a) providing the film frame prior to performance of a set of component sorting operations directed to selectively removing components from the film frame (e.g., to generate a composite image of the film frame before removal of components therefrom); and (b) providing the film frame after performance of the set of component sorting operations (e.g., to generate a composite image of the film frame after component removal therefrom).

Capturing the set of segmental images includes directing illumination toward at least one of (a) a top surface of the film frame in accordance with a first set of illumination parameters, and (b) a bottom surface of the first film frame in accordance with a second set of illumination parameters. The first set of illumination parameters and the second set of illumination parameters facilitate reliable image processing to discriminate between component presence at a grid position, component absence from a grid position, and gridlines defining each grid position. Capturing the set of segmental images also includes capturing each segmental image using an image capture device having a resolution that is less than and a field of view (FOV) than is larger than (e.g., multiple times larger than) a resolution and FOV, respectively, of an image capture device used for inspecting individual components for micron or submicron scale defects thereon. The set of segmental images can include a plurality of images corresponding to predetermined portions of an overall area of the film frame, and generating the composite image includes digitally stitching together individual segmental images within the set of segmental images. Such stitching can involve joining at least portions of individual segmental images that correspond to adjacent areas of the film frame, by way of aligning individual segmental images that (a) overlap along a common set of boundaries corresponding to component edges and/or component features of the same components, and/or (b) are directly adjacent to one another based upon encoder values indicating physical space coordinates of the film frame relative during capture of the set of segmental images. The composite image can be an image of, for instance, an entire wafer.

A recipe can be accessed prior to generating the composite image, the recipe including at least some of: (a) grid information including a number of horizontal gridlines and a number of vertical gridlines defining the plurality of grid positions; (b) image capture device parameters including an image capture device resolution and an image capture device field of view (FOV) relative to component size and the wafer size; (c) at least one set of illumination parameters for controlling characteristics of illumination incident upon the film frame during the capture of the set of segmental images; (d) a number of segmental images to be captured; (e) an extent of overlap between individual segmental images within the set of segmental images; (f) a set of reference origin parameters indicating or defining a location of the reference origin relative to the plurality of grid positions; (g) a first active area grid position identifying a location of a first component within the set of active area grid positions; and (h) a set of parameters enabling verification of the location of a reference die detected by a die sort apparatus.

The reference origin is different than a location of a reference die on the film frame that is utilized for performance of the set of component sorting operations. Processing the composite image includes recognizing in the composite image as at least portions of a plurality of gridlines corresponding to at least portions of a plurality of dicing grooves between the components on the film frame; defining the plurality of grid positions based upon pixel areas within the composite image bordered by adjacent parallel gridlines and adjacent vertical gridlines within the plurality of gridlines; determining the active area grid positions within the plurality of grid positions using the reference origin and a predetermined spatial relationship between the reference origin and the first active area grid position.

Processing the composite image can further include analyzing pixel data within the composite image at each active area grid position to determine component presence at or component absence from a counterpart active area grid position on the film frame; and correlating information content in the composite image with information content in the process map for each active area grid position within the set of active area grid positions, such as for skeleton wafer inspection. Correlating information content includes correlating pixel values corresponding to each active area grid position within the composite image with a digital code in the process map corresponding to that active area grid position. The process can include automatically determining whether (a) one or more components were incorrectly removed from the film frame during component sorting operations, and/or (b) one or more components incorrectly reside on the film frame after component sorting operations.

A composite image generated for the film frame prior to performance of the set of component sorting operations thereon can be used as an aid or guide for navigation during a set of pick and place operations to position at least one of: (a) a target active area grid position relative to a pick and place apparatus during or after performance of the set of component sorting operations on the same film frame or a different film frame; (b) each active area grid position relative to the pick and place apparatus during performance of the set of component sorting operations on the same film frame or a different film frame; and (c) at least some active area grid positions within the plurality of grid positions relative to the pick and place apparatus during a set of film frame repopulation operations by which components that had been removed from the same or a different film frame as a result of the set of component sorting operations.

The film frame can be a first film frame that carries a first diced wafer in a batch of diced wafers, wherein the composite image of the film frame includes a composite image of the first diced wafer, and wherein using the composite image as an aid or guide for navigation includes: storing the composite image of the first diced wafer as a batch navigation composite image that can be used as a navigation aid or guide for each diced wafer in the batch; selecting a second film frame carrying a second diced wafer in the batch; generating a composite image of the second diced wafer; determining and correcting for a rotational offset between the batch navigation composite image and the composite image of the second diced wafer by way of an image registration technique.

The process can include identifying a current die position on the second diced wafer and a counterpart current die position in the composite image of the second diced wafer; identifying a target die position on the second diced wafer and a counterpart target die position in the batch navigation composite image; calculating a relative encoder position corresponding to the current die position and a relative encoder position corresponding to the target die position using the batch navigation image and an image space to physical space conversion factor; generating updated encoder positions based upon each calculated relative encoder position; and directly navigating the pick and place apparatus from the current die position to or within a set of boundaries of the target die position using the updated encoder positions.

The process can include verifying detection of a correct reference die on the second diced wafer by a die sort apparatus by way of: retrieving from the recipe a relative encoder position offset corresponding to an auxiliary reference die; directly navigating the die sort apparatus from a candidate reference die position or a candidate reference origin to an expected position of the auxiliary reference die; automatically determining whether the auxiliary reference die is present at the expected position of the auxiliary reference die; and verifying whether the candidate reference die is the correct reference die based upon whether the auxiliary reference die is present at the expected position of the auxiliary reference die.

The process can include selectively removing die from the second diced wafer to create a skeleton wafer; generating a composite image of the skeleton wafer; and determining and correcting for a rotational offset between the batch navigation composite image and the composite image of the skeleton wafer by way of an image registration technique.

The process can include retrieving from a recipe a relative encoder position offset corresponding to an auxiliary reference die; directly navigating the pick and place apparatus from a candidate reference die position or a candidate reference origin on the skeleton wafer to an expected position of the auxiliary reference die; automatically determining whether the auxiliary reference die is present at the expected position of the auxiliary reference die; verifying whether the candidate reference die is the correct reference die based upon whether the auxiliary reference die is present at the expected position of the auxiliary reference die; and initiating a set of film frame repopulation operations based upon verification of whether the candidate reference die is the correct reference die, the set of film frame repopulation operations including returning die removed from the second diced wafer to the second film frame to create a substitute second diced wafer, and wherein one of the skeleton wafer composite image and the batch navigation composite image is used as an aid or guide for navigation to different die positions on the second film frame during the set of film frame repopulation operations.

Generating the composite image can occur in parallel with performance of the set of component sorting operations by way of a parallel computing process.

In accordance with an aspect of the present disclosure, a system for generating at least one composite image corresponding to at least one film frame carrying diced components within an active grid area of a plurality of grid positions includes: a processing unit; an expansion table or a wafer table configured for carrying and securely retaining the film frame; a set of lighting sources configured for directing illumination toward the film frame while the film frame is carried by the expansion table or the wafer table; an image capture device; and a memory storing at least one set of program instructions which when executed cause the processing unit to perform at least portions of the foregoing process.

The processing unit is coupled to a component sorting apparatus configured for performing a set of component sorting operations on the film frame, the set of component sorting operations directed to selectively removing components from the film frame based upon process map information content. The system can be (a) integrated in-line with a component sorting apparatus configured to perform the set of component sorting operations, or (b) separate from the component sorting apparatus.

The set of lighting sources includes at least one of (a) a first set of lighting sources configured for directing illumination toward a top surface of the film frame in accordance with a first set of illumination parameters during capture of the set of segmental images, and (b) a second set of lighting sources configured for directing illumination toward a bottom surface of the first film frame in accordance with a second set of illumination parameters during capture of the set of segmental images. The image capture device has a resolution that is less than and a field of view (FOV) that is larger than a resolution and FOV of an image capture device used for inspecting individual components for micron or submicron scale defects thereon.

The memory stores a recipe including at least some of: (a) grid information including a number of horizontal gridlines and a number of vertical gridlines defining the plurality of grid positions; (b) image capture device parameters including an image capture device resolution and an image capture device FOV relative to component size and the wafer size; (c) at least one set of illumination parameters for controlling characteristics of illumination incident upon the film frame during the capture of the set of segmental images; (d) a number of segmental images to be captured; (e) an extent of overlap between individual segmental images within the set of segmental images; (f) a set of reference origin parameters indicating or defining a location of the reference origin relative to the plurality of grid positions; (g) a first active area grid position identifying a location of a first component within the set of active area grid positions; and (h) a set of parameters enabling verification of the location of a reference die detected by a die sort apparatus.

BRIEF DESCRIPTION OF THE DRAWINGS

FIG. 5B is a generalized block diagram of a die sort and inspection system configured for in-line skeleton wafer inspection according to an embodiment of the present disclosure.

FIG. 5C is a block diagram showing die sort related portions of a representative semiconductor manufacturing system including multiple die sort apparatuses configured for providing skeleton wafers to a common SWIS in accordance with an embodiment of the present disclosure.

FIGS. 6A and 6B illustrate representative partial depth channels formed in a film frame's film within dicing grooves as a result of a sawing or dicing process.

FIG. 7A shows a composite image of a skeleton wafer under representative illumination conditions corresponding to the provision of illumination to both the top and bottom sides of the skeleton wafer for the capture of segmental images according to an embodiment of the present disclosure.

FIG. 7B shows a magnified portion of the skeleton wafer composite image of FIG. 7A, which corresponds to a 2×7 array of skeleton wafer grid positions that are delineated from each other by horizontal and vertical dicing grooves or gridlines.

FIG. 7C indicates representative digital encodings indicating die presence and die absence within portions of a representative skeleton wafer extraction map for the magnified portion of the composite image of FIG. 7B.

FIGS. 8A and 8B provide illustrations of portions of representative Physical Wafer Standards (PWS) documents.

DETAILED DESCRIPTION

Figure 1:
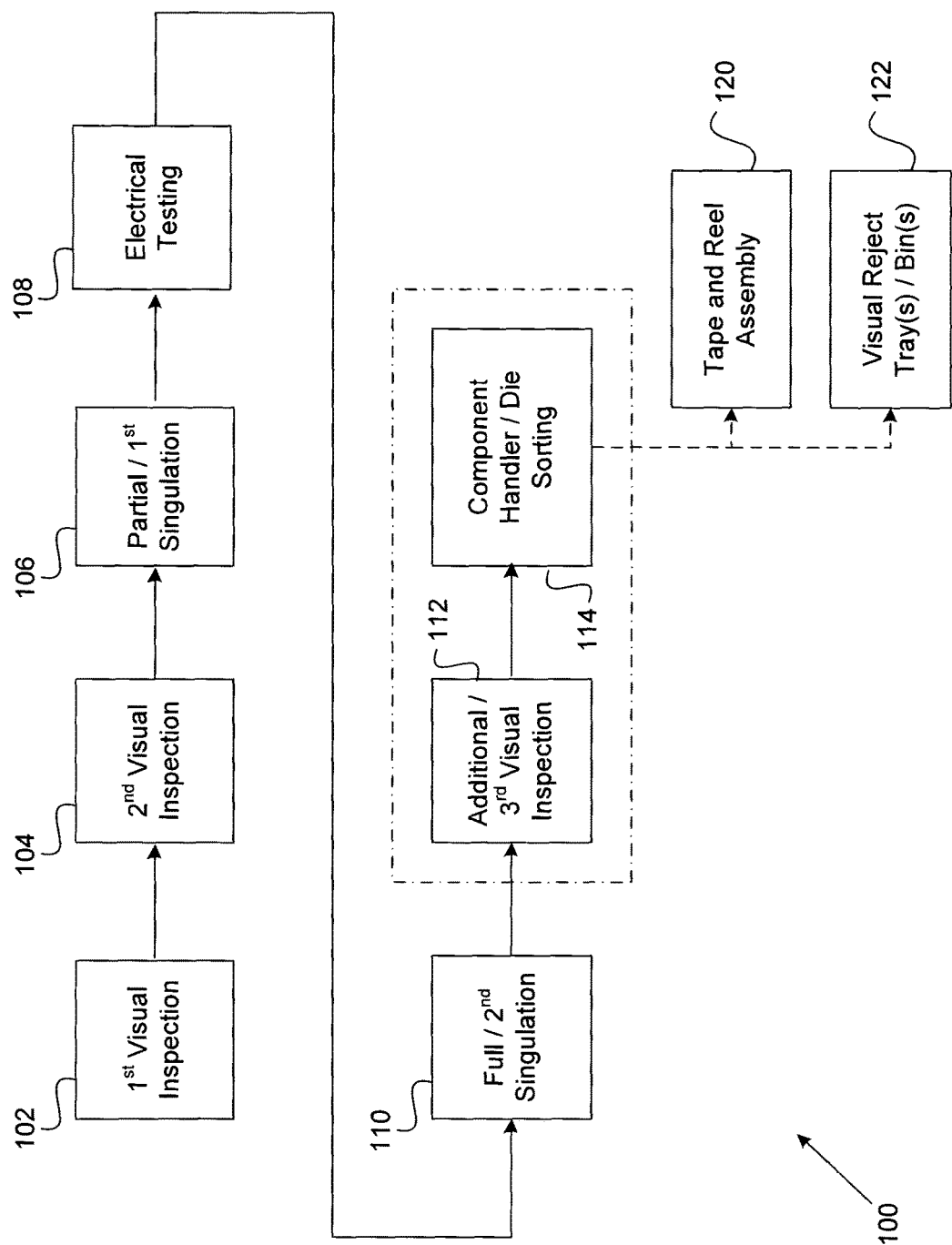
FIG. 1 illustrates a block diagram showing portions of a prior art semiconductor component manufacturing system, which is directed to particular aspects of back-end semiconductor manufacturing including die sorting.
Figure 2A:
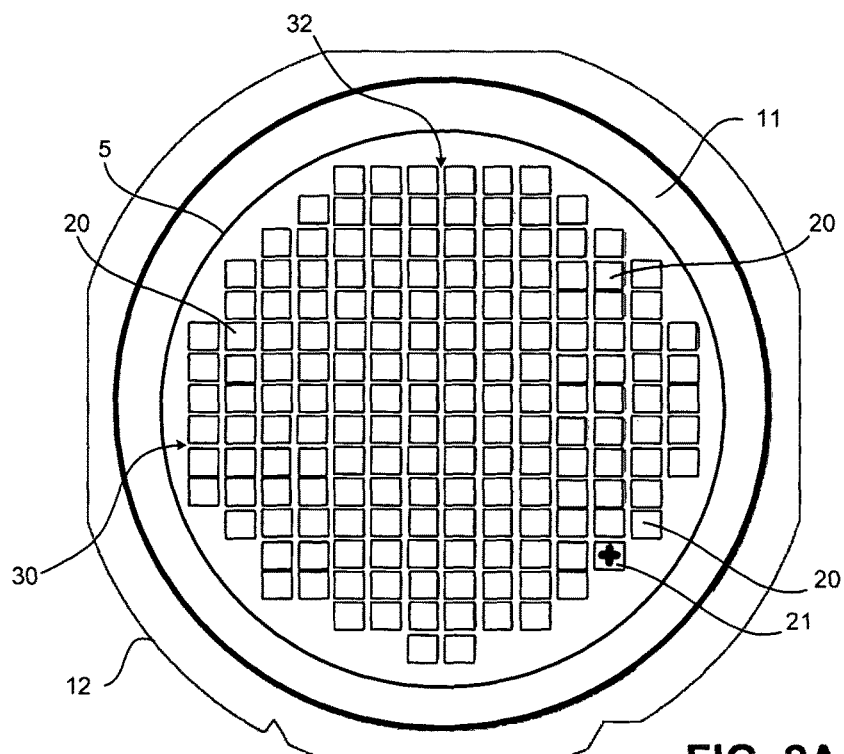
FIG. 2A is an illustration of a representative singulated or sawn wafer on which a plurality of components or die have been fabricated or manufactured, where the sawn wafer is mounted to a film frame.
Figure 2B:
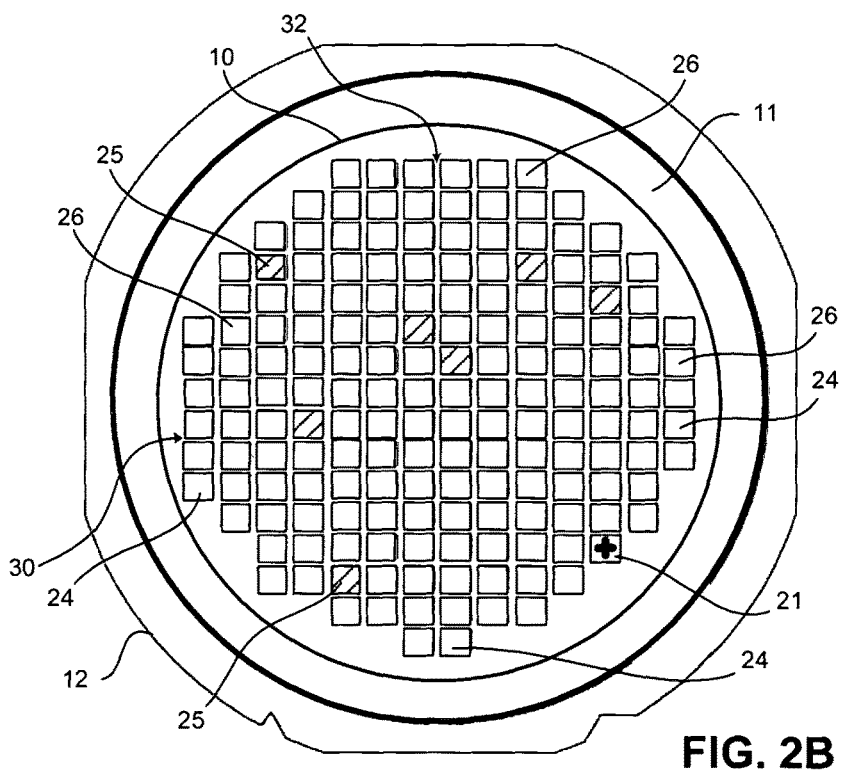
FIG. 2B is an illustration of a representative skeleton wafer corresponding to the sawn wafer of FIG. 2A.
Figure 3:
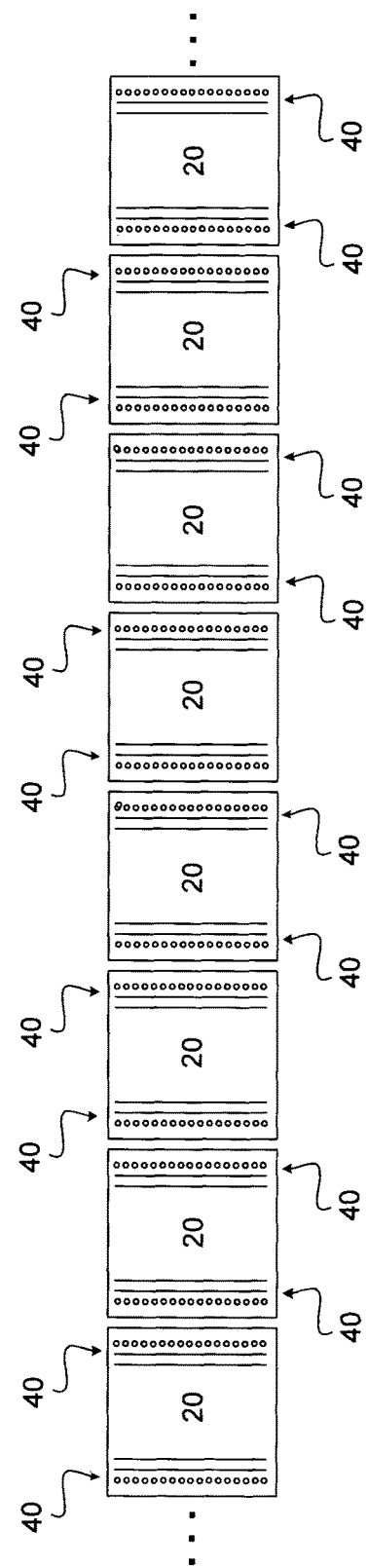
FIG. 3 is an illustration of a row of die in which each die includes a set of features that can be interpreted as a die edge by a machine vision algorithm.
Figure 4:
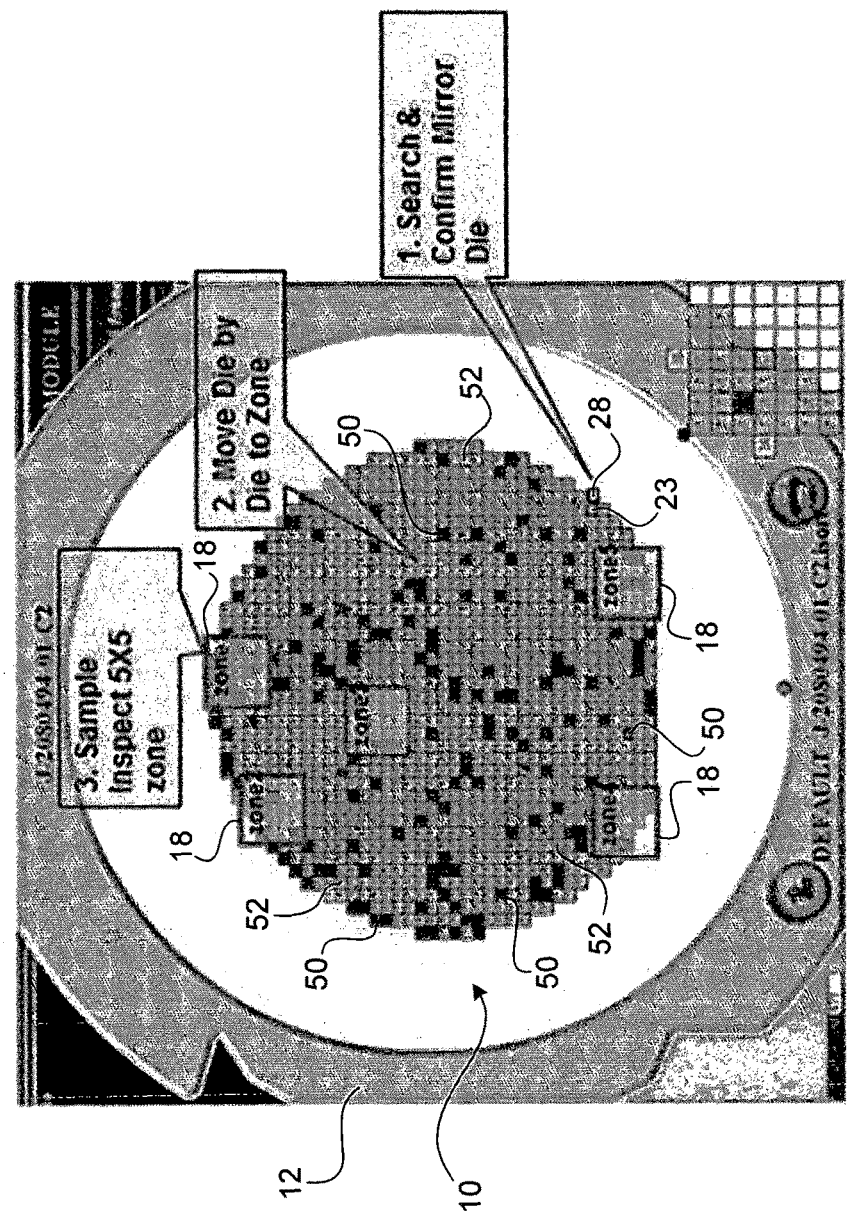
FIG. 4 provides an illustration of a skeleton wafer mounted on a film frame, and Z=5 representative skeleton wafer zones for comparison relative to Z=5 corresponding process map zones.

In the present disclosure, depiction of a given element or consideration or use of a particular element number in a particular FIG. or a reference thereto in corresponding descriptive material can encompass the same, an equivalent, or an analogous element or element number identified in another FIG. or descriptive material associated therewith. The use of "/" means "and/or" unless specifically indicated otherwise. As used herein, the term "set" corresponds to or is defined as a non-empty finite organization of elements that mathematically exhibits a cardinality of at least 1 (i.e., a set as defined herein can correspond to a singlet or single element set, or a multiple element set), in accordance with known mathematical definitions (for instance, in a manner corresponding to that described in *An Introduction to Mathematical Reasoning: Numbers, Sets, and Functions*, "Chapter 11: Properties of Finite Sets" (e.g., as indicated on p. 140), by Peter J. Eccles, Cambridge University Press (1998)). In general, an element of a set can include or be a system, an apparatus, a device, a structure, a structural feature, an object, a process, a physical parameter, or a value depending upon the type of set under consideration. The recitation of a particular numerical value or value range herein is understood to include or be a recitation of an approximate numerical value or value range, for instance, within +/−20%, +/−15%, +/−10%, or +/−5% of a recited value.

Skeleton Wafer Inspection in Accordance with Embodiments of the Present Disclosure The heart of skeleton wafer inspection in accordance with embodiments of the present disclosure involves the capture of segmental or partial images of a skeleton wafer 10 after die sorting. The sum of all the segmental images makes up a complete image of the skeleton wafer when properly aligned together. Each segmental image captures many die within that segment with a single exposure, using an image capture device having a lower resolution and a larger field of view than that used for die sort operations. After these segmental images have been captured, they are digitally "stitched" together (e.g., by way of an image processing algorithm) to form a composite image of the entire skeleton wafer 10. The composite image is digitally analyzed to determine for each skeleton wafer die position corresponding to the wafer's active die area whether a die 20 is present on or absent from the skeleton wafer 10. More specifically, by way of image processing algorithms, die presence or die absence is determined at each active area die position within the composite skeleton wafer image, corresponding to each counterpart active area die position on the physical skeleton wafer 10. Multiple embodiments in accordance with the present disclosure further encode die presence or die absence information for each composite image active area die position in a skeleton wafer extraction map, e.g., by way of "1" and "0" values, respectively. The skeleton wafer extraction map is digitally correlated with or compared to the PW map, or information generated therefrom, to determine if the diced wafer 5 has been properly sorted. A much more detailed description of the foregoing processes is provided in subsequent sections of this disclosure.

Representative Skeleton Wafer Inspection System Configurations

Depending upon embodiment details, one or more portions of an automated skeleton wafer inspection system 200 can exist (a) in-line, possibly as part of or in association with a component handler/die sort apparatus or die sorting and inspection system 114; (b) as a centralized system or skeleton wafer inspection hub that can receive skeleton wafers 10 from a group of component handlers/die sort apparatuses 114; or (c) as a stand-alone system.

Representative In-Line Die Sort and Skeleton Wafer Inspection System

Figure 5A:
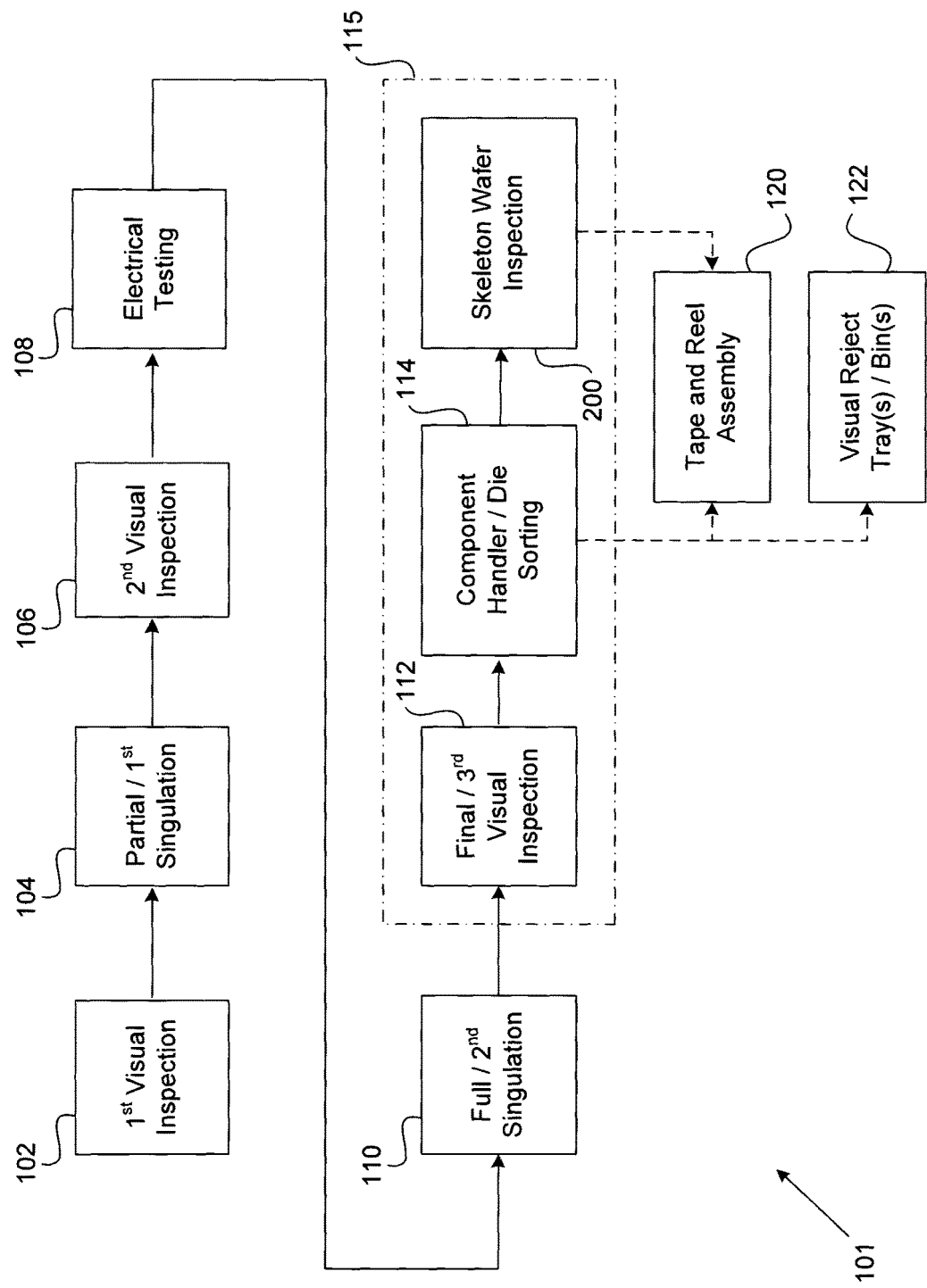
FIG. 5A is a block diagram showing portions of a representative semiconductor component manufacturing system that includes an automated skeleton wafer inspection system (SWIS) in accordance with an embodiment of the present disclosure.

FIG. 5A is a block diagram showing portions of a representative semiconductor component manufacturing system 101 corresponding to FIG. 1, but which includes an automated skeleton inspection system (SIS) or skeleton wafer inspection system (SWIS) 200 in accordance with an embodiment of the present disclosure. In multiple embodiments, the SWIS 200 is integrated with or forms a portion of a component handler/die sorter or component/die sort and inspection system configured for in-line skeleton inspection 115, which can be based upon or integrated with a conventional component handler/die sort apparatus/die sort and inspection system 114 such as an iSORT based system (Semiconductor Technologies and Instruments (STI) Pte Ltd., Singapore). The SWIS 200 can communicate particular skeleton wafer inspection results to a tape and reel assembly 120 or other system/apparatus, so that remedial action can be taken after skeleton wafer inspection.

FIG. 5B is a generalized block diagram of a die sort and inspection system configured for in-line skeleton wafer inspection 115 according to an embodiment of the present disclosure. The die sort and inspection system 115 includes a film frame cassette 150 from which a film frame 12 carrying a diced wafer 5 can be removed by an automated transfer mechanism (e.g., a robotic arm, not shown), and transferred to a film frame retention/expansion table 210 configured for expanding the film frame's film 11 prior to die sort operations, and holding the film frame 12 during die sort and skeleton wafer inspection operations, as further detailed below. The die sort and inspection system 115 further includes a pick and place apparatus 160 configured for selectively picking or extracting die 20 from the diced wafer 5 to preselected destinations. The expansion table 210 is capable of moving in x-y, z and Q (i.e., rotational, or θ) axes, and is typically displaceable in at least two dimensions (e.g., along x-y axes), and rotatable about the Q-axis for presenting the diced wafer 5 in a correct orientation for pick and place operations. The expansion table 210 is also able move in the Z-axis in order to stretch or expand the film 11 on the film frame 12 to facilitate die extraction from the film frame 12 during pick and place operations.

This die sort and visual inspection system 115 also includes first camera 170 for capturing high resolution images of each picked die 20; a second camera 172 configured for top inspection and bottom inspection of each picked die 20; a third camera 174 configured for 4-side inspection of each picked die 20; a fourth camera 180 configured for sealed tape and reel pocket inspection; and a fifth camera 182 configured for device inspection within a sealed pocket.

The die sort and visual inspection system 115 further includes a segmental image capture device 220 (hereafter "SWIS image capture device" or "image capture device") such as a camera or digital image sensor under which the expansion table 210 can be positioned, which is configured to capture images of segmental regions or sectors of the skeleton wafer's surface area, as further detailed below. The die sort and visual inspection system 115 additionally includes a set of lighting sources/elements associated with the image capture device 220, as also detailed below.

Structural and functional details corresponding to a conventional type of die sort and inspection system/die sort apparatus 114 that can be configured for in-line skeleton wafer inspection in accordance with particular embodiments of the present disclosure are provided in published patent applications WO2009128790, US20100232915 and SG 201103425-3. The structural and functional aspects of such conventional types die sort and inspection systems/die sort apparatuses 114 will be readily understood by individuals having ordinary skill in the relevant art.

Other Representative SWIS Configurations

Other semiconductor manufacturing system configurations involving one or more SWIS 200 can be provided, such as configurations in which an SWIS 200 is separate from a component handler/die sort apparatus 114. For instance, FIG. 5C is a block diagram showing die sort related portions of a representative semiconductor manufacturing system, which includes multiple die sort apparatuses 114 that are configured to supply or provide skeleton wafers to a common or centralized skeleton wafer inspection system 200 in accordance with an embodiment of the present disclosure.

Various embodiments in accordance with the present disclosure can automatically perform complete skeleton wafer inspection after die sort operations, corresponding to the inspection or analysis of physical die extraction from the skeleton wafer 10 with respect to 100% of skeleton wafer locations or grid positions at which die 20 can reside or could have resided within the wafer's active dies area. Thus, an SWIS 200 in accordance with an embodiment of the present disclosure can automatically (a) perform 100% skeleton wafer inspection/analysis, by which actual die presence 50 on and actual die absence 52 from a skeleton wafer 10 can be automatically verified for each die position on the skeleton wafer 10; and (b) determine whether any die sorting errors exist with respect to the diced wafer's PW map (or stated equivalently, the skeleton wafer's PW map) in view of any associated set of sort codes.

Aspects of Representative SWIS Elements

Figure 5D:
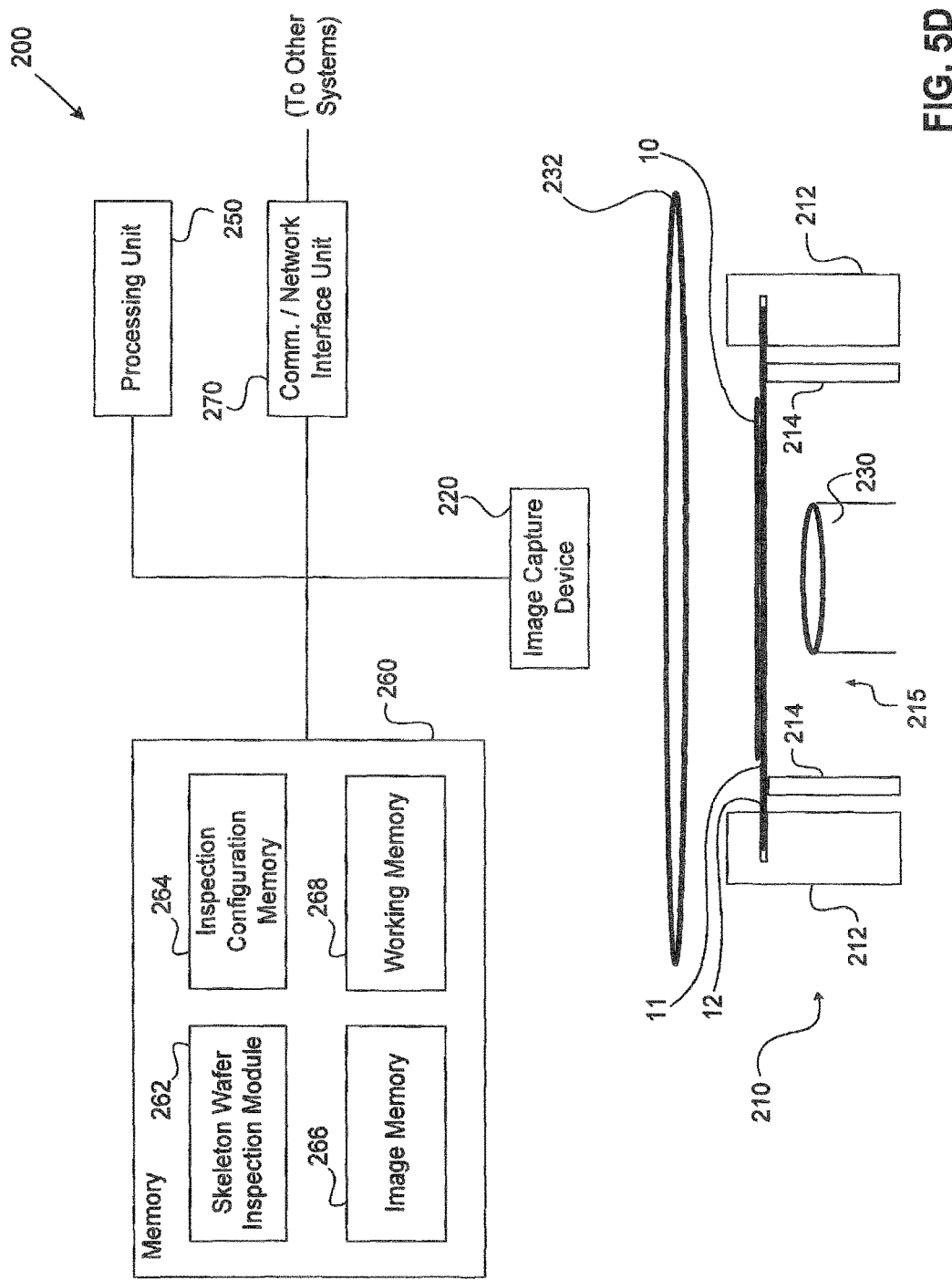
FIG. 5D is a schematic illustration showing representative SWIS elements in accordance with an embodiment of the present disclosure.

FIG. 5D is a schematic illustration showing portions of an SWIS 200 in accordance with an embodiment of the present disclosure. As indicated above, the SWIS 200 can be deployed in-line with or within a die sort apparatus 114, or can be a central hub or a stand-alone system.

SWIS Film Frame Retention/Expansion Table

In an embodiment, the SWIS 200 includes an expansion table 210 configured to securely hold a film frame 12 by supporting the film frame 12 along its periphery or edges. More particularly, the expansion table 210 includes a set of peripheral support members 212 for receiving and securely retaining peripheral portions of the film frame 12 (e.g., by way of a slot structure), such that a skeleton wafer 10 carried by the film frame 12 is disposed at a predetermined orientation and position above a gap or opening 215 in the expansion table 210 by way of the adhesive film 11 on which die 20 reside. The expansion table 210 also includes a brace member 214, relative to which the set of peripheral support members 212 is vertically displaceable for radially stretching the film 11 of a diced wafer 5 to increase the separation between die 20 to facilitate die picking. The expansion table 210 can correspond to or be a conventional type of film frame retention, expansion, and displacement device that is present in a conventional die sort apparatus 114, in a manner readily understood by one of ordinary skill in the relevant art. When the SWIS 200 is implemented in-line with the die sort apparatus 114, they can share a common platform and the SWIS 200 can utilize the same expansion table 210 as that for the die sorting apparatus 114 (e.g., the same expansion table 210 can be utilized for both die sorting and skeleton wafer inspection operations).

SWIS Image Capture Device and Lighting Sources

To facilitate skeleton wafer inspection operations, the SWIS 200 also includes (a) an image capture device 220 (e.g., a camera or digital image sensor) under which the expansion table 210 can be positioned, which is configured to capture images of segmental regions or sectors of the skeleton wafer's surface area; and (b) one or more lighting sources/elements 230, 232 configured to illuminate the skeleton wafer 10 such that die presence, die absence, and gridlines 30, 32 can be readily identified or recognized in a skeleton wafer's composite image generated from corresponding segmental images. The lighting sources 230, 232 include at least one of a first or underside/backside set of lighting sources 230 configured to direct illumination from beneath the film frame 12, through portions of the skeleton wafer 10 being captured by the image capture device 220 above; and a second or upper/top side set of lighting sources 232 configured to direct illumination toward the upper surface of the skeleton wafer 10. In certain embodiments, the SWIS 200 can additionally provide a set of optical elements disposed between the expansion table 210 and the image capture device 220 to facilitate image capture operations.

The first set of lighting sources 230 is configured to illuminate an area that is at least as large as, and typically slightly larger than, the size of each segmental image. Hence the first set of lighting sources 230 is configured to illuminate an area that is at least as large as the field of view (FOV) provided by the SWIS image capture device 220. Depending upon embodiment details, the first set of lighting sources 230 can include one or more types of light emitting elements, such as an array of LEDs. The second set of lighting sources 232 is configured to direct illumination toward the upper or top surface of the film frame 12 at a suitable angle (which can be adjustable/selectable), such that light output by the second set of lighting sources 232 can be reflected from the surface of the skeleton wafer 10 toward the image capture device 220. In a number of embodiments, the second set of lighting sources 232 can include or be a peripheral or circumferential light source such as a ring lighting device (e.g., which includes one or more circumferentially disposed rows of LEDs) disposed between the SWIS image capture device 220 and the expansion table 210 (e.g., within an illumination or lighting gap between the image capture device 220 and the expansion table 210).

The lighting sources 230, 232 output light in accordance with particular illumination parameters such as a set of illumination intensities, a set of illumination wavelengths, and/or a set of incidence angles to facilitate accurate and reliable automated identification or recognition of pixel areas within a captured image corresponding to (a) occupied skeleton wafer grid positions/stay-behind die; (b) empty skeleton wafer grid positions/empty dies areas; and (c) dicing grooves or gridlines 30, 32. In various embodiments, an angle at which illumination is incident upon the film frame's adhesive film 11, an illumination intensity, and/or an illumination wavelength can be varied, adjusted, or selected to better facilitate such automated recognition. In some embodiments, an SWIS inspection recipe can include or specify (e.g., in a selectable or programmable manner) particular lighting sources 230, 232 or segments thereof to activate and particular illumination parameters for each active lighting source 230, 232.

SWIS Image Capture Device Field of View

The SWIS image capture device 220 can have a field of view (FOV) that is sufficient for capturing segmental images of the skeleton wafer's spatial area, that is, images of fractional portions, regions, or sectors of the skeleton wafer's entire surface area, where any given segmental image typically captures a nontrivial or significant fraction of the skeleton wafer's overall surface area (e.g., compared to the area of an individual die 20). For instance, the SWIS image capture device 220 can provide an FOV that is at least slightly larger than $\frac{1}{36}$, $\frac{1}{25}$, $\frac{1}{16}$, $\frac{1}{9}$, $\frac{1}{6}$, $\frac{1}{3}$, $\frac{1}{4}$, or $\frac{1}{2}$ of the surface area of a bounding box defined to encompass the skeleton wafer's overall cross sectional area or surface area, such that per segmental image, at least slightly more than $\frac{1}{36}$, $\frac{1}{25}$, $\frac{1}{16}$, $\frac{1}{9}$, $\frac{1}{6}$, $\frac{1}{3}$, $\frac{1}{4}$, or $\frac{1}{2}$ of the skeleton wafer's surface area is captured. Additionally, the SWIS image capture device 220 can have a resolution sufficient for facilitating the identification of dicing grooves or gridlines 30, 32, and facilitating and for enabling the determination of whether a die 20 is present at or absent from a given skeleton wafer die/grid position or location corresponding to such gridlines 30, 32.

In a typical embodiment, the SWIS image capture device 220 provides (a) an FOV that is relatively larger, significantly larger, or much larger than that of an image capture device used for visually inspecting or recognizing/locating individual die 20 or small arrays of die 20; and (b) a resolution that is less, significantly less, or much less than that of an image capture device used for visually inspecting or recognizing/locating individual die 20 or small arrays of die 20. As understood by one of ordinary skill in the relevant art, the visual inspection of individual die 20 or small arrays of die 20 (e.g., during first, second, or third visual inspections described above) occurs by way of an image capture device that provides a FOV within which a high or very high resolution image is captured to facilitate the determination of whether very small or extremely small (e.g., micron-scale or even submicron-scale) intra-die optical defects are present on integrated circuit structures within the spatial extent of any single die 20.

In contrast, the SWIS image capture device 220 in accordance with embodiments of the present disclosure is intended to allow the capture of a set of segmental images, where each segmental image typically captures a plurality of die 20 (e.g., many die 20) corresponding to a portion of the wafer's surface area that is significantly larger than the surface area of a single die 20 or a small array of die 20 that would be captured for purpose of first, second, or third visual inspection operations, or which would be captured for purpose of die recognition/location during die sort operations. The SWIS 200 generates a composite image of the entire skeleton wafer 10 from the segmental images. The segmental images, and hence the composite image, provide sufficient resolution to enable the SWIS 200 to (a) detect or reconstruct gridlines within the segmental images and the composite image, respectively; and (b) assess die presence or die absence at composite image grid positions, which correspond to skeleton wafer grid positions defined by the skeleton wafer's physical gridlines 30, 32.

For the purposes of SWIS operations, there is no need to identify the existence of intra-die defects (e.g., micron or submicron scale optical defects). Accordingly, the SWIS image capture device 220 will have (i) a relatively lower resolution than that of the die sort camera, and (ii) a relatively larger FOV within which substantial portions or fractions of the skeleton wafer's surface area can be captured within each segmental image. This means that the composite image of the entire processed skeleton wafer 10, including its gridlines 30, 32, can be generated by capturing significantly fewer images than if a camera for the die sorter is used to capture images of each die 20 spanning the skeleton wafer's entire surface area. For instance, for small or very small sized die 20 (e.g., 2 mm×2 mm or smaller die) manufactured on a large wafer (e.g., a 300 mm wafer), the SWIS image capture device 220 can have a FOV in which implementation, an SWIS 200 can inspect 100% of such an 8-inch skeleton wafer's active die area to verify correct die removal therefrom in less than 5 minutes, or less than 3 minutes, or in about 2-2.5 minutes.

One having ordinary skill in the relevant art will understand that if the die size is even smaller, the resolution of the SWIS image capture device 220 can be increased, and relatively more segmental images captured. With respect to additional/other representative SWIS implementations, Table 1 below provides representative SWIS image capture device FOV and resolution parameters for particular die sizes and wafer sizes, and also specifies a number of segmental images required for imaging the entire surface area of a skeleton wafer 10.

TABLE 1

Representative SWIS Image Capture Device Parameters

| Die Size (mm) | Min Pixel resolution required (um) | FOV (mm) based on 2k × 2k camera | Wafer Size (mm) | Overlap (mm) (10% of FOV width or One die size whichover is larger) | Number of Images required |
|---|---|---|---|---|---|
| 0.1 × 0.1 | 0.1/5 = 20 um | 40 × 40 | 200 × 200 | 4 | 36 (6 × 6) |
| 0.2 × 0.2 | 0.2/5 = 40 um | 80 × 80 | 200 × 200 | 8 | 9 (3 × 3) |
| 0.5 × 0.5 | 0.5/5 = 100 um This is larger than the pixel resolution, so use 40 um | 80 × 80 | 200 × 200 | 8 | 9 (3 × 3) |
| 10 × 10 | 10/5 = 2 mm This is larger than the pixel resolution, so use 40 um | 80 × 80 | 200 × 200 | 10 (die size is larger than 10% of FOV) | 9 (3 × 3) |
| 20 × 20 | 40 um | 80 × 80 | 200 × 200 | 20 | 16 (4 × 4) | dozens, many tens, hundreds, several or many hundreds, or on the order of 1,000 die 20 are present per captured segmental image, depending upon embodiment details. Furthermore, the SWIS image capture device 220 need not be a color image capture device. Rather, it can be a black-and-white or monochrome image capture device.

In view of the foregoing, skeleton wafer inspection in accordance with embodiments of the present disclosure does not involve the capture of many high resolution images of individual die 20 (e.g., hundreds or thousands of individual die images, when a wafer's active die area includes hundreds or thousands of die 20). This results in very significant or dramatic time savings compared to prior skeleton wafer inspection techniques (especially for 100% skeleton wafer inspection). Moreover, because various embodiments of the present disclosure can utilize a less expensive, low resolution image capture device 220, and several embodiments utilize the same expansion table 210 as the die sort apparatus 114, skeleton wafer inspection systems in accordance with embodiments of the present disclosure are relatively cheaper to implement than prior skeleton wafer inspection systems.

In a representative implementation directed to performing skeleton wafer inspection operations on 8-inch wafers having a die size of no smaller than approximately 1×1 mm², an SWIS image capture device 220 configured for capturing a set of 9 segmental images that collectively span the skeleton wafer's entire surface area can have a field of view of approximately 80 mm×80 mm, and a digital image sensor capable of capturing a 4 megapixel digital image, which provides a resolution of about 5 μm. In such a representative Illumination to Facilitate Skeleton Wafer Inspection As indicated above, the SWIS 200 provides a number of lighting sources 230, 232 that facilitate reliable image processing based recognition or identification of (a) skeleton wafer dicing grooves or gridlines 30, 32 that define grid positions at which die 20 can reside on the diced wafer 5, from which die 20 may have been picked and sorted during die sort operations depending upon electrical testing results, visual inspection results, and sort codes; (b) die presence at particular skeleton wafer grid positions; and (c) die absence from other skeleton wafer grid positions.

As understood by one of ordinary skill in the relevant art, during sawing of the wafer to singulate each die 20 thereon, the saw, in sawing through the wafer, cuts into (without cutting through) the film 11 on the film frame 12. As indicated in FIGS. 6A and 6B, the sawing process forms partial depth channels 34 in the film 11. Such channels 34 reside at the bottom of the dicing grooves or gridlines 30, 32 on each of the diced wafer 5 and the skeleton wafer 10.

Stay-behind die, empty die positions, and dicing grooves 30, 32 will affect illumination directed to the skeleton wafer 10 in different manners. More particularly, at any given point within an image capture plane corresponding to the SWIS image capture device 220 (e.g., an image capture plane at which an image sensor resides), the extent to which illumination directed to the skeleton wafer 10 reaches that point depends upon whether (a) the illumination was provided from above and/or below the skeleton wafer 10; and (b) a stay-behind die, an empty die position, or a dicing groove/gridline 30, 32 was present along the optical path of such illumination. Imaged stay-behind die, empty die positions, and gridlines 30, 32 will therefore each have different optical or visual characteristics, depending upon skeleton wafer illumination conditions.

With respect to illumination provided from below the skeleton wafer 10, stay-behind die will block the passage of such illumination toward the image capture device 200; empty die positions allow the passage of such illumination through the film 11 to the image capture device 220; and skeleton wafer gridlines 30, 32 will at least partially scatter (and can significantly scatter) illumination traveling from beneath the skeleton wafer 10 toward the image capture device 220 because of the gridlines' partial depth channels 34. Notwithstanding such scattering, some illumination that travels through the gridlines 30, 32 will be captured by the image capture device 220. With respect to illumination provided from above the skeleton wafer 10; stay-behind die will reflect top-side illumination differently than empty die positions and gridlines 30, 32.

FIG. 7A shows a composite image 1000 of a skeleton wafer 10 under representative illumination conditions corresponding to the provision of illumination to both the top and bottom sides of the skeleton wafer 10 during the capture of segmental images, such as by way of a first or underside lighting source 230 and a second or upper side lighting source 232. FIG. 7B shows a magnified portion 1002 of the skeleton wafer composite image 1000, which corresponds to a 2×7 array of skeleton wafer grid positions that are delineated from each other by horizontal and vertical gridlines 30, 32.

Under the illumination conditions of FIGS. 7A and 7B, stay-behind die 50 appear as darkly or very darkly shaded areas; empty die positions 52 appear as unshaded or minimally/lightly shaded areas; and dicing grooves 30, 32 appear as relatively dark or moderately dark narrow lines or stripes that define the skeleton wafer's grid positions. In general, within a composite image 1000 generated from segmental images captured under appropriate illumination conditions, (a) stay-behind die 50 correspond to pixel arrays having a first average intensity; (b) empty die positions 52 correspond to pixel arrays having a second average intensity that is different or significantly different than the first average intensity; and (c) dicing grooves 30, 32 correspond to narrow pixel lines or stripes having a third average intensity, which is different than the second average intensity and which can be different or significantly different than the first average intensity. The relative optical or visual characteristics of imaged stay-behind die 50, empty die positions 52, and dicing grooves 30, 32 depend upon the particular conditions under which the top and/or bottom of the skeleton wafer 10 are illuminated (e.g., which lighting sources 230, 232 are active, and the illumination parameters such as illumination intensity, wavelength, and angle of incidence for each lighting source 230, 232), as well as die size and the inter-die separation defined by the dicing grooves/gridlines 30, 32 (which depends upon as-manufactured gridline widths, as well the extent to which the film 11 is stretched).

In various situations, to enhance the overall imaging contrast of gridlines 30, 32 relative to stay-behind die 50 and/or empty die positions 52, particular illumination conditions, including the activation or inactivation of a particular lighting source 230, 232 and the selection of illumination parameters of applied illumination can be established, adjusted, or tailored such that imaged gridlines 30, 32, stay-behind die 50, and/or empty die positions 52 can more readily be optically or visually distinguished from each other by an image processing algorithm.

Figure 7D:
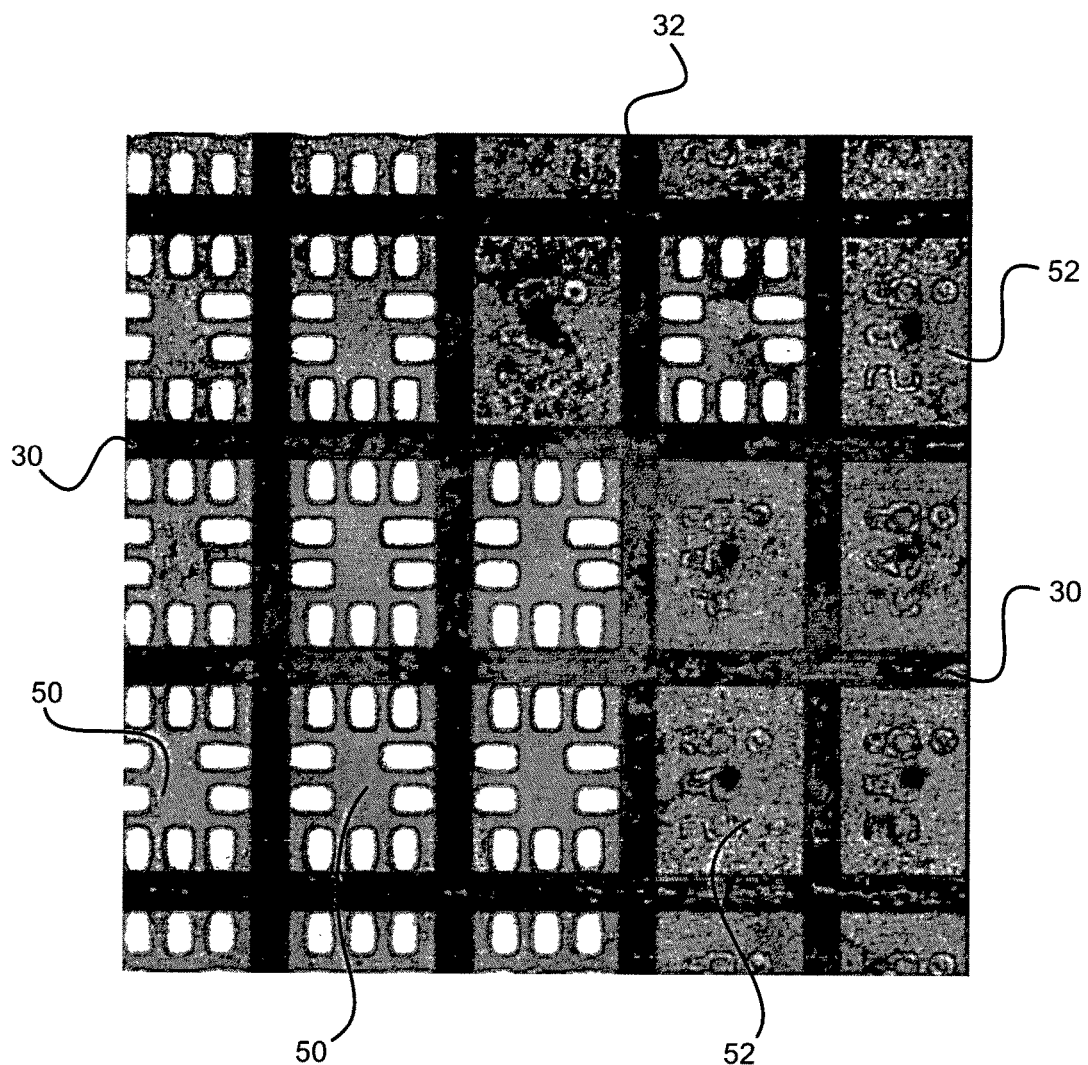
FIG. 7D shows portions of a segmental image of a skeleton wafer, as captured under a representative topside illumination condition.

Furthermore, in several situations, structural features such as metallization or solder bumps on the exposed upper surfaces of stay-behind die 50 will reflect top-side illumination differently (e.g., more strongly) than empty die positions 50 and gridlines 30, 32. Hence, the presence of such structural features on stay-behind die 50 can enhance the likelihood that an image processing algorithm can reliably distinguish stay-behind die 50 from empty die positions 52 and gridlines 30, 32. For instance, FIG. 7D shows portions of a segmental image of a skeleton wafer 10, as captured under a representative topside illumination condition. As indicated in FIG. 7D, stay-behind die 50 within the segmental image are readily optically or visually distinguishable from both empty die positions 52 and gridlines 30, 32 under such an illumination condition.

In various embodiments, suitable skeleton wafer illumination conditions during the capture of segmental images provides a balance between the correct contrast for gridlines 30, 32 to be properly imaged relative to both stay-behind die 50 and empty die positions 52. An individual having ordinary skill in the relevant art will recognize that if the illumination intensity provided to the underside of the skeleton wafer 10 by the first set of lighting sources 230 is too great, the contrast between the gridlines 30, 32 and the empty die positions 52 will be lower. Notwithstanding, in several situations the underside illumination should not be too low, or the gridlines 30, 32 between stay-behind die 50, 52 may not be illuminated and captured in a manner that facilitates reliable image processing based recognition of the gridlines 30, 32 relative to stay-behind die 50 and/or empty die positions 52. In certain embodiments, collimated light (e.g., collimated white light) can be used to facilitate enhanced imaging and image processing based recognition of the gridlines 30, 32, stay-behind die 50 and/or empty die positions 52 relative to each other. It should be noted more than one segmental image for each segment (at least one) may be captured under different illuminations for purpose image analysis or correlation.

As indicated above, the first set of lighting sources 230 is configured to illuminate an area that is at least as large as the SWIS image capture device FOV. In various embodiments, the second set of lighting sources 232 is configured to illuminate the entire upper surface of the skeleton wafer 10; however, in some embodiments, the second set of lighting sources 232 illuminates less than the entire surface of the skeleton wafer 10. To provide suitable or optimal contrast in each segmental image for distinguishing gridlines 30, 32 and detecting die presence 50 and die absence 52, a set of appropriate illumination types and illumination parameters can be established or selected (e.g., as part of a skeleton wafer inspection recipe) prior to the capture of segmental images. Such illumination types and parameters can depend upon the type and size of die 20 manufactured on a batch of wafers under consideration.

Processing Unit and Memory

The SWIS 200 further includes a processing unit 250 and a memory 260, which are coupled to the SWIS image capture device 220. The processing unit 250 can execute program instructions (e.g., software) stored within the memory 260, including one or more program instruction sets directed to controlling or performing automated skeleton wafer inspection and/or analysis procedures in accordance with embodiments of the present disclosure. For instance, the memory 260 can include a skeleton wafer inspection module 262 that includes such program instruction sets.

The memory 260 can further include at least some of the following:

I. A skeleton wafer inspection configuration/inspection recipe memory 264, which can store or reference for any given wafer under consideration (e.g., within a batch of wafers) skeleton wafer inspection configuration/setup data or a skeleton wafer inspection recipe, as further detailed below;

II. An image memory 266 for storing a set of captured segmental images corresponding to regions, portions, sectors, or fractional areas of the skeleton wafer 10, and for storing a composite image of the skeleton wafer 10 generated using the segmental images;

III. A working memory 268 for storing information (e.g., data and/or results) generated as part of the skeleton wafer inspection process, such as (a) skeleton wafer extraction map that indicates which die 20 were physically extracted from the diced wafer 5 based upon information correlated with, contained in, or determined from captured segmental images; and (b) other information such as an extraction error map indicating skeleton wafer locations or grid positions at which die extraction errors occurred, and possibly corresponding die extraction error types.

Certain embodiments of the SWIS 200 can also include a data storage unit (e.g., a hard disk drive). The processing unit 250 and the memory 260 can be coupled to one or more other portions of a semiconductor manufacturing system (e.g., a component handler/die sort apparatus 114 and/or a system control unit) by way of a communication/network interface unit 270, such that the processing unit 250 can receive, retrieve, or access the PW map and sort codes corresponding to a skeleton wafer 10 currently under consideration, and communicate skeleton wafer inspection results (e.g., corresponding to the extraction error map) to one or more other systems, apparatuses, or devices.

Representative Die Sort and Skeleton Wafer Inspection Operations

Such that the reader clearly understands skeleton wafer inspection processes that can be managed or performed by a skeleton wafer inspection module 262 in accordance with embodiments of the present disclosure, various fundamental concepts relevant to skeleton wafer inspection in accordance with embodiments of the present disclosure are elaborated upon hereafter.

Initial Setup Considerations

As previously indicated, stay-behind die 50 will typically include electrically bad die, and thus a given sort code can be defined or selected to correspond to electrically bad die. In some situations, stay-behind die 50 can also include die 20 that are electrically good, but which exhibit one or more specified types of serious visual defects (e.g., missing solder bumps, or dimensional errors). Thus, one or more other sort codes can be designated for electrically good yet visually defective die that are to remain on the skeleton wafer 10. However, it must be appreciated that the definition of a stay-behind die 50 depends on the manner in which the sort codes are defined. For instance, it is possible, if desired or required, to define the stay-behind die 50 to be those die 20 that are electrically good, such that electrically bad die 20 can be picked away to a designated reject bin. Such an "inverse" approach to die sort operations can be more efficient and desirable if the number of electrically bad die 20 are much fewer in number than those that are electrically good. The remaining (expected good) die 20 on the film frame 12 can then be easily scraped off into bowls (in another operation) for scan and taping operations using faster turret machines. Prior to the scraping of such die 20 off of the film frame 12, skeleton wafer inspection in accordance with embodiments of the present disclosure can be performed to verify whether die picking errors have occurred.

Before the start of the automatic die sort operations for one or more batches of wafers bearing the same type(s) of semiconductor device(s), an operator sets up or selects a die sort recipe that defines a set of sort codes. In setting up the die sort recipe, the operator typically (a) decides what classifications of die 20 should be picked based on the outcome or possible outcome of combinations of electrical test and visual inspection results; and (b) assigns or selects the appropriate sort code(s) for particular outcomes of combinations of electrical test and visual inspection results.

Dynamic Update of PW Map During Die Sort Operations

In an embodiment in which the die sort apparatus 115 conducts a set of visual inspection operations during die sort operations, the results of visual inspection for each die 20 are accordingly updated in real-time to the PW map before the die 20 is contemporaneously transferred to a predetermined destination in accordance with the sort codes. Table 2 provides representative relationships between PW map codes and sort codes, including codes for inspection operations performed during die sort operations; and Table 3 provides a sort code legend corresponding to Table 2. In accordance with Tables 2 and 3, electrically bad die are to remain as stay-behind die 50 on the skeleton wafer 10. Die 20 that are both electrically good and visually good are to be picked to tape (PT). Electrically bad die that visually exhibit symbol/mark defects, dimension defects, scratches, chipping, or a combination of dimension and chipping defects are to be sorted to particular bins or trays, in accordance with the sort codes assigned thereto.

TABLE 2

Representative PW Map Code - Sort Code Table

| | PW Map Code | | PW Map Code | |
|---|---|---|---|---|
| | Electrically Bad | Sort Code | Electrically Good | Sort Code |
| Visually Good | 0 | NP | 1 | PT |
| Visually Rejected | | | | |
| Bump Absence | 0 | NP | 2 | B1 |
| Bump Planarity | 0 | NP | 3 | B2 |
| Die Sort Inspection | | | | |
| Symbol/Mark | — | | 4 | T1 |
| Dimension | — | | 5 | B3 |
| Scratches | — | | 6 | T2 |
| Chipping | — | | 7 | B4 |
| Defects 5 and 7 | — | | 8 | B5 |

TABLE 3

Representative Sort Code Legend

PW Map Code:

| 0 | 1 | 2 | 3 | 4 | 5 | 6 | 7 | 8 |
|---|---|---|---|---|---|---|---|---|

Die Sort Action:

| No Pick (NP) | | | | Pick to Destination | | | | |
|---|---|---|---|---|---|---|---|---|

Sort To:

| | PT | B1 | B2 | T1 | B3 | T2 | B4 | B5 |
|---|---|---|---|---|---|---|---|---|
| | Tape | Bin 1 (Reject) | Bin 2 (Reject) | Tray 1 (Rework) | Bin 3 (Reject) | Tray 2 (Rework) | Bin 4 (Reject) | Bin 5 (Reject) |

Thus, if a portion of a representative PW map includes the data shown in Table 4 prior to visual inspection during die sort operations:

TABLE 4

PW Map Data before Pick and Place Visual Inspection

| 0 | 1 | 3 | 0 |
|---|---|---|---|
| 1 | 1 | 1 | 0 |
| 0 | 1 | 1 | 1 |
| 2 | 0 | 0 | 1 |

As a result of visual inspection operations performed in association with die sort operations (e.g., additional visual inspection once a die has been picked), the representative PW map can be updated as follows due to the detection of visual defects during such visual inspection operations:

TABLE 5

Updated PW Map Data after Pick and Place Visual Inspection

| 0 | 2 | 3 | 0 |
|---|---|---|---|
| 1 | 7 | 4 | 0 |
| 0 | 6 | 1 | 1 |
| 2 | 0 | 0 | 4 |

The shaded entries in Table 5 correspond to picked die for which the die sort visual inspection operations identified specific types of visual defects, in accordance with which the PW map was updated based upon identified visual defect type.

SWIS—Die Sort Apparatus Interaction

In an in-line SWIS configuration deployed with a die sort apparatus 115, skeleton wafer inspection operations for verifying whether active area die 20 were correctly or incorrectly picked during die sort operations begin once die sort operations are completed with the skeleton wafer 10 remaining on the expansion table 210. The die sort apparatus 115 displaces the expansion table 210 to position the skeleton wafer 10 beneath the SWIS image capture device 220. For other types of SWIS configurations, the skeleton wafer 10 can be transferred or transported to a dedicated SWIS 200 by other means, in a manner readily understood by those having ordinary skill in the relevant art.

Segmental Image Capture and Composite Image Generation

This section describes an embodiment which generally involves the capture of a set of segmental images following, i.e., after completion of, the die sort operations. Once a skeleton wafer 10 is positioned beneath the SWIS image capture device 220, the SWIS 200 directs the capture of at least one set of segmental images of the physical skeleton wafer 10, and generates at least one skeleton wafer composite image from the segmental images, as further described hereafter. Each segmental image corresponds to a predetermined region, portion, or fraction of the skeleton wafer's entire surface area, and/or a predetermined region, portion, or fraction of a mathematical or geometric bounding enclosure (e.g., a bounding box) defined for the skeleton wafer 10. In various embodiments, a complete set of segmental images spans or encompasses 100%, or essentially/substantially 100%, of the skeleton wafer's surface area. A complete set of segmental images thus includes at least one image, and in various embodiments, multiple images.

After capturing the set of segmental images, the SWIS 200 digitally "stitches" together, joins, or unifies the segmental images to generate a composite or overall image of the skeleton wafer 10. In various embodiments, the composite image of the skeleton wafer 10 is a virtual representation of the entire physical skeleton wafer 10 (e.g., 100%, or essentially/substantially 100% of the skeleton wafer 10). Such a composite image thus includes image data corresponding to each die position on the physical skeleton wafer 10, including (a) each active area die position, and (b) each dummy die position. The SWIS 200 can analyze pixel information within the composite image to determine gridline widths in image space (i.e., the number of pixels that imaged gridlines 30, 32 span), and die sizes in image space (i.e., the number of pixels in x and y dimensions that at least one imaged die position spans). As further detailed below, the SWIS 200 can further determine the location of a reference origin/grid position within the composite image; and the location of a first/start die within the portion of the composite image that corresponds to the skeleton wafer's active die area. The SWIS 200 can subsequently digitally traverse and/or reconstruct the skeleton wafer's physical grid in image space, and identify for any given composite image die position whether pixel information indicates die presence 50 thereat or die absence 52 therefrom.

Capture of Single or Multiple Complete Sets of Segmental Images

In several embodiments, the SWIS 200 captures a single complete set of segmental images under illumination conditions for which the active light source(s) 230, 232 and corresponding illumination parameters enable reliable image processing based identification of imaged gridlines 30, 32, imaged stay behind die 50, and imaged empty die positions 52 within a composite image generated from the single complete set of segmental images.

Alternatively, in some embodiments, multiple complete sets of segmental images can be captured the same illumination or distinct illumination settings to for purpose of image analysis or correlation, e.g., to facilitate reliable or accurate automated determination of whether a pixel array or area within the composite image corresponds to imaged gridlines 30, 32, stay behind die 50, and empty die positions 52. Any given complete set of segmental images can be captured under the same or distinct/different illumination conditions or parameters. For instance, a first set of segmental images can be captured under a corresponding first set of illumination conditions (e.g., which provides for the activation of one or both active light sources 230, 232 in accordance with a first set of illumination intensities, a first set of illumination wavelengths, and/or a first set of illumination incidence angles); and a second set of segmental images can be captured under a corresponding second set of illumination conditions distinct from the first set of illumination conditions. Each set of illumination conditions can be directed to aiding or enabling reliable image processing based identification of imaged gridlines 30, 32; stay behind die 50; and empty die positions 52. That is, the capture of multiple sets of segmental images of the skeleton wafer 10, where each set of segmental images corresponds to identical, essentially identical, or overlapping regions of the skeleton wafer 10 under particular illumination conditions, can enhance the confidence level of an automated decision directed to identifying gridlines 30, 32, stay behind die 50, and/or empty die positions 52 within the composite image.

Depending upon embodiment details, the first set of segmental images can be digitally stitched together to form a first consolidated image of the skeleton wafer 10; the second set of segmental images can be digitally stitched together to for a second consolidated image of the skeleton wafer 10; and the first and second consolidated images can be digitally combined or unified to form the composite image. Alternatively, the first and second sets of segmental images can be concurrently digitally stitched together to form the composite image.

One having ordinary skill in the relevant art will understand that segmental image capture sequences corresponding to one or multiple sets of segmental images and appropriate illumination conditions or parameters associated therewith can be determined (e.g., experimentally) for batches of wafers for a given type and size of manufactured device. Such information can be saved to a file that can be retrieved for use in a skeleton wafer inspection recipe; or input (e.g., by a technician) by way of a menu selection or manual input directed to a graphical user interface.

In still other embodiments, multiple composite images can be generated, each of which can correspond to one or multiple complete sets of captured segmental images. Each composite image can be individually analyzed for purpose of identifying imaged gridlines 30, 32, stay behind die 50, and/or empty die positions 52.

Capture of Diced Wafer Segmental Images

In certain embodiments, in addition to capturing segmental images of the skeleton wafer 10 and generating a skeleton wafer composite image, the SWIS 200 can capture segmental images of the diced wafer 5, and generate a composite image of the diced wafer 5 before, i.e., prior to, the start of the die sort operations. That is, in such embodiments, the SWIS generates a first composite image corresponding to the diced wafer 5, and a second composite image corresponding to the skeleton wafer 10. It can be advantageous to create a first composite image corresponding fully to the diced wafer 5 before the start of die sort operations because such an image can be used as a navigational aid or guide in association with (a) skeleton wafer inspection, such as to facilitate direct navigation to particular die locations on the skeleton wafer 10 after die sort operations are complete; and/or (b) die sorting itself, such as to guide a pick and place apparatus 160 during die sort operations. This first composite image can be used as a navigational guide for subsequent wafers of the same batch.

As explained below, the first composite image of the diced wafer 5 will have not only information pertaining to each and every die 20 (including dummy die) on the diced wafer 5, but also their relative positions with respect to the reference origin. Such information can be helpful especially as the die sort operations progress and there are fewer die 20 remaining on the skeleton wafer 10 from which the die sort apparatus 115 can reference its position for performing pick and place operations. The die sort apparatus 115 can thus use first composite image information for guiding the pick and place apparatus 160 in picking up individual or isolated die 20 with greater ease and speed.

Depending upon embodiment details, the SWIS 200 can utilize the first composite image and/or the second composite image for spatially correlating at least one composite image active area die position with a counterpart PW map die position. More particularly, the generation of a diced wafer composite image can aid image processing accuracy in determining particular points, locations, and/or die positions within the skeleton wafer composite image.

Once a diced wafer composite image has been generated, the SWIS 200 can analyze the diced wafer composite image to determine one or more of (a) the width in pixels of imaged gridlines; (b) the size or dimensions in pixels of imaged die 20; (b) the location of a reference origin/grid position; (c) the location of a first/start die relative to the reference origin/grid position; and (d) the layout of imaged gridlines 30, 32 corresponding to the skeleton wafer's physical gridlines 30, 32 within the diced wafer composite image.

The SWIS 200 can utilize one or more of the diced wafer composite image reference origin/grid position, first/start die position, and grid layout to determine or aid determination of the skeleton wafer composite image reference origin/grid position, first/start die position, and grid layout, respectively. The SWIS 200 can additionally determine a skeleton wafer expansion or stretch factor relative to the diced wafer 10 by comparing aspects the diced wafer composite image or information determined therefrom (e.g., grid layout) with aspects of the skeleton wafer composite image or information determined therefrom (e.g., grid layout), respectively. The use of information generated from the diced wafer composite image, as well as the expansion factor, can (a) increase the statistical accuracy of determining imaged die positions within the skeleton wafer's composite image, for, instance, when very few die 20 remain on the skeleton wafer 10 after die sort operations, or in situations in which the skeleton wafer's film 11 may have become slightly distorted as die 20 are picked therefrom; (b) aid digital image space navigation or traversal from one die position to another within the skeleton wafer composite image; and (c) aid real/physical space navigation from one die position to another on the skeleton wafer 10, for instance, in association with pick and place operations, because die locations/grid positions on the physical skeleton wafer 10 are correlated with die locations/grid positions in the skeleton wafer composite image, which are correlated with die locations/grid positions in the diced wafer composite image.

In specific embodiments, at least some of the generation of a diced wafer composite image, the determination of a reference origin/grid position, the determination of a first/start die position, and the digital reconstruction of diced wafer gridlines 30, 32 within the diced wafer composite image can occur as a parallel computing process that is executed concurrent with die sort operations. For purpose of brevity, descriptive material provided hereafter with reference to the skeleton wafer and the skeleton wafer's composite image can be analogously or equally applicable to the diced wafer and a diced wafer composite image.

For purpose of simplicity and to aid understanding, the description that follows considers the capture of a single complete set of segmental images of the skeleton wafer 10, and the generation of a single composite image therefrom. Notwithstanding, one having ordinary skill in the relevant art will understand that the SWIS 200 can capture one or multiple sets of segmental images of the skeleton wafer 10 and possibly the diced wafer 5 for generating at least one composite image, in a manner substantially identical or analogous to that described below.

Identifying Imaged Active Area Die Positions in the Composite Image

As previously indicated, the PW map represents a subset of the wafer's entire surface area, the composite image of the skeleton wafer 10. However, the composite image of the skeleton wafer 10 is typically an image of the whole physical skeleton wafer 10, spanning both active area die positions and dummy/mirror die positions. As a result, there are multiple possible regions within the composite image to which the PW map's die positions, which correspond to the wafer's active area die, can be mapped. It is therefore necessary to resolve the problem of establishing the proper spatial alignment or registration between PW map die positions and the subset of die positions within the skeleton wafer's composite image that correspond to active area die positions.

To solve this problem, the SWIS 200 spatially correlates, registers, aligns, or identifies the portion of the skeleton wafer's composite image corresponding to active area die positions with PW map active area die positions.

Determination of a Skeleton Wafer Reference Origin or a Reference Grid Location/Position It should be noted that information that is providable or known to the SWIS 200 includes the size of the wafer, the die size, and the diced wafer's orientation on the film frame 12. The orientation of the composite image relative to the film frame 12 is also known. In various embodiments, for the SWIS 200 to correctly spatially correlate each active area die position within the skeleton wafer's composite image with its counterpart active area die position on the physical skeleton wafer 10 and within PW map, the SWIS 200 determines (a) a reference origin, and/or (b) a reference grid location/position by analyzing skeleton wafer's composite image. The reference origin or reference grid location/position corresponds to a pixel coordinate within the composite image, which itself corresponds to a known or predetermined origin, point, or grid position on the physical skeleton wafer 10. A reference origin within the composite image can be a particular point in image space or pixel space. A reference grid position can be a particular point in image space, or an array of pixels at a particular location in image space. A reference grid position can thus itself be analogous or essentially equivalent to or defined as a reference origin.

Based upon the reference origin/grid position, each active area die position within the skeleton wafer's composite image can be determined, including the position of a first/start die that corresponds to the position of a predetermined first/start die within the PW map. The first/start die position within the composite image corresponds to a specific die position within the physical skeleton wafer's active die area, which is a known distance and direction away from the reference origin. Within the composite image, the first/start die resides a given image space distance and direction away from the reference origin/grid position in image space. Once the position of the first/start die within the composite image is determined, composite image data corresponding to each composite image active area die position can be correlated or compared with counterpart PW map information to verify whether die 20 have been properly or improperly picked from the physical skeleton wafer's active area, as further detailed below.

The reference origin/grid position serves a purpose analogous to that of a reference die 21 identified or selected for die sort operations, but in various embodiments in accordance with the present disclosure, the reference origin/grid position corresponds to a skeleton wafer or die location or position other than that of the reference die 21. That is, the reference origin/grid position corresponds to a skeleton wafer location or die position that is not the same as, and which is distinctly different from, a location or position of the reference die 21.

Representative Manners of Determining a Reference Origin

The determination of a reference origin and the position of a first/start die relative thereto within the skeleton wafer's composite image can be determined in multiple manners. In embodiments in which the skeleton wafer 10 has a substantially regular shape, a reference origin can be defined as the center point of the skeleton wafer 10. For instance, most wafers are substantially round; hence, the SWIS 200 can determine the reference origin by identifying at least three points within the composite image using conventional image processing techniques, where such points are located on the periphery of the skeleton wafer 10. Based upon such points, conventional image processing techniques can determine the circumference of a circle having the same diameter as the skeleton wafer 10 to thereby determine the skeleton wafer's center point (e.g., as a pixel coordinate in image space). Even when peripheral portions of a processed wafer are missing as a result of processing or handling operations, the determination of the skeleton wafer's center point would not be affected because the curvature of the skeleton wafer can be extrapolated algorithmically with a high degree of accuracy, in a manner readily understood by one of ordinary skill in the relevant art. Once the center point of the skeleton wafer 10 within the composite image is located, the relative position of the first/start die within the composite image can be readily identified because the position of the first/start die with respect to this reference origin is predetermined, in accordance with each of a pixel count or distance and a horizontal and vertical gridline distance (e.g., in view of the SWIS image capture device resolution).

In some embodiments, the position of the first/start die relative to the reference origin is determined by identifying or recognizing a set of gridlines 30, 32 within the composite image, and moving or shifting to the location of the first/start die within the composite image by counting the number of horizontal and vertical gridlines 30, 32 away from the reference origin at which the first/start die is known to reside, based upon the known physical layout of the processed wafer. In such embodiments, the SWIS 200 can utilize image processing algorithms to recognize or differentiate gridlines 30, 32 within the composite image. In image space, the imaged gridlines 30, 32 are narrow horizontal and vertical lines or stripes that span a predetermined number of pixels (e.g., 3-5 pixels, in accordance with SWIS image capture device resolution) corresponding to physical gridline width. Because the die size is known, the horizontal and vertical pixel dimensions of each die position within the composite image are also known. Expected gridlines 30, 32 can be determined within or projected onto the composite image in accordance with the die size, such that the position of the first/start die and the relative position of each other active die position within the composite image can be readily determined.

Although in the some embodiments, the reference origin is defined to be the center of the skeleton wafer 10 (or equivalently, the center of the diced wafer 5 or the processed wafer), this need not be the case in other embodiments, and suitable wafer features can be selected for purpose of defining or identifying a reference origin. Which wafer features to use for defining the reference origin depends on the physical characteristics of a batch of wafers under consideration, and whether such features are easily and consistently recognizable or locatable within the composite image. The reference origin can also be selected based on information provided by the manufacturer of the semiconductor wafer that relates to a standardized physical wafer specification that is implemented for manufacturing a wafer of a particular size, for a particular type and size of device (e.g., integrated circuit). Such information is typically contained in a document generally referred as a Physical Wafer Standards (PWS) document that can be obtained from each wafer manufacturer, in a manner readily understood by one of ordinary skill in the relevant art.

FIGS. 8A and 8B provide illustrations of portions of representative PWS documents. Information provided by a PWS document includes the widest horizontal dimension and vertical dimension of the wafer, and the position of a reference die 21 for manufacturing a particular type and size of device on a wafer of particular size. From a given PWS document, an engineer or technician can define or determine a horizontal reference line and a vertical reference line, and their point of intersection can defined as the reference origin for determining the position of the first/start die (and/or that of the wafer's reference die 21). The SWIS 200 can analyze the composite image to identify predetermined or predefined horizontal and vertical reference lines. For instance, information specifying which of the wafer's gridlines 30, 32 are defined as the horizontal and vertical reference lines can be specified in a setup recipe for skeleton wafer inspection.

Additional or other information can be used to define a reference origin. For instance, in another embodiment, the bottom-most horizontal gridline 30 on the wafer nearest to the wafer ID can be used as a horizontal reference line, and a particular vertical gridline 32 (e.g., a leftmost or rightmost vertical gridline 30 that intersects this horizontal reference line) can be defined as a vertical reference line. The point of intersection between the horizontal and vertical reference lines can define the reference origin, relative to which the position of the first/start die is predetermined.

Representative Manner of Determining a Reference Grid Location/Position

In addition or as an alternative to determining a reference origin, some embodiments can digitally identify or reconstruct the skeleton wafer's grid layout from the composite image, and determine a reference grid point, location, or position within the composite image. The position of the first/start die can then be determined relative to the reference grid location.

To digitally identify/reconstruct the skeleton wafer's grid layout, the SWIS 200 analyzes the composite image using conventional image processing techniques. As indicated above, imaged gridlines 30, 32 can be identified based upon the intensities of pixels within narrow or very narrow rows and columns of pixels, relative to pixel intensities within larger or significantly larger pixel areas that correspond to stay-behind die 50 and empty die positions 52. The SWIS 200 can digitally identify/reconstruct each imaged horizontal gridline 30 and vertical gridline 32 present within the composite image.

As will be understood by one of ordinary skill in the relevant art, as a result of processing or handling, one or more peripheral rows and/or columns of die 20 can drop or fall off of the wafer. Consequently, the total number of horizontal and/or vertical gridlines 30, 32 within the composite image may be less than the total number of horizontal and/or vertical gridlines 30, 32 on the as-manufactured physical wafer. In some embodiments, the SWIS 200 can count the total number of horizontal and vertical gridlines 30, 32 within the composite image, and analyze the absolute or relative lengths of the outermost top, bottom, left, and right k imaged gridlines 30, 32 (e.g., k=3, 4, or 5) and compare such absolute or relative lengths with the wafer's known grid layout to identify one or more outer rows and/or columns of die 20 that are missing from the skeleton wafer 10 based upon the composite image.

If the digitally reconstructed gridlines 30, 32 match the wafer's known grid layout, the SWIS 200 can define a center point of the digitally reconstructed grid as a reference origin, which exists within or adjacent to a reference grid location/position (e.g., a centermost or central grid position). The SWIS 200 can determine the position of the first/start die relative to this reference grid position by counting a predetermined number of horizontal and vertical gridlines 30, 32 away from the reference grid position, in a predetermined direction, to arrive at the first/start die. If the SWIS 200 determines that one or more outer rows and/or columns of die 20 are missing from the skeleton wafer 10, the SWIS 200 can include an appropriate horizontal and/or vertical grid offset to account for the missing row(s) and/or column(s) of die 20 when determining the position of the first/start die relative to the reference grid location/position.

In some embodiments, the SWIS 200 can additionally or alternatively recognize or digitally reconstruct gridlines 30, 32 by way of recognizing the vertical and horizontal edges of stay-behind die 50 on the skeleton wafer 10. Because the gridlines 30, 32 are adjacent and parallel or perpendicular to such die edges and extend across the entire skeleton wafer 10, and an expected gridline width is known or approximately known, gridline reconstruction is straightforward, provided at least a small number of die 20 reside within the skeleton wafer's active area at die locations corresponding to multiple distinct gridlines 30, 32.

Moving to the First/Start Die Position and/or Other Die Positions in Image Space In various embodiments, in order to verify die presence 50 at or die absence 52 from composite image die positions (e.g., imaged active area die positions) corresponding to physical grid positions on the skeleton wafer 10, the SWIS 200 successively analyzes or evaluates pixel arrays corresponding to the composite image die positions. The SWIS 200 successively moves or steps to, across, and/or through composite image die positions in accordance with the image space or pixel space dimensions of each die 20. Such image space die dimensions are predetermined by and correlated with the physical die size and the resolution of the SWIS image capture device 220, and can be confirmed by way of SWIS analysis of the composite image.

Once the SWIS 200 identifies a reference origin and/or a reference grid position within the composite image, in several embodiments the SWIS 200 can move or transition to the location of the first/start die within the composite image by (a) determining or confirming a shortest distance (e.g., along a shortest diagonal line) from the reference origin/grid position to the first/start die position; (b) determining or confirming a corresponding predetermined or shortest x-y die position by die position path from the reference origin/grid position to the first/start die position; and (c) stepping along this die position by die position path on an individual die position by die position basis to arrive at the first/start die position. As the SWIS 200 steps to each die position along this path, the SWIS 200 can analyze pixel array information corresponding to each die position to verify whether each expected die position is indeed properly aligned with a die position in the composite image.

In other embodiments, the SWIS 200 can calculate or confirm a number of pixels in the x-direction and a number of pixels in the y-direction between the reference origin/grid position and the first/start die position, and directly move from the reference origin/grid position to the position of the first/start die by shifting an appropriate number of pixels in the x and y directions away from the reference origin/reference grid position within the composite image.

Avoiding Systemic Errors

An important difference between various embodiments of the present disclosure and prior techniques for automated skeleton wafer inspection is that in determining the position of the reference origin or reference grid position and the position of the first/start die, the SWIS 200 does not utilize the same the reference die 21 that was automatically recognized or manually identified/trained by an operator prior to the initiation of die sort operations. The rationale behind this is to avoid repeating any systemic error(s) that may have been made by operator in identifying the wrong die as the reference die 21. If the operator had identified the wrong die as the reference die 21, there would be a systemic shift error in picking. Skeleton wafer inspection operations performed relative to this same incorrectly identified reference die 21 would accordingly not be able to detect or identify any error in die picking. To avoid such a systemic error, the SWIS 200 references another unique set of features on the physical wafer to define the reference origin or reference grid position, relative to which the positions of other die, including the first/start die, internal to the active area within the skeleton wafer's composite image can be determined.

Information for defining or determining the location of a reference origin and/or a reference grid position can be pre-determined for batches of wafers for a given type and size of manufactured device, and saved to a file which can then be retrieved for use in a die sort and skeleton wafer inspection recipe before the start of die sort and skeleton wafer inspection operations, respectively. Alternatively, such information can be input (e.g., by a technician) by way of a menu selection or manual input directed to a graphical user interface.

Information Content Correlation Between Composite Image and PW Map

Following the aforementioned spatial correlation, alignment, or registration, information content correlation occurs, during which the SWIS 200 correlates the information content of (a) image data corresponding to active area die positions within the composite image with (b) information contained in or generated using the PW map (e.g., as updated in accordance with any final visual inspection performed in association with die sort operations) for counterpart die positions. Such information content correlation facilitates or enables the automatic determination of whether die 20 were properly or improperly picked from the physical skeleton wafer's active area during die sort operations.

Within the skeleton wafer's composite image, an array of pixels corresponding to each active area die position provides captured image data (e.g., pixel values) indicating die presence 50 on the physical skeleton wafer 10 or die absence 52 from the physical skeleton wafer 10 at that die position. Each such pixel array has a pixel area that corresponds to the physical size of a die 20 in accordance with the resolution of the SWIS image capture device 220, in a manner readily understood by one of ordinary skill in the relevant art.

In various embodiments, each pixel array within the skeleton wafer's composite image that corresponds to an active area die position is analyzed by way of conventional image processing techniques to determine whether die presence 50 or die absence 52 is indicated at that die position. For instance, die presence 50 can be indicated by a pixel array corresponding to a given active die position having a first average intensity; and die absence 52 can be indicated by the pixel array having a second average intensity that is significantly different than the first average intensity. For a given composite image active area die position under consideration, the result of its pixel array analysis is compared to PW map data for this die position, which contains a code indicating the corresponding physical die 20 should have been picked from the diced wafer 5, or should remain on the skeleton wafer 10. If there is an inconsistency or discrepancy between the composite image pixel array analysis and PW map data for any given active area die position, a picking error has occurred.

More particularly, in some embodiments, for each active area die position within the composite image, the SWIS 200 directly compares a mathematical value corresponding to skeleton wafer composite image pixel array values with the PW map code for that die position, using the PW map that has been updated in accordance with any visual inspection performed during die sort operations. This can involve SWIS generation or population of a skeleton wafer extraction map based upon the composite image pixel array values, in which a digital code corresponding to each active area die position indicates die presence in or absence from the skeleton wafer composite image. In certain embodiments, the SWIS 200 (a) generates or populates a skeleton wafer extraction map corresponding to the diced wafer 5 from the PW map after the sort codes have been designated/selected, prior to actual picking of die 20 from the diced wafer 5; and (b) correlates or compares the mathematical value corresponding to the die position's pixel array in the skeleton wafer composite image, or the skeleton wafer extraction map, with the contents of the skeleton wafer extraction map at a counterpart die position.

Based upon information content correlation between portions of the composite image and the PW map, the SWIS 200 can determine whether (a) die 20 that should have been picked from the diced wafer 5, and hence which should be absent from the skeleton wafer 5, incorrectly remain on the skeleton wafer 10; and/or (b) die 20 that should not have been picked from the diced wafer 5, and hence which should be present on the skeleton wafer 10, are absent from the skeleton wafer 10.

Automated Skeleton Wafer Inspection Processes

Figure 9:
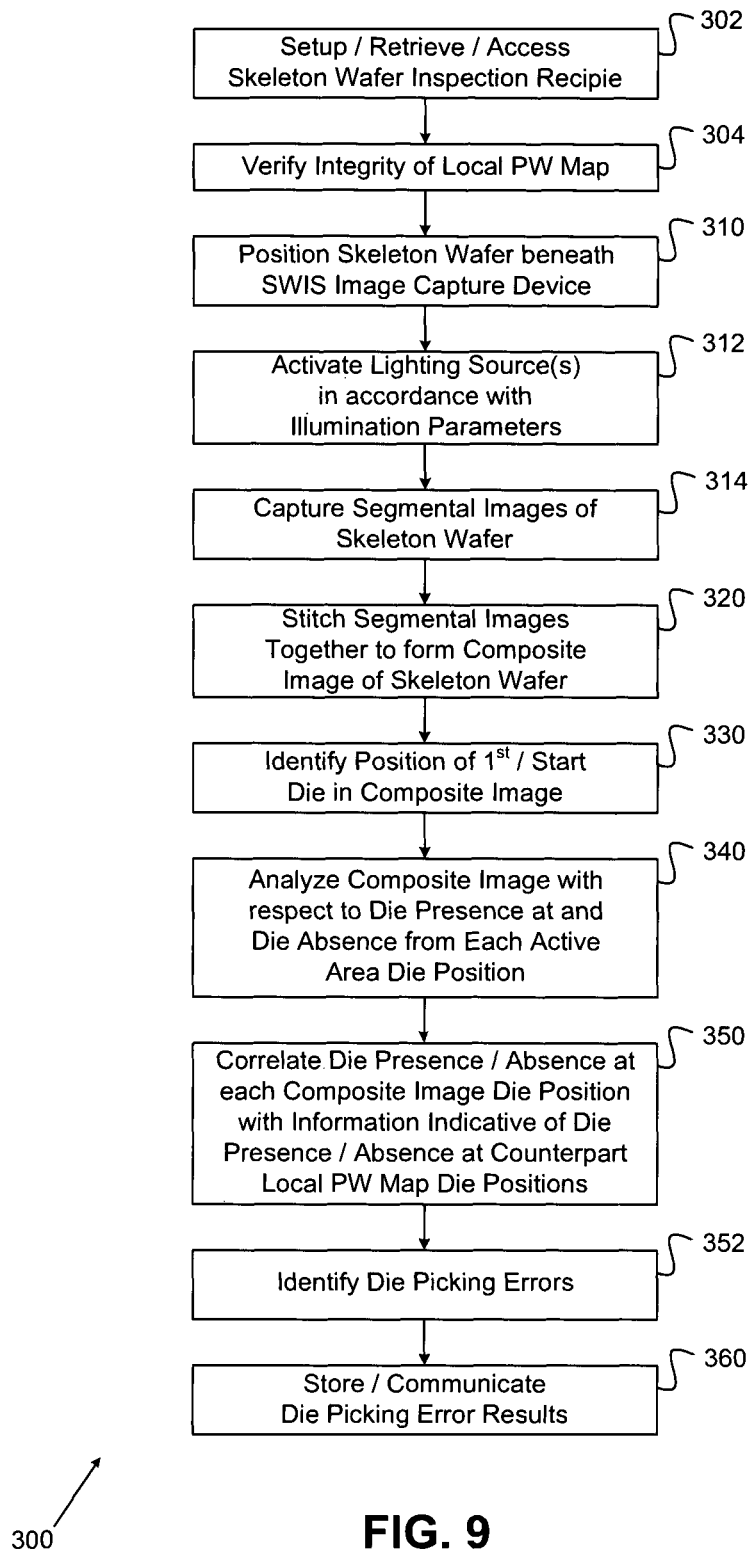
FIG. 9 is a flow diagram of an automated process for automated skeleton wafer inspection in accordance with an embodiment of the present disclosure.

In view of the foregoing, a number of flow diagrams are described hereafter for purpose of detailing skeleton wafer inspection processes in accordance with an embodiment of the present disclosure. FIG. 9 is a flow diagram of an automated process 300 for skeleton wafer inspection; and FIGS. 10A-13 are flow diagrams of related processes directed to aspects of automated skeleton wafer inspection in accordance with particular embodiments of the present disclosure. Particular skeleton wafer inspection operations described in association with FIGS. 9-13 can be performed by an in-line SWIS 200 that operates cooperatively with a die sort apparatus 114 to receive a skeleton wafer by way of a common expansion table 210 that is shared between the die sort apparatus 114 and the SWIS 200; or by a central hub or stand-alone SWIS 200 that has its own expansion table 210 which is separate from that of the die sort apparatus 114.

Representative Setup Operations

In FIG. 9, the general automated process 300 includes a first process portion 302 involving performing skeleton wafer inspection setup operations, which involve the selection, retrieval, or definition of a setup/configuration recipe, such as a composite image generation recipe, a die sort recipe, and/or a skeleton wafer inspection recipe. Accordingly, before the start of the automatic die sort operations for every batch of wafers of the same type of semiconductor devices, an operator typically, in setting up the recipe for the die sort operation, (a) decides what type(s) of die 20 to pick based on the outcome or possible outcome of combinations of electrical test and visual inspection results; and (b) assigns the appropriate sort code(s) for particular outcomes of combinations of electrical test and visual inspection results. The designation of the appropriate sort code(s) determines whether each active area die 20 should (a) be extracted from the diced wafer 5 to a specified sorting destination, resulting in die absence 52 from the skeleton wafer 10; or (b) remain on the skeleton wafer 10 as a stay-behind die 50.

In an embodiment in which the SWIS 200 is implemented in-line with a die sorting and visual inspection system 114, an SWIS setup/configuration procedure can be represented on a graphical user interface (GUI) as a visual object (e.g., an icon) that is selectable by a technician or operator. In response to selection of the SWIS setup/configuration procedure, a software module can be executed by which the technician or operator can select or define a recipe, which can be defined as a composite image generation recipe or a skeleton wafer inspection recipe. Depending on embodiment details, a composite image generation/skeleton wafer inspection recipe can either be a stand-alone recipe, or it can be subsumed within a die sort recipe. Thus, a die sort and skeleton wafer inspection recipe can include information corresponding to a conventional die sort recipe, as well as additional information utilized for generating composite images, which facilitates or enables skeleton wafer inspection. For an in-line SWIS 200 configured for inspecting batches of skeleton wafers following die sort operations, the skeleton wafer inspection recipe should typically be established at the same time as the recipe for die sort operations.

A setup/configuration recipe can include at least some of the following information:
- (a) wafer batch information and ID of each wafer within a batch under consideration;
- (b) physical wafer information such (i) wafer size, (ii) die size; (iii) wafer grid information including the number of horizontal gridlines 30 corresponding to die rows and the number of vertical gridlines 32 corresponding to die columns;
- (c) SWIS image capture device selection:
  - (i). FOV of camera relative to die size, based on image resolution;
  - (ii). extent of segmental image overlap; and
  - (iii). number of segmental images to be captured, given the wafer size and the image capture device FOV and resolution;
- (d) lighting source selection(s) and corresponding illumination parameters;
- (e) reference origin and/or reference grid location definition with respect to the wafer's grid location (e.g., the location of a horizontal reference line, a vertical reference line);
- (f) the coordinates of a first/start die on the physical wafer grid relative to the reference origin and/or the reference grid location;
- (g) predetermined auxiliary reference die locations and/or reference feature locations on a physical reference diced wafer, expressed in terms of relative encoder position offsets or relative (x, y) coordinate offsets with respect to the position of the reference origin, reference grid location, and/or the first/start die on the physical reference diced wafer;
- (h) the absolute and/or relative lengths of an outermost or peripheral set of k gridlines (e.g., 3, 4, or 5 gridlines) at each of the diced wafer's left, right, top, and bottom sides or peripheral borders with respect to its orientation on the film frame 12 during dicing.

Verification of Local PW Map Integrity

Referring again to FIG. 9, in an embodiment, the automated skeleton wafer inspection process 300 includes a second process portion 304 involving verifying the integrity of the local PW map used by the die sort apparatus 114 for visual inspection and sorting operations.

As explained above, the PW Map is data file or dataset containing information on (a) the grid position of each active area die 20 on the physical wafer; (b) the encoded results of electrical testing and visual inspection carried out for each such die 20; and (c) a sort code (destination/bin number) that is assigned based on the outcome of electrical testing and visual inspection results for each die 20. This information is typically stored in accordance with a predetermined data file format or database format, such as within a database on a host server that is remote from the die sort apparatus 114 and the SWIS 200.

Typically, before the start of the die sort operation, a copy of the PW map for each specific wafer within a wafer batch under consideration is retrieved from the host server. This is done by streaming host PW map data from the host server, and rebuilding and storing this information locally on the die sort apparatus as a local PW map. The manner in which this information streamed from the host server is decoded and sequenced in the local PW map is dependent upon a decoding protocol. Normally, there is a stipulated protocol for streaming and sequencing this information from the host server database. In the semiconductor industry, the protocol used for streaming information corresponding to die 20 on wafer (as a string of information) is known as a SECS/GEM (SEMI Equipment Communications Standard/Generic Equipment Model) protocol. However, there are eight variations of this protocol, and each variation affects how the sequenced dataset is arranged within the local PW map. Additionally, not every piece of semiconductor manufacturing equipment conforms to this protocol. When there is a departure from a given protocol or a protocol variant to be used to stream or sequence and decode the host PW map information, the information received would be represented in a manner other than intended; i.e., there would be errors in translation. An error in the use of an incorrect protocol or protocol variant to decode the host PW map information will mean that a number of die 20 and all associated information for each of those die 20 may have been wrongly represented in the local PW map when compared to the actual physical wafer. There will be error in correlation of the grid positions of die 20 represented by the local PW map compared to the physical wafer (and the host PW map).

Two consequences arise from this. First, the pick and place operations carried out based on such an erroneous local PW map may result in the wrong die 20 being picked from the diced wafer 5, and/or updating the inspection results to the wrong die positions in the local PW map. Second, it would not be possible to detect a picking error by simply comparing the physical skeleton wafer 10 with the local PW map because the die sort apparatus 114 would be simply carrying out wrong instructions correctly.

In various embodiments, the SWIS 200 checks the integrity of the local PW map prior to performing further skeleton inspection operations. Alternatively, the die sort apparatus 114 can check the integrity of the local PW map prior to performing die sort operations. That is, depending upon embodiment details, the process of checking the integrity of the local PW map can be performed as part of the SWIS inspection process, or as part of die sort and inspection operations. For purpose of brevity and to aid understanding, the verification of local PW map integrity by the SWIS 200 is described below. However, one of ordinary skill in the relevant art will readily understand the manner in which such integrity checking can be equivalently performed by the die sort apparatus 114 prior to die sort operations, in order to avoid picking errors associated with lack of local PW map integrity.

Figures 10A, 10B:
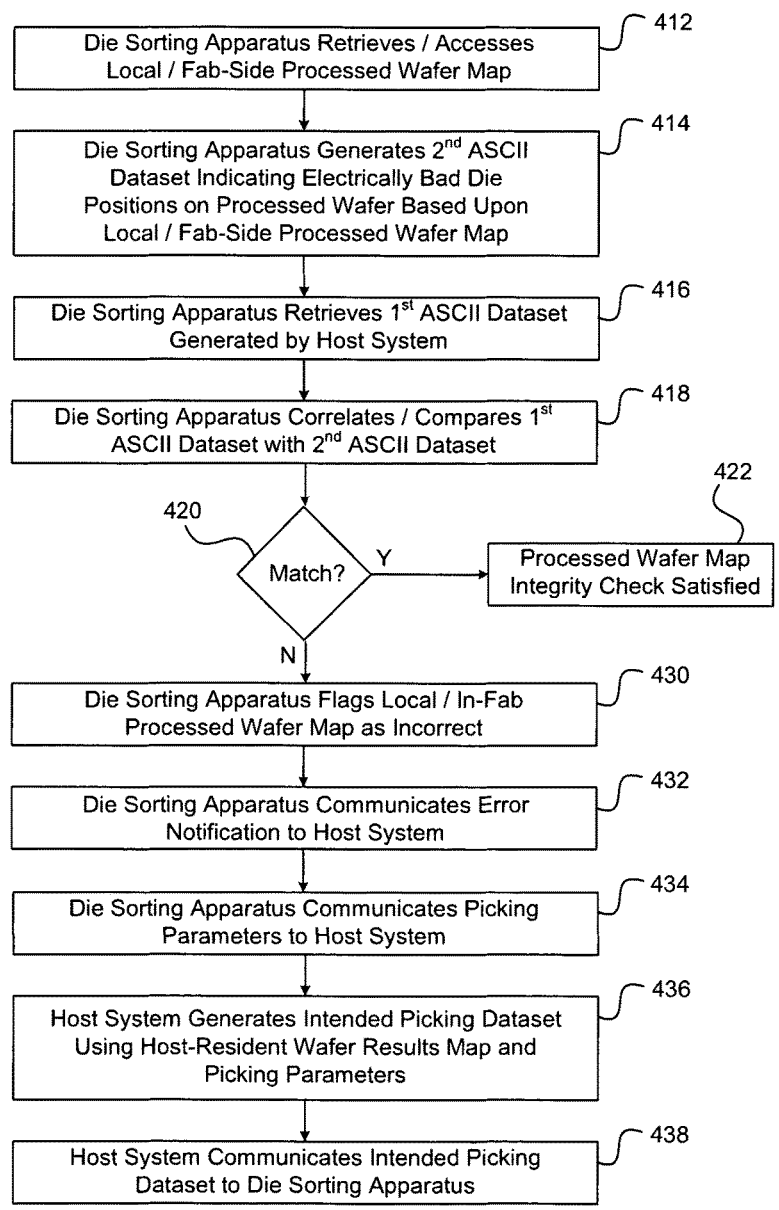
FIGS. 10A and 10B are flow diagrams of representative processes for verifying local PW map integrity in accordance with an embodiment of the present disclosure.

FIG. 10A is a flow diagram of a representative first process 400 carried out by the SWIS 200 for verifying local PW map integrity in accordance with an embodiment of the present disclosure. In a first process portion 402, the host server, based upon its database contents, generates a first dataset in accordance with a standard file format to represent the host PW map. For purpose of simplicity, the first dataset is defined herein as a first ASCII file. Thus, the first ASCII file is representative of the host PW map. In a second process portion 404, the host server stores the first ASCII file in a location that is accessible to the SWIS 200. The first ASCII file indicates the location or grid position of each electrically bad die on the processed wafer or diced wafer 5, in accordance with electrical testing results provided by the host-side wafer results database. Within the first ASCII file, electrically bad die at each position on the processed wafer can be indicated by a numerical or digital coding/value such as "1," and other die positions can be indicated by another numerical or digital coding/value such as "0." The first process 400 additionally includes a second process portion 404 involving the host system storing or communicating the first ASCII dataset to a location, address, or device (e.g., a network drive location) that is accessible to the die sorting apparatus 114.

FIG. 10B is a flow diagram of a representative second process 410 for verifying local PW map integrity in accordance with an embodiment of the present disclosure. The second integrity verification process 410 can be performed by the SWIS 200, without translation between a host-side data format and a die sorting apparatus data format. In various embodiments, the second integrity verification process 410 includes a first process portion 412 involving the SWIS 200 retrieving or accessing a local PW map for the processed wafer under consideration; and a second process step 414 involving generating a second ASCII file. Within the second ASCII file, electrically bad die positions on the processed wafer can be indicated by a numerical or digital code or value such as "1," and other die positions can be indicated by another numerical or digital code or value such as "0." The types of numerical or digital codings/values for electrically bad die positions within the second ASCII file correspond to or match the types of numerical or digital codings/values for electrically bad die positions within the first ASCII file.

The second integrity verification process 410 further includes a third process portion 416 involving the SWIS 200 retrieving the first ASCII file from the location or address at which the host system stored the first ASCII file; a fourth process portion 418 involving the SWIS 200 correlating or comparing data contents of the first ASCII file with the second ASCII file; and a fifth process portion 420 involving the SWIS 200 determining whether the first and second ASCII files match with respect to indicating identical positions for electrically bad die on the processed wafer under consideration. The fourth process portion 418 can involve one or more mathematical operations, such as subtraction of one dataset from another, in a manner readily understood by one of ordinary skill in the relevant art.

If the first and second ASCII files match with respect to indicating coincident die positions for all electrically bad die across the processed wafer under consideration, a sixth process portion 422 involves confirming that the local PW map exhibits integrity with respect to the host PW map, and/or accepting the local PW map such that further operations, including skeleton wafer inspection operations, can occur or continue based upon the local PW map.

In the event that the first ASCII file and second ASCII file do not match in terms of indicating identical die positions for electrically bad die across the processed wafer, the local PW map under consideration is corrupt. The second integrity verification process 410 can correspondingly include a seventh process portion 430 involving the SWIS 200 flagging the local PW map as incorrect, and an eighth process portion 432 involving the SWIS 200 communicating a process map error message or notification to the host system. Depending upon embodiment details, the process map error message can include the second ASCII file, or a reference to a host-accessible location (e.g., a network drive location) at which the second ASCI file resides, such that further error analysis can occur.

The second integrity verification process 410 can also include a ninth process portion 434 involving the SWIS 200 communicating the set of sort codes to the host system; and a tenth process portion 436 involving the host system generating a corrected local PW map based upon the information within the host-side wafer results database for the processed wafer under consideration and the received sort codes. In various embodiments, the corrected local PW map is an ASCII file that indicates for each processed or diced wafer die position whether picking of the die 20 residing at the die position should (a) be avoided, resulting in a stay-behind die 50 on the skeleton wafer 10 at that die position; or (b) occur, resulting in an empty die position 52 on the skeleton wafer 10. Within the corrected local PW map, die locations or grid positions corresponding to electrically good die 20 for which picking should occur can be indicated by a digital code or value, such as "0"; and die locations or grid positions corresponding to electrically bad die 20 for which picking should be avoided can be indicated by another digital code or value, such as "1." Finally, the second integrity verification process 410 further includes an eleventh process portion 438 involving host system communication of the corrected local PW map to the die sorting apparatus 114; or host system storage of corrected local PW map to a location, address, or device accessible to the SWIS 200 and communication of a corresponding message or notification to the SWIS 200.

Segmental Image Capture and Composite Image Generation

The automated skeleton wafer inspection process 300 of FIG. 9 further includes a third process portion 310 involving positioning a skeleton wafer 10 beneath the SWIS image capture device 220. In embodiments in which the SWIS 200 is integrated or in-line with the die sort apparatus 114, the third process portion 310 involves moving the expansion table 210 that the die sort apparatus 114 and the SWIS 200 commonly share to a predetermined position beneath the SWIS image capture device 200, immediately or essentially immediately after the die sort apparatus 114 completes die sort operations. In embodiments in which the SWIS 200 is not in-line with the die sort apparatus 114, the third process portion 310 involves providing at least one skeleton wafer 10 to the SWIS 200, such as by way of a cassette containing film frames 12 on which skeleton wafers 10 reside; transferring a film frame 12 to the SWIS expansion table 210, such as by way of a robotic arm; applying vacuum to the film frame 12; re-stretching the film 11 by a predetermined amount; and displacing the expansion table 210 such that it is disposed at a predetermined position beneath the SWIS image capture device 220.

As indicated by a fourth process portion 312 in FIG. 9, once the expansion table 210 is positioned beneath the swis image capture device 200, the swis image capture device 200 can activate the first and/or second sets of lighting sources 230, 232 in accordance with particular illumination parameters as described above, after which the swis 200 can begin capturing segmental images of the skeleton wafer 10 as the expansion table 210 is displaced in accordance with a predetermined segmental image capture pattern, as indicated by a fifth process portion 314 shown in FIG. 9.

Figure 11A:
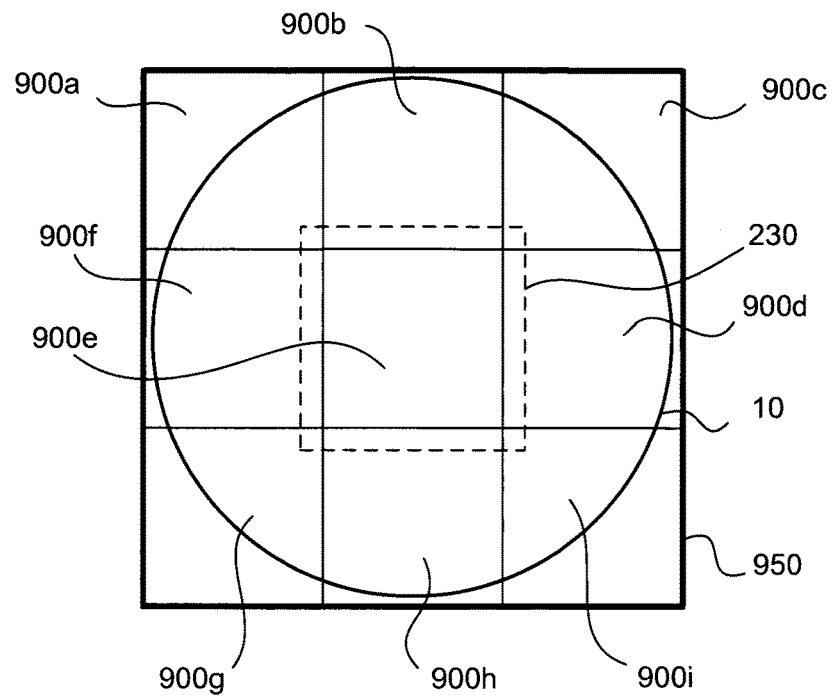
FIGS. 11A and 11B a schematic illustration of a representative manner in which a set of segmental images of a skeleton wafer can be captured in accordance with an embodiment of the present disclosure to facilitate the generation of a composite image.
Figure 11B:
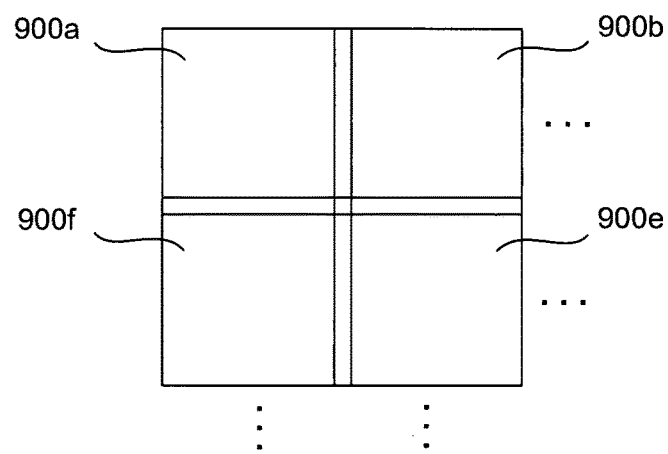

FIGS. 11A-11B are schematic illustrations of a representative manner in which a set of segmental images 900a-i of a skeleton wafer 10 can be captured by the SWIS image capture device 220 in accordance with an embodiment of the present disclosure to facilitate the generation of a composite image 1000. In various embodiments, each segmental image 900a-i corresponds to a particular region or portion of a mathematical or geometric bounding perimeter such as a bounding box 950 that encompasses (e.g., surrounds, and is slightly larger than) the skeleton wafer 10. For instance, each segmental image 900a-i can be correlated with or correspond to a predetermined fraction of the bounding box's area, such as ⅟₃₆, ⅟₂₅, ⅟₁₆, ⅟₉, ¼, or ½ of the bounding box's area in embodiments configured for capturing multiple segmental images 900a-i.

Each segmental image 900a-i includes image data corresponding to a given positioning of the skeleton wafer 10 relative to the SWIS image capture device 220, in a manner readily understood by one of ordinary skill in the relevant art. Depending upon wafer size, die size, and the positioning of the circular/generally circular skeleton wafer 10 relative to the SWIS image capture device 220, each segmental image 900a-i can include image data corresponding to many die 20, for instance, tens/dozens, many tens/dozens, hundreds or several/many hundreds, or more than one thousand die 20. The FOV of the image capture device 220 need only be sufficient to capture each segmental image 900a-i. As indicated in FIG. 11A, the first set of lighting sources 230 is configured to direct illumination across a spatial portion of the diced wafer's underside that is at least as large as, and typically slightly larger than, the predetermined fractional area of the bounding box 950 captured by any segmental image (which corresponds to the SWIS image capture device FOV).

In general, the number of segmental images 900a-i to be captured depends upon a number of factors such as (a) wafer size; (b) die size; (c) the characteristics of SWIS image capture device 200 such as its resolution (which is typically fixed) and FOV range (which is typically adjustable); and (d) the composite image resolution required for accurate and reliable image processing based determination of die presence 50 or die absence 52 at each grid position. In the representative embodiment shown, a total of nine segmental images 900a-i are illustrated, and hence each segmental image 900a-i corresponds to ⅑ of the total area of the bounding box 950. In some embodiments, the set of segmental images 900 is a single image, that is, one captured segmental image itself directly serves as the composite image of the skeleton wafer 10.

Once the SWIS 200 has captured the set of segmental images 900, the SWIS 200 can digitally or algorithmically stitch the segmental images 900 together to form the composite image 1000, as indicated by a sixth process portion 320 in FIG. 9. To facilitate segmental image stitching, in various embodiments each segmental image 900 overlaps its adjacent nearest neighbor segmental images 900 (e.g., above, below and beside the segmental image 900 under consideration) by a predetermined amount. The extent of such overlap depends on how accurately overlapping die features (e.g., die edges) in any two overlapping nearest neighbor segmental images 900 can be recognized by image processing algorithms, such that die features common to these overlapping segmental images 900 can be reliably matched. Typically, the extent of overlap equals or approximately equals one die size, but it is not crucial that the overlap be of this size. It can be smaller if there are sufficient distinctive features on one or more portions of the die 20, such that die edges, borders, structures, or features within one segmental image 900 can be correctly aligned with the same die edges, borders, structures, or features in an overlapping nearest neighbor segmental image 900. The extent of overlap depends on how accurately overlapping pixels corresponding to identical features on the same die 20 can be matched, and in some embodiments segmental image overlap can be less than one die size.

In addition or as an alternative to the foregoing, segmental images 900 can be digitally stitched together using encoder information corresponding to the relative position of the expansion table 210 within the perimeter of the bounding box 950 at the time at which each segmental image 900 is captured. Based upon such encoder information, the SWIS 200 can (a) determine the center of each segmental image 900 and the relative distance traveled between the capture of each segmental image 900, and (b) digitally position and stitch or join together each segmental image 900. Strictly speaking, there is no need for segmental image overlap using this technique. However, for greater precision, in some embodiments the SWIS 200 can digitally stitch segmental images 900 together using a combination of (a) imaging processing algorithms and (b) expansion table encoder information at the time of each segmental image's capture. In such embodiments, the extent of overlap between segmental images 900 can be reduced.

Representative Composite Image Generation Process

Figure 12:
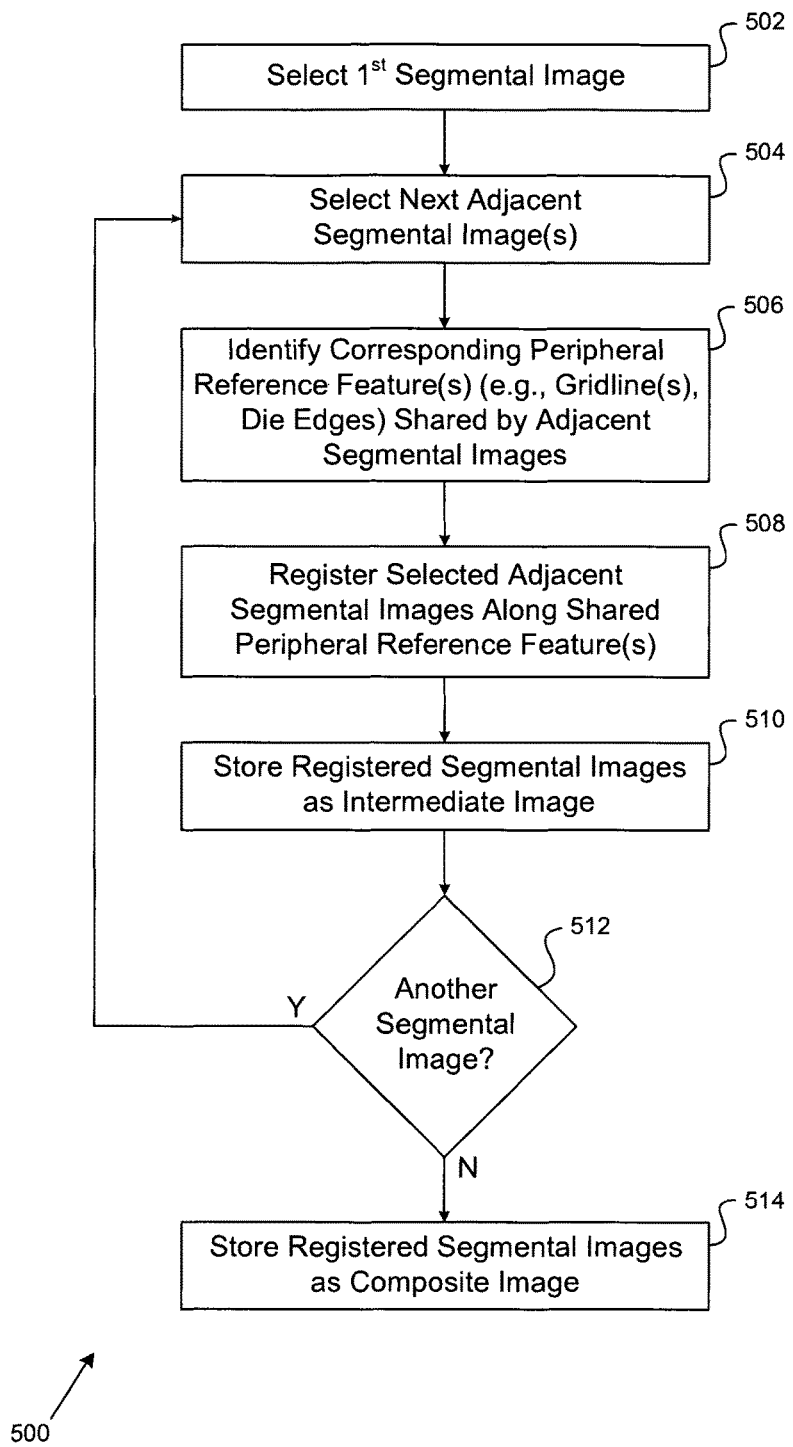
FIG. 12 is a flow diagram of a representative process for generating a composite image from a set of segmental images in accordance with an embodiment of the present disclosure.

FIG. 12 is a flow diagram of a representative composite image generation process 500 in accordance with an embodiment of the present disclosure. In an embodiment, the composite image generation process 500 includes a first process portion 502 involving selecting a first segmental image 900a, and a second process portion 504 involving selecting one or more additional segmental images 900b,f that are adjacent to the first segmental image. A third process portion 506 involves identifying by way of image processing operations peripheral reference features such as gridlines and/or die edges or borders (e.g., multiple die edges along a segment of a die column or row) shared by adjacent segmental images 900a,b,f. A fourth process portion 508 involves digitally registering or aligning the adjacent segmental images 900a,b,f under consideration along their shared or common peripheral reference features. A fifth process portion 510 involves storing the registered set of segmental images 900a,b,f as an intermediate image, and a sixth process portion 512 involves determining whether additional segmental images require analysis and registration/alignment with respect to the intermediate image. If so, the composite image generation process 500 returns to the second process portion 504 to select one or more other segmental images 900 that are nearest neighbors or adjacent with respect to the intermediate image, such that one or more additional segmental images 900 can be aligned with and incorporated into the intermediate image. Once a set of segmental images 900 spanning the entire diced wafer or skeleton wafer surface area has been considered, the composite image generation process 500 designates or stores the most current intermediate image as a composite image.

After stitching together the segmental images 900, an accurate composite image 1000 of the entire skeleton wafer 10 is formed, which accurately depicts the relative position of every stay behind die 50 and every empty die position 52 on the skeleton wafer 10.

Locating the First/Start Die within the Composite Image

In various embodiments, before pixel areas within the composite image 1000 can be analyzed with respect to local PW map information for counterpart die positions, the SWIS 200 first determines a predetermined pixel location or area within the composite image pixel area that represents the first/start die. Thus, with reference again to FIG. 9, the process 300 includes a seventh process portion 330 involving identifying the position or location of the first/start die within the composite image.

A predetermined first/start die pixel location can correspond to the center of the first/start die, or a given corner of the first/start die. This predetermined pixel location can be determined in one or more manners described above, such as through the use of image processing techniques to digitally (a) identify a reference origin (e.g., corresponding to the center of the skeleton wafer 10, or the intersection of a horizontal reference line and a vertical reference line) within the composite image 1000, and determine the predetermined position of the first/start die relative to the reference origin; and/or (b) reconstruct the skeleton wafer's grid layout and identify a reference grid location/position based upon this reconstruction, and determine the predetermined position of the first/start die relative to the reference grid location/position.

Analyzing the Composite Image and Identifying Die Picking Errors

Once the pixel location of the first/start die within the composite image 1000 is determined, the SWIS 200 can analyze pixel areas corresponding to each active area die position within the composite image 1000, as indicated by an eighth process portion 340 in FIG. 9. Based upon this analysis, the SWIS 200 can determine for each such die position whether the composite image indicates die presence 50 on or die absence 52 from the skeleton wafer 10. In various embodiments, in association with the analysis of the pixel area for each active area die position, the SWIS 200 populates a skeleton wafer extraction map with a die presence or die absence indicator or code. The skeleton wafer extraction map thus indicates or encodes for each active area die position whether a stay-behind die 50 is present on the skeleton wafer 10, or that die position is empty 52. The skeleton wafer extraction map can be, for instance, a data file such as an ASCII file that is organized in accordance with a predetermined format, such that information content therein can be efficiently correlated or compared with information in the local PW map.

After the SWIS 200 populates the skeleton wafer extraction map with die presence and die absence indicators for each active area die position, the SWIS 200 can correlate or compare the skeleton wafer extraction map with local PW map data for such die positions to determine whether a die picking error occurred at any of these die positions, as indicated by a ninth and a tenth process portion 350, 352 in FIG. 9.

Figure 13:
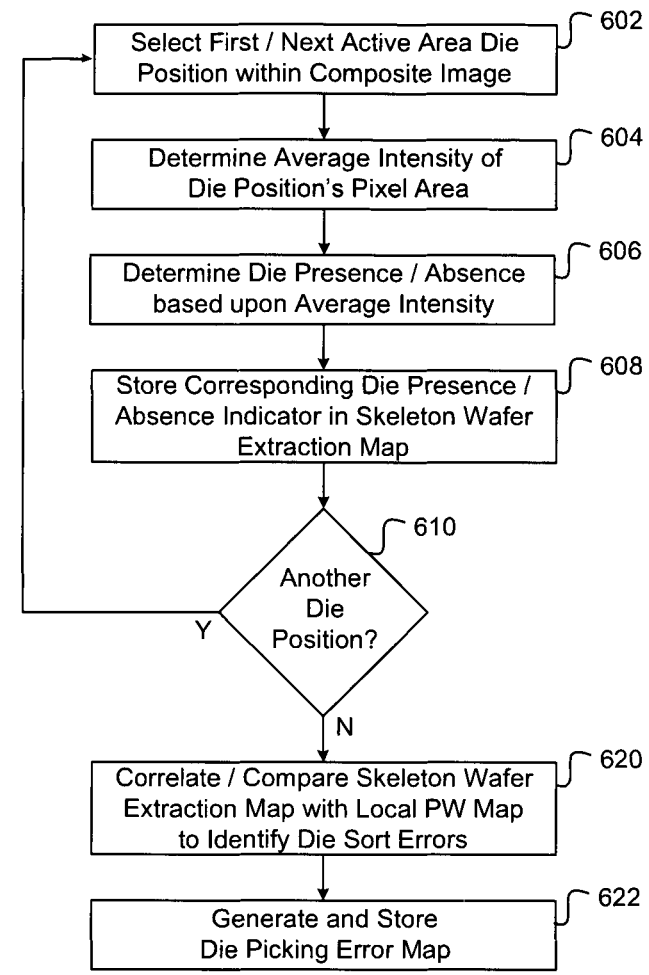
FIG. 13 is a flow diagram of a representative process for populating a skeleton wafer extraction map and identifying die picking errors in accordance with an embodiment of the present disclosure.

FIG. 13 is a flow diagram of a representative process 600 for populating a skeleton wafer extraction map and identifying die picking errors in accordance with an embodiment of the present disclosure. In an embodiment, the process 600 includes a first process portion 602 involving selecting the first/start die position or a next/successive die position (e.g., an immediately adjacent die position) within the composite image 1000. Selection of the first/start die position can include selecting a known pixel position within the composite image pixel area that represents the first/start die, such as a pixel position corresponding to the center of the first/start die, or a predetermined corner of the start die. Selection of a next/successive die position can include moving or shifting a predetermined image space die separation distance, i.e., a predetermined number of pixels, away from a current or most recent composite image die position, in a direction that corresponds to the manner in which active area die positions are (a) physically organized on the wafer, and (b) sequenced or ordered within the local pw map.

In general, the predetermined pixel distance that defines the inter-die separation in image space corresponds to the physical die size and the physical width of the skeleton wafer's dicing grooves or gridlines 30, 32, in accordance with the wafer's physical layout, the extent to which the film 11 carrying the diced wafer 5 was stretched, and the resolution of the SWIS image capture device 220. As will be readily understood by one having ordinary skill in the relevant art, the physical width of the skeleton wafer's dicing grooves or gridlines 30, 32 is greater than that of the unsawn wafer's gridlines 30, 32 due to the stretching of the film 11. In various embodiments, the width in pixels of the skeleton wafer's gridlines 30, 32 can be determined by conventional image processing techniques, for instance, in association with determination of the pixel location of the first/start die within the composite image 1000.

The process 600 includes a second process portion 604 involving analyzing the intensities of pixels within the pixel area corresponding to the currently selected die position, and mathematically determining an average, median, or other statistically based intensity for the pixels within this pixel area. A third process portion 606 involves determining whether die presence 50 or die absence 52 is indicated for the current die position based upon this mathematically determined intensity. As indicated above, die presence 50 will correspond to a first average intensity, and die absence 52 will correspond to a second average intensity that is significantly different than (e.g., greater than) the first average intensity.

A fourth process portion 608 involves storing a die presence indicator or a die absence indicator at a skeleton wafer extraction map location corresponding to the die position under consideration. To further aid understanding, reference is again made to FIGS. 7A and 7B, as well as FIG. 7C. As indicated above, FIG. 7A shows a representative composite image 1000 of a skeleton wafer 10; and FIG. 7B shows a magnified portion 1002 of the skeleton wafer composite image 1000, which corresponds to a 2×7 array of skeleton wafer grid positions that are delineated from each other by horizontal and vertical gridlines 30, 32. FIG. 7C indicates representative digital encodings within portions of a representative skeleton wafer extraction map 1100 corresponding to the magnified portion 1002 of the composite image 1000.

More particularly, in the magnified portion 1002 of the composite image 1000, a total of five composite image grid positions indicate die presence 50; and a total of nine composite grid positions indicate die absence 52. Correspondingly, for any set of data fields within a skeleton wafer extraction map 1100 corresponding to particular composite image grid positions, die presence 50 is indicated by way of a digital code or value such as a "1"; and die absence 52 is analogously indicated by way of another digital code or value such as a "0." Thus, for each grid position in the magnified portion 1002 of the composite image 1000 that contains a stay-behind die 50, the skeleton wafer extraction map 1100 represents the stay-behind die 50 at this grid position by way of a digital "1." Similarly, for each grid position within the magnified portion 1002 of the composite image 1000 that is empty 52, the skeleton wafer extraction map 1100 represents this empty die position 52 by way of a digital "0."

Referring again to FIG. 13, a fifth process portion 610 involves determining whether each active area die position within the composite image 1000 has been considered and analyzed with respect to die presence 50 or die absence 52. If not, the process 600 returns to the first process portion 602.

Once each active area die position has been considered, the process 600 includes a sixth process portion 620 that involves correlating or comparing the die presence and die absence indicators in the skeleton wafer extraction map 1100 with local PW map data for counterpart die positions, to thereby determine whether die picking errors occurred. For any given active area die position, a discrepancy between the die presence or absence indictor in the skeleton wafer extraction map 1100 and local PW map data indicating die presence or absence at that die position means that a die picking error has occurred. The process 600 can further include a seventh process portion 622 involving generating and storing a die picking/extraction error map that identifies or encodes at which skeleton wafer die positions die picking errors have occurred. In various embodiments, the die extraction error map provides for the entire skeleton wafer 10 a set of digital encodings that indicate (a) each grid position from which a die 20 that was to be extracted from the diced wafer 5 incorrectly remains on the skeleton wafer 10; and (b) each grid position at which a stay-behind 50 should remain, but is missing.

In some embodiments, the sixth process portion 620 involves comparing the die presence/absence indicator for each die position in the skeleton wafer extraction map with local PW map data corresponding to counterpart die positions. Based upon this comparison, the SWIS 200 can generate the die picking error map. In other embodiments, the SWIS 200 can generate an intended extraction map directly from the local PW map data itself, where the intended extraction map indicates intended die presence 50 and intended die absence 52 based upon the local PW map data, in accordance with the same encoding scheme (i.e., the same die presence and die absence indicators) as that used by the skeleton wafer extraction map 1100. In such embodiments, the SWIS 200 can determine whether die picking errors have occurred by simply subtracting the skeleton wafer extraction map 1100 from the intended extraction map (or vice versa) to thereby generate the die picking error map. After such subtraction, any non-zero result at any die position within the die picking error map indicates that a die picking error occurred for that die position.

Referring again to FIG. 9, the process 300 can include an eleventh process portion 360 involving communicating die picking error information, such as the die picking error map, to one or more other destinations or systems; and/or storing the die picking error map (e.g., as a data file on a local or network drive), for instance, in a location that is accessible to another apparatus or system. The storage or communication of die extraction error map data or die absence error indicators can facilitate die sorting error remediation operations, such as the retrieval of electrically bad die 24 and/or electrically good yet visually unacceptable die 25 from a tape reel or other destination that is intended to contain only electrically good and visually acceptable die 26.

Embodiments in accordance with the present disclosure can inspect 100% of a skeleton wafer 10 in a highly time-efficient manner. For instance, in a representative implementation, the automated inspection of 100% of an 8-inch skeleton wafer 10 having 1×1 mm$^2$ die to identify skeleton wafer die presence/die absence errors can be performed in less than approximately 3 minutes. Furthermore, embodiments in accordance with the present disclosure can automatically inspect 100% of a skeleton wafer 10 and identify corresponding die presence/die absence errors without significantly affecting manufacturing throughput (e.g., in a manner that has minimal, negligible, nearly zero, or essentially/effectively zero impact on manufacturing throughput).

Automated Inspection of Skeleton Strips or Panels

Figure 14A:
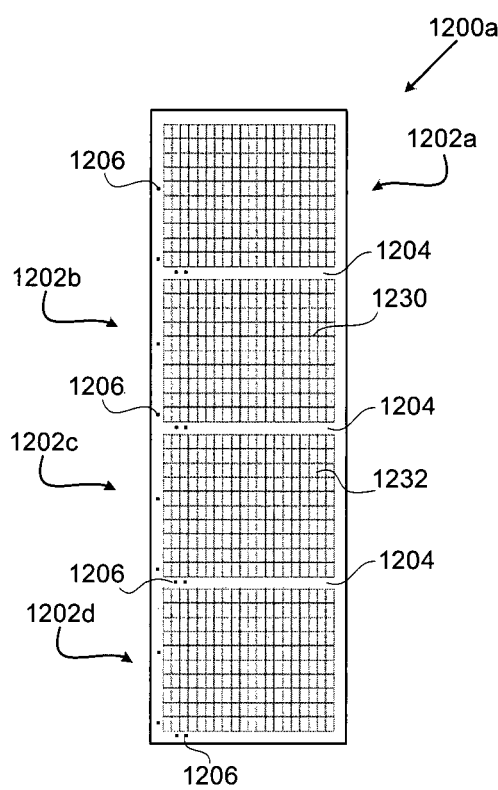
FIGS. 14A-14G are representative illustrations of components on strips and skeleton strips carried by film frames, where such skeleton strips can be automatically inspected for component picking errors in accordance with embodiments of the present disclosure.
Figure 14B:
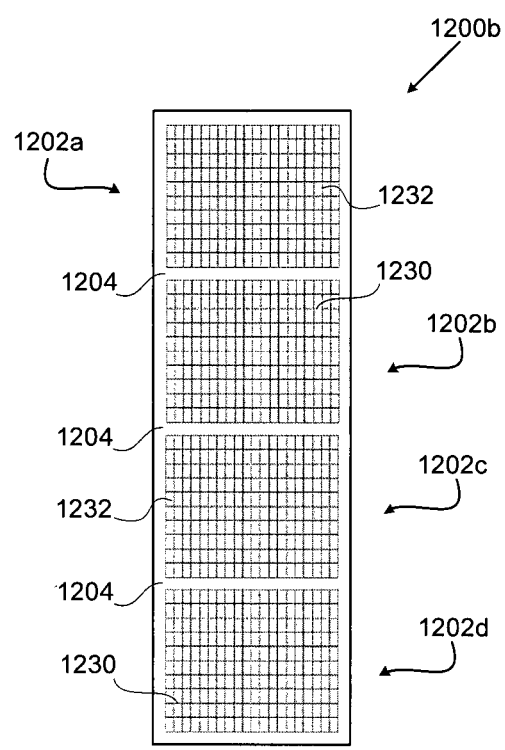

In multiple semiconductor manufacturing situations, components or devices can be carried, supported, or held by a substrate other than a wafer, and the SIS/SWIS 200 can perform skeleton inspection operations directed to verifying correct removal of components from such a substrate. For instance, as depicted in FIGS. 14A and 14B, components 1220 (e.g., bumped die 20) can be carried, supported, or retained by thin flexible strips or panels 1200a,b. Each strip 1200a,b includes a number of distinct or distinguishable strip sections 1202a-d that are separated by gaps 1204. Each strip section 1202a-d provides a plurality of grid positions at which components 1220 can reside. The grid positions within each strip section 1202a-d are delineated from each other by horizontal and vertical grid lines 1230, 1232, in a manner readily understood by one of ordinary skill in the relevant art. Different types of strips 1200a,b exist, including (a) strips 1200a having holes, openings, or reference marks 1206 formed or punched at particular locations along their peripheries or outer borders; and (b) strips 1200b that lack such peripheral holes, openings, or reference marks 1206.

Figure 14C:
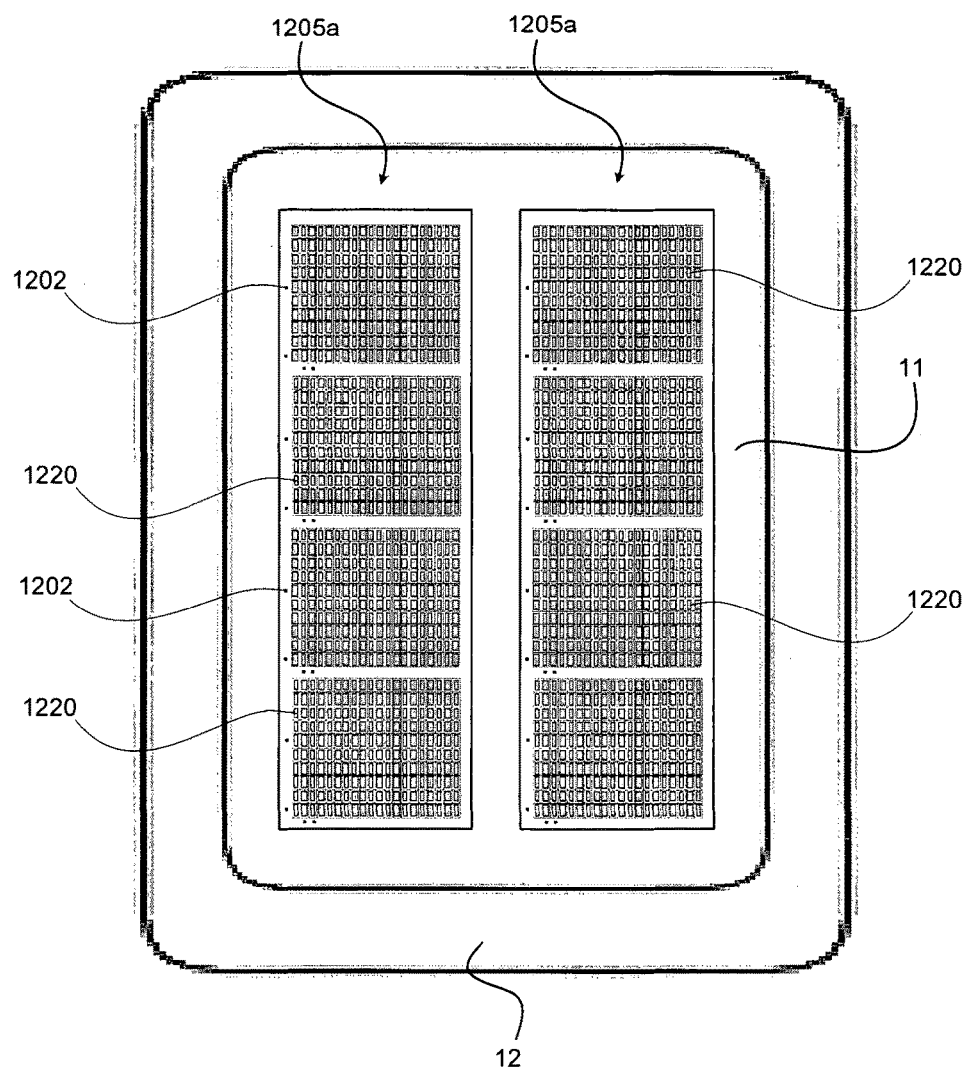
Figure 14D:
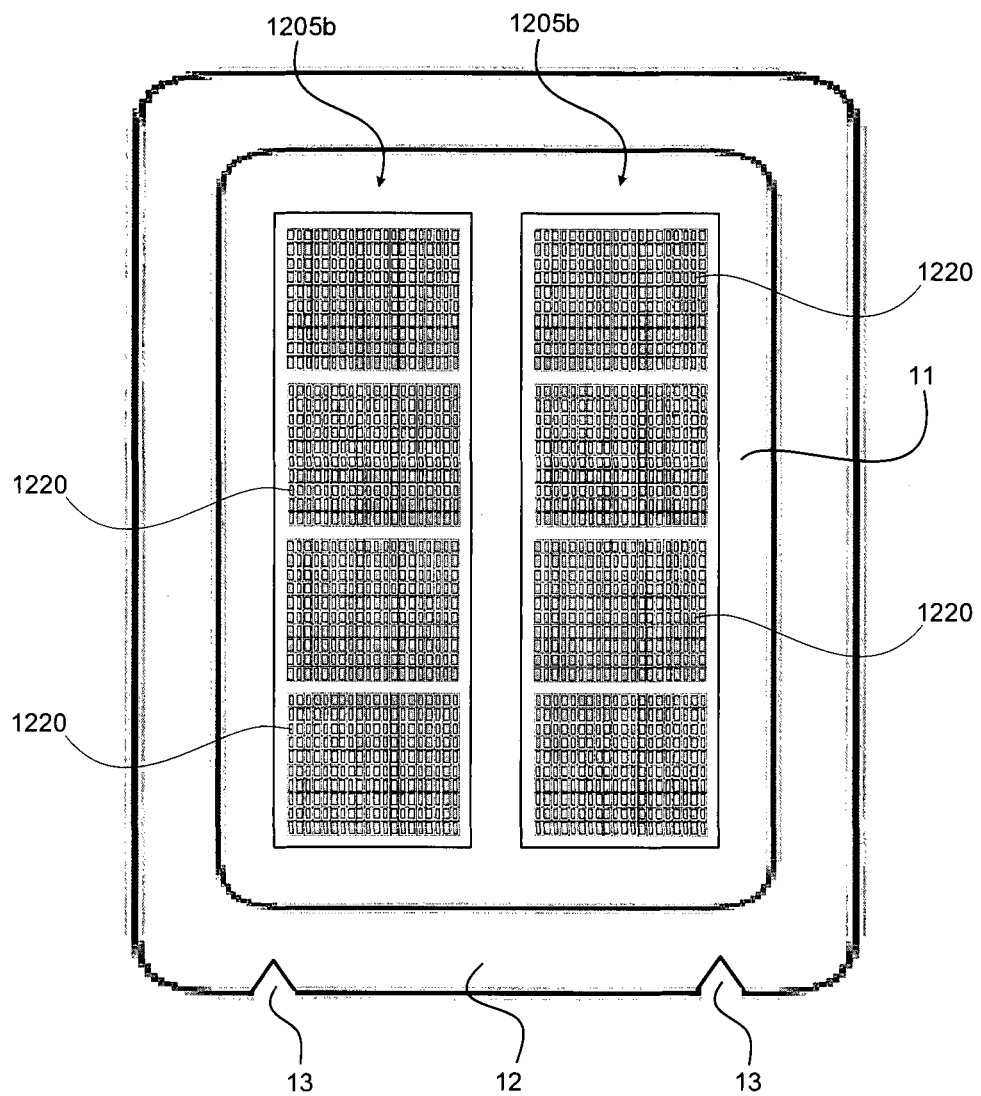

One or more strips 1200a,b and components 1220 carried, supported, or held thereby can be mounted to a film frame 12 in a manner essentially identical or analogous to that for wafers, such that an adhesive film 11 supports the strip 1200a,b and its components 1220, as illustrated in FIGS. 14C and 14D. Strips can correspondingly be diced or sawn along the horizontal and vertical gridlines 1230, 1232 within each strip section 1202a-d. Dicing or sawing within the gaps 1204 between each strip section 1202a-d can be avoided. As in the case of diced wafers 5 mounted on film frames 12, after strip dicing or sawing, dicing grooves 34 will partially extend into the depth of the adhesive film 11 along the horizontal and vertical gridlines 1230, 1232 within each strip section 1202a-d.

In the event that the diced strip 1205a includes reference holes 1206, the film frame 12 on which the diced strip 1205a is mounted need not have notches or other reference features, as image processing based determination of the orientation of the diced strip 1205a relative to the film frame 12, and hence determination of the orientation of components 1220 relative to the film frame 12, can occur in association with image processing based identification of the strip's reference holes 1206. If the diced strip 1205b lacks reference holes 1206, the film frame 12 can include a number of notches 13 and/or other reference features that facilitate image processing based determination of the orientation of the each strip's components 1220 relative to the film frame 12.

Each diced strip 1205 has a corresponding process map in a manner analogous to that indicated above for processed wafers, where the strip's process map indicates electrical testing and visual inspection results for the components 1220 within each strip section 1202a-d of the diced strip 1205. Either of a process map corresponding to a strip 1205 and a PW map corresponding to a wafer can be referred to as a process map, component process map, processed components map, or processed die(s) map, in a manner readily understood by on having ordinary skill in the relevant art.

An active component area can be defined an area of a strip 1200 that carries components, and from which components are to be selectively removed in association with a set of component sorting operations (e.g., die sort operations). Each strip section 1202 or a portion thereof can be defined as an active component area. The active component area corresponds to the component process map, in a manner essentially identical or analogous to that described above for the PW map. The location of a first/start component in a given strip section 1202 is typically defined as a predetermined corner grid position (e.g., an upper left grid position) thereon; however, a first/start component location can alternatively be defined as another grid position.

Figure 14E:
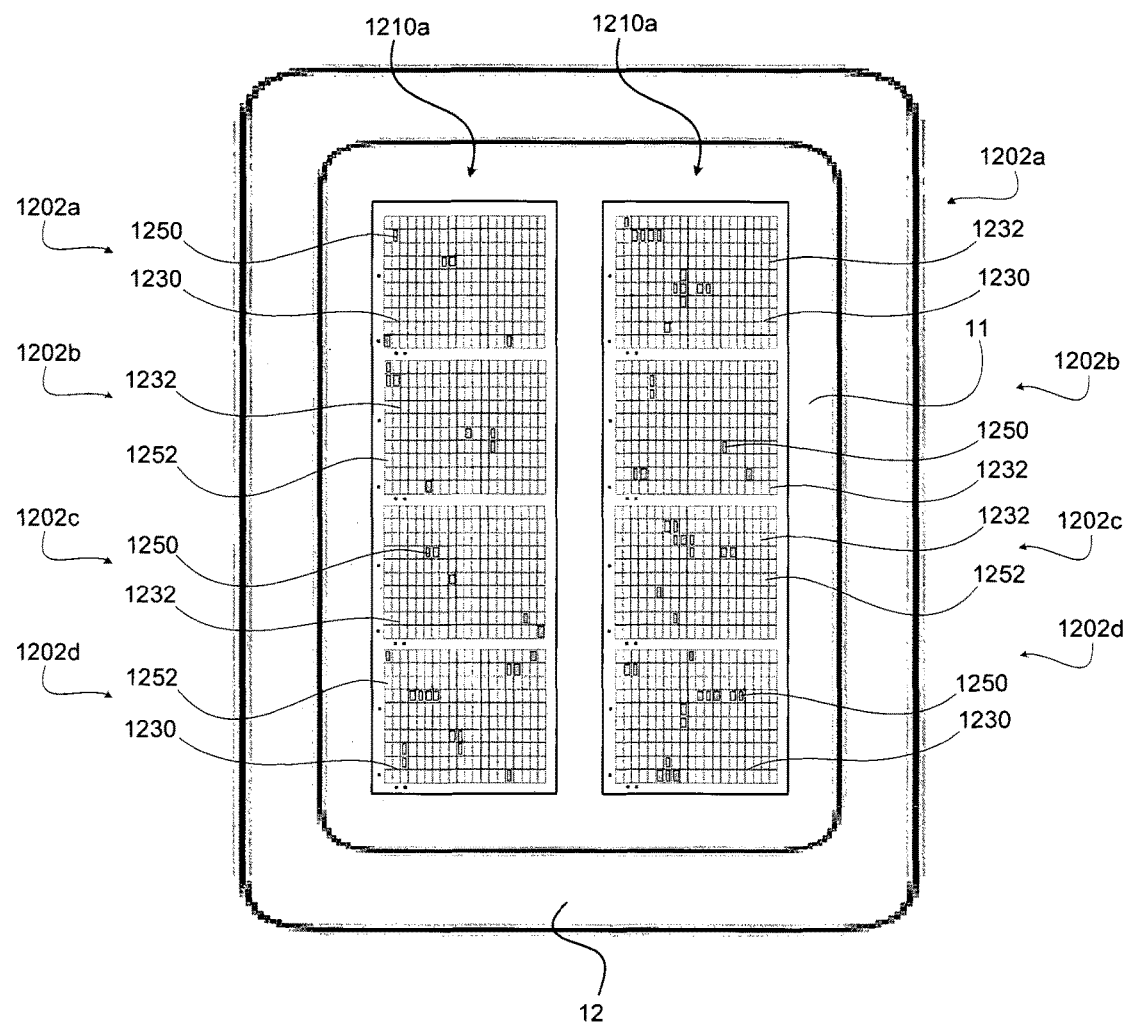

Following component sorting operations (e.g., die sort operations) involving the selective removal or picking of components 1220 from a diced strip 1205, the diced strip 1205 has a "skeletonized" appearance, and can be referred to as a skeleton strip 1210, as shown in FIG. 14E. In FIG. 14E, component absence or empty grid positions 1252 within each strip section 1202a-d are indicated by blank or unshaded areas, and component presence or stay-behind components 1250 are indicated by shaded areas.

Figure 14F:
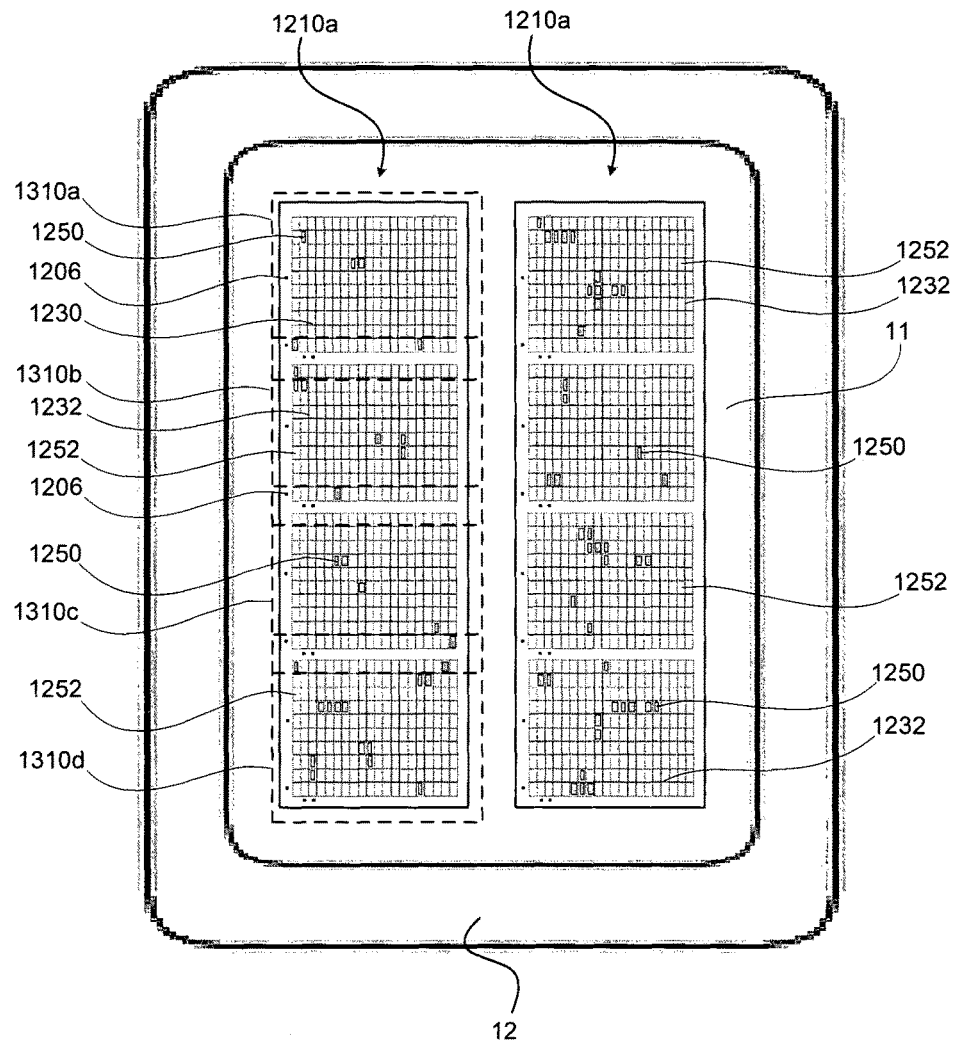

Various embodiments in accordance with the present disclosure can perform automated inspection of skeleton strips 1210 to verify whether components 1220 have been correctly picked therefrom, in a manner essentially identical, substantially analogous, or generally analogous to that for skeleton wafers 10 as described above. More particularly, after completion of component sorting operations, segmental images 1310 of a skeleton strip 1210 under consideration can be captured, in a manner indicated in FIG. 14F. During the capture of segmental images 1310a-d of a given skeleton strip 1210, the skeleton strip 1210 is positioned relative to the SWIS image capture device FOV such that the SWIS image capture device 220 captures a segmental image 1310a-d spanning a portion or fraction of the skeleton strip's overall surface area, and in particular, spanning a portion or fraction of the skeleton strip's active component area. In the representative embodiment shown in FIG. 14F, a total of four segmental images 1310a-d are captured, each of which corresponds to a spatial area that is larger than the area of a single strip section 1202a-d. One of ordinary skill in the relevant art will readily understand that in view of the description above, additional or fewer segmental images 1310 could be captured in other embodiments, depending upon strip geometry (i.e., length and/or width), SWIS image capture device FOV, and/or component/die size. Thus, in other embodiments, an individual segmental image 1310 could capture a fraction (e.g., ½, ⅓, ¼, ⅕, etc. . . . ) of a strip section 1202a-d, or more than one strip section 1202a-d.

During the capture of segmental images of the skeleton strip 1210, illumination can be directed from beneath the film frame 12 and skeleton strip 1210 mounted thereon, toward the SWIS image capture device 220. Illumination can additionally or alternatively be directed from above the film frame 12 toward the skeleton strip 1210 mounted on the film frame 12, such that the illumination can be reflected from exposed surfaces of the components 1250 thereon toward the SWIS image capture device 220.

In a manner substantially identical or analogous to that described above, the captured segmental images 1310a-d are stitched together to form a composite image; and a first/start component position (e.g., corresponding to a predetermined corner grid position, such as the upper left corner grid position) within each strip section 1202a-d of the skeleton strip 1210 can be determined within the composite image. Prior to or in association with determining the first/start component position, a reference origin or grid position can also analogously be determined. Automated skeleton strip analysis operations can occur for each strip section 1202a-d. During such operations, the SWIS 200 determines by way of image processing based analysis of pixel arrays within the skeleton strip composite image whether component presence 1250 or component absence 1252 is indicated at each grid position within a strip section 1202a-d under consideration, beginning with the first/start component position in the strip section 1202a-d. The SWIS 200 can additionally generate a strip extraction map for the strip section 1202a-d or the skeleton strip 1210, in a manner analogous to that described above. Finally, after the strip extraction map has been generated, the SWIS 200 can correlate or compare the strip extraction map with the strip's process map, and generate an extraction error map corresponding to the skeleton strip 1210 under consideration, in a manner analogous to that described above. An extraction error dataset can be communicated to one or more other systems or apparatuses to facilitate picking error remediation operations.

In certain embodiments in which the SWIS 200 is integrated in-line with a component sorting apparatus 115, the SWIS 200 can generate multiple skeleton strip composite images, where each individual composite image corresponds to a predetermined subset of strip sections 1202 (e.g., 1 or 2 strip sections 1202) on a skeleton strip 1210 under consideration. For instance, a first skeleton strip composite image can correspond to the first strip section 1202a; a second skeleton strip composite image can correspond to the second strip section 1202b; and so on. In such an embodiment, each composite image could be a single segmental image 1310a-d, depending, upon strip geometry relative to the FOV of the SWIS image capture device 220. Once component sorting for a given strip section 1202a is complete, the SWIS image capture device 220 can capture a set of segmental images (e.g., 1 segmental image, or possibly more than 1 segmental image) and generate a composite image corresponding to this most recently created skeleton strip section 1202a, during or after which component sorting operations for another/next diced strip section 1202b can immediately occur. As a parallel computing process concurrent with component sorting operations on this next diced strip section 1202b, the SWIS 200 can analyze the most recently generated composite image corresponding to the most recently created skeleton strip section 1202a to determine, with reference to the appropriate portions of the component process map, whether components 1220 were correctly or incorrectly picked from this skeleton strip section 1202a. Thus, the SWIS 200 can determine whether a picking error has occurred in a previously picked strip section 1202a while component sorting operations directed to another strip section 1202b-d are underway, that is, before component sorting operations directed to each other strip section 1202b-d are complete, such that remedial action can be more immediately taken.

In addition or as an alternative to the foregoing, the SWIS 200 can generate and analyze a composite image corresponding to one skeleton strip 1210a carried by the film frame 12 while component sorting operations directed to a next diced strip 1210b carried by this same film frame 12 occur (e.g., as a parallel computing process).

Figure 14G:
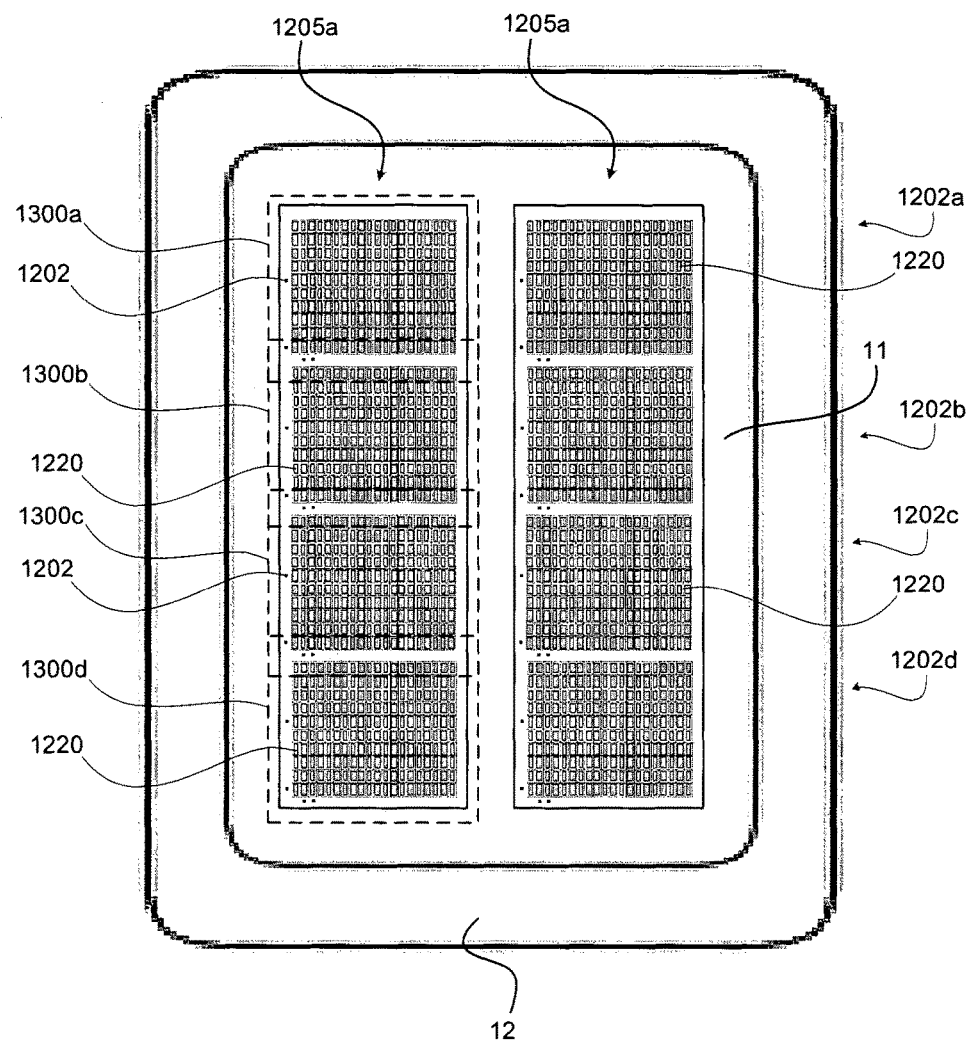

In a number of embodiments the SWIS 200, in addition to generating one or more composite images corresponding to a skeleton strip 1210, the SWIS 200 can generate one or more composite images of a diced strip 1205 (e.g., a composite image of the fully or essentially fully populated diced strip 1205) prior to the initiation of die picking operations. The capture of segmental images 1300a-d for purpose of generating one or more diced strip composite images is indicated in FIG. 14G. Such segmental images 1300a-d can be digitally stitched together to form a diced strip composite image, in a manner analogous to that described above. As for a diced wafer composite image, a diced strip composite image can be used to enhanced the accuracy of determining or recognizing a reference origin and/or a start component position in a skeleton strip composite image; and/or as a navigation aid or tool in association with one or more component sorting related procedures.

Diced Wafer Composite Image as a Navigational Aid/Tool

A diced wafer composite image inherently includes and accurately encodes the position of each active area die 20 on the diced wafer 5, and hence also represents or encodes the location of each grid position on the skeleton wafer 10. The diced wafer composite image can thus be used for purpose of facilitating accurate identification of and/or efficient navigation (e.g., direct navigation) to or within the boundaries of any or each active area die position (a) within the skeleton wafer composite image, and/or (b) on the physical diced wafer 5 or the physical skeleton wafer 10.

For instance, while die sort operations are occurring on a diced wafer 5, the die sort apparatus 115 can communicate the diced wafer positions of one or more die 20, or each die 20, considered by the pick and place apparatus to the SWIS 200. Such diced wafer die positions can be expressed as relative coordinates (e.g., relative row/column coordinates, referenced to a (0, 0) grid position of the first/start die) or die sort encoder positions/physical space coordinates corresponding to the die 20. The SWIS 200 can then correlate, track, monitor, match, or map image space die locations within a given diced wafer composite image, or calculated expected encoder positions corresponding to each active area grid position in this diced wafer composite image, with counterpart die positions 20 considered by the die sort apparatus 115, for instance, on a real time or near-real time basis during die sort operations.

In a number of embodiments, based upon a diced wafer composite image and a predetermined image space to physical space conversion factor, for any given die or gird position in the diced wafer composite image, the SWIS 200 can calculate an expected relative physical space (x, y) position or coordinate set, or a relative encoder position offset correlated with or corresponding to the position of its counterpart die/grid position on the physical diced wafer 5, referenced to the position of the first/start die. An image space to physical space conversion factor can depend upon image capture device resolution, and an expected relative encoder position offset can depend upon encoder specifications, in a manner readily understood by one having ordinary skill in the relevant art. In some embodiments, the SWIS 200 calculates an expected relative physical space (x, y) position or coordinate set, or an expected relative encoder position offset, corresponding to each die/grid position on the diced wafer 5; and stores such calculated information in a relative encoder position map prior to initiation of die sort operations on the diced wafer 5.

If the die sort apparatus 115 needs to move from a current die position across one or multiple die or grid positions on a diced wafer 5 to arrive at a specific target die or grid position during or after die sort operations, the die sort apparatus 115 can communicate the target die/grid position to the SWIS 200, and the SWIS 200 can determine or calculate an appropriate expected relative physical space (x, y) position or expected relative encoder position offset corresponding to the target die/grid position on the physical diced wafer 5, and communicate this information to the die sort apparatus 115. The die sort apparatus 115 can utilize this expected relative physical space (x, y) position or expected relative encoder position offset to generate a set of updated encoder positions. Consequently, the expansion table 210 and the die sort apparatus 115 can be moved relative to each other in accordance with the set of updated encoder positions such that the die sort apparatus 115 directly can directly navigate to or within the borders of the target die/grid position (e.g., within approximately +/−10%-30%, or approximately +/−20%, of the center of the target die/grid position, relative to the size of the target die/grid position). Thus, in accordance with a number of embodiments of the present disclosure, the die sort apparatus 115 need not navigate across multiple grid positions on a next nearest die to next nearest die basis, which saves significant amounts of time, correspondingly increases throughput, and significantly reduces or minimizes the likelihood of indexing or position translation errors. After such direct navigation, the specific position of the die 20 residing at the target die/grid position on the diced wafer 5 can be verified by the die sort apparatus imaging system, such that the positioning of the pick and place apparatus relative to this die 20 can be precisely established.

One having ordinary skill in the relevant art will understand that depending upon whether (a) the expansion table 210 is moved/movable while the pick and place apparatus remains stationary, or (b) the pick and place apparatus is moved/movable while the expansion table 210 remains stationary, the aforementioned encoder positions or updated encoder positions can correspond or apply to movement of the expansion table 210 or movement of the pick and place apparatus.

The diced wafer composite image for a first diced wafer 5 in a batch of diced wafers 5 that have undergone identical manufacturing processes together can be defined as a batch navigation diced wafer composite image, which can be used to aid or guide direct navigation from one die/grid position to another die/grid position during die sort operations on the first or a kth diced wafer in the batch, where k>1. In some embodiments, based upon the batch navigation composite image, the SWIS 200 can generate and store expected relative encoder position offsets for each die/grid position within the diced wafer's active area, where such relative encoder position offsets are referenced with respect to the first/start die.

If the batch navigation composite image was generated based upon the diced wafer 5 currently undergoing die sort operations, then the rotational orientation of the batch navigation composite image is the same as the rotational orientation of the diced wafer 5 currently on the expansion table 210, or the skeleton wafer 10 generated from this diced wafer 5. That is, a rotational orientation difference between the batch navigation composite image and the diced wafer 5 currently on the expansion table is zero. However, if the batch navigation composite image was generated based upon a particular diced wafer 5 that is different from a diced wafer 5 presently on the expansion table 210 for which die sort operations are currently underway or have completed, then there can be a rotational orientation difference or offset between the batch navigation composite image and the diced wafer 5 or skeleton wafer 10 currently carried by the expansion table 210. Such that accurate direct navigation from a current or given die/grid position to a next or target die/grid position can occur, a rotational offset θ can be determined. For instance, if the batch navigation composite image was generated based upon a first diced wafer 5 in a batch, and the diced wafer 5 currently undergoing die sort operations is the kth diced wafer 5 in the same batch, then the SWIS 200 can generate a composite image for the kth diced wafer; determine the center point of the kth diced wafer in the composite image thereof; and register the batch navigation composite image with the kth diced wafer composite image by way of one or more conventional image registration techniques to determine a rotational offset θ between the composite image of the kth diced wafer 5 and the batch navigation composite image. The composite image of the kth diced wafer 5 can thus be referred to as a rotation check composite image. Once the rotational offset θ is known, the expansion table 210 can be rotated to correct or compensate for the rotational offset θ, and direct die sort apparatus navigation from a given die/grid position to another die/grid position on the kth diced wafer can occur in a manner set forth above.

In a manner analogous to that described above, the batch navigation composite image can also be used as a navigation aid or guide for direct die sort apparatus navigation on a skeleton wafer 10.

Representative Verification of Die Sort Apparatus Detection of Correct Reference Die In addition to the foregoing, the batch navigation composite image can be used to aid verification of whether the die sort apparatus 115 has detected or selected the correct or actual reference die 21 on the kth diced wafer, prior to initiating selective picking of die 20 from the kth diced wafer 5 during die sort operations. More particularly, a diced wafer composite image can be generated for the kth diced wafer, and a corresponding reference origin, such as the center point of the diced wafer in this composite image, can be automatically detected (e.g., in a manner indicated above). The batch navigation composite image and the kth diced wafer composite image can be registered relative to each other, and the expansion table 210 can be rotated to correct or compensate for any rotational offset θ between the batch navigation composite image and the kth diced wafer composite image.

A die sort/composite image generation/composite image navigation/skeleton wafer inspection configuration or setup recipe can include relative encoder position offsets corresponding to a plurality of auxiliary reference die, which reside or are defined to reside on a reference diced wafer 5, such that the (x, y) coordinates or relative encoder position offsets of each auxiliary reference die is accurately defined, measured, or known with respect to the positions of the first/start die and/or the reference die 21 on the reference diced wafer 5. The auxiliary reference die can include particular types of die, such as mirror die or dummy die, having characteristics that facilitate their automatic detection by the die sort apparatus 115.

The die sort apparatus 115 can detect a reference die 21 on the kth diced wafer, e.g., in a conventional manner, which may or may not be the kth diced wafer's correct, true, or actual reference die 21. The detected reference die 21 can thus be defined as a candidate reference die 21. After detection of the candidate reference die 21, the die sort apparatus 115 can utilize the relative encoder position offsets corresponding to a given auxiliary reference die to directly navigate from the position of the candidate reference die 21 to a diced wafer position that is expected to be the position of the auxiliary reference die. The die sort apparatus imaging system can then capture analyze an image at this expected auxiliary reference die position, and possibly capture and analyze a number of images at physical grid position offsets adjacent to or neighboring this expected auxiliary reference die position, to determine if a die 20 located at the expected auxiliary reference die position is actually the intended auxiliary reference die. If a die 20 located at the expected auxiliary reference die position is not the intended auxiliary reference die, then the candidate reference die 21 is not, or is likely not, the correct or actual reference die. The die sort apparatus 115 can repeat the above procedure to navigate to the expected locations of multiple auxiliary reference die, in order to enhance the accuracy and reliability of determining whether the candidate reference die 21 is the correct reference die 21. If the die sort apparatus 115 confirms that the candidate reference die 21 is not actually the true reference die 21, another candidate reference die 21 can be detected or selected (e.g., automatically and/or manually), and the foregoing procedure can be repeated.

If for each auxiliary reference die, the auxiliary reference die was accurately detected or recognized at the corresponding expected auxiliary reference die position, then the candidate reference die 21 is or is highly likely to be the diced kth died wafer's actual reference die 21. Upon confirming that each auxiliary reference die was accurately detected following navigation to its expected position, the selective removal of die 20 from the kth diced wafer 5 can begin.

Embodiments in accordance with the present disclosure can thus reduce or greatly reduce the likelihood that an incorrect reference die 21 is detected or selected prior to die picking operations, thus reducing or greatly reducing the likelihood of a serious systemic error at the onset of picking operations.

One having ordinary skill in the relevant art will recognize that navigation to one or more expected auxiliary reference die positions can begin from a different position on the kth diced wafer, such as the position of the kth diced wafer's first/start die, following navigation from the position of the kth diced wafer's candidate reference die 21 to the expected position of the kth diced wafer's first/start die.

Representative Skeleton Wafer Repopulation Operations

After die sort operations for the kth diced wafer 5 are complete, the kth diced wafer 5 exists as a kth skeleton wafer 10 that is typically depopulated of many, most, or nearly/ essentially all of its active area die 20. In the event that the SWIS 200 determines that die picking errors (e.g., more than a predetermined number or percentage of die picking errors) have occurred for the kth skeleton wafer 10 based upon an analysis of the kth skeleton wafer composite image, the SWIS 200 and the pick and place apparatus 160 can use the batch navigation composite image as a navigational guide for initiating or directing the repopulation of the skeleton wafer 10 with die 20 that had been previously extracted therefrom, and transferred to a given destination such as a tape reel. Such repopulation of the kth skeleton wafer 10 essentially recreates the kth diced wafer 5, or creates a substitute/replacement kth diced wafer 5, such that the die 20 that are returned to the film frame 12 are spatially organized with high positional accuracy at their active area die positions. As a result, the substitute/replacement diced wafer 5 can again undergo die sort operations to remedy one or more die picking errors.

More particularly, as part of tape and reel operations during which die 20 are removed from the kth diced wafer 5 and transferred to a tape reel by way of a tape and reel assembly 120, a die ID and a diced wafer location/grid position corresponding to each such die 20 can be stored (e.g., in a memory or database, such as in the form of a picked die data file). The physical diced wafer location/grid position of each die 20 can be defined by the encoder positions for the die 20. For each die 20 of the kth diced wafer 5 that had been transferred to the tape reel, repopulation of the kth skeleton wafer 10 can involve retrieving the die 20 from the tape reel, retrieving the corresponding stored die ID and diced wafer location/grid position, and placing the die 20 back on the kth skeleton wafer 10 at its appropriate diced wafer location/grid position by way of the pick and place apparatus 160.

If the kth skeleton wafer 10 has not been removed from and remains securely retained by the expansion table 210 after a first set of die sort operations are complete, the encoder positions defining the location of the kth skeleton wafer's reference origin/grid position, such as the kth skeleton wafer's center point, are known. As a result, the kth skeleton wafer 10 can be directly repopulated while it remains on the expansion table 210.

In the event that repopulation of the kth skeleton wafer 10 occurs after the kth skeleton wafer has been removed from the expansion table 210, and then transferred to this or another expansion table 210 prior to repopulation, the SWIS 200 can generate a composite image of the kth skeleton wafer 10, and determine the kth skeleton wafer's reference origin, such as its center point, within the composite image. The kth skeleton wafer composite image can be registered with the batch navigation composite image by way of one or more conventional image registration techniques, and the position of the reference die 21 on the kth skeleton wafer 10 can be verified or confirmed in a manner essentially identical or analogous to that described above.

After verification of the position of the reference die 21 on the kth skeleton wafer 10, die 20 can be placed back on the film frame 20 in accordance with their stored encoder positions, such that repopulated die 20 accurately reside at their active area grid positions.

Representative SWIS Implementations with Inspection Systems

In a number of embodiments, an SWIS 200 can be incorporated into or integrated with essentially any type of inspection system or apparatus configured for handling and inspecting components such as die 20 carried by film frames 20, even without the inclusion of an expansion table 210 in the inspection system or apparatus. As a result, the inspection system can be used not only for performing its originally intended inspection operations (e.g., the capture of images for purpose of recognizing micron or submicron size defects on die 20), but can additionally be used for performing stand-alone skeleton wafer inspection operations, separate from a die sorting apparatus 114.

In such embodiments, the inspection system includes or is adapted to include (a) an image capture device 220 configured or configurable for capturing segmental images of skeleton wafers 10; and (b) processing resources configured or configurable for (i) generating composite images corresponding to such skeleton wafers, (ii) determining a reference origin and/or a first/start die position on each skeleton wafer 10; (iii) receiving or retrieving PW map information corresponding to the skeleton wafers 10, and (iv) correlating information content in each skeleton wafer composite image with information content in the corresponding PW map to identify whether one or more types of die picking errors had occurred, in a manner essentially identical or analogous to that described above.

As a representative example provided to aid understanding, an optical inspection system such as that described in International Patent Publication No. WO/2010082901 is configured for carrying, securely retaining, and precisely positioning wafers and diced wafers 5 mounted on film frames 12 by way of a wafer table assembly. The wafer table assembly can include a highly planar or ultra-planar wafer table, such as that described in International Patent Publication No. WO/2014035346. Such a wafer table assembly can thus carry, securely retain, and precisely position a skeleton wafer 10, in a manner readily understood by one having ordinary skill in the art.

When a skeleton wafer 10 is carried and securely retained by such a wafer table, the film 11 is not expanded as it was while the diced wafer 5 from which the skeleton wafer 10 was generated resided on the expansion table 210 during die sort operations. Rather, the film 11 is in a slightly or partially relaxed state. Thus, the inter-die separation distance(s) on the skeleton wafer 10 are expected to be different than if the skeleton wafer 10 were carried by an expansion table 210. Notwithstanding, the orientations of the gridlines 30, 32, and hence the relative ordinal or row-column grid positions on the skeleton wafer 10 remain unchanged, essentially unchanged, or approximately unchanged. As a result, the wafer table can be positioned beneath an SWIS image capture device 220 incorporated into the inspection system, such that segmental images of the skeleton wafer 10 can be captured. A skeleton wafer composite image can then be generated, and the position of a reference origin and a first/start die within the skeleton wafer composite image can be determined. Skeleton wafer information content (e.g., pixel array values) corresponding to each active area die position can then be correlated with information content in the skeleton wafer's PW map for each counterpart die position to facilitate or enable the determination of whether one or more types of die picking errors occurred during die sort operations.

Aspects of Representative Processes Relating to Composite Image Generation

Figure 15A:
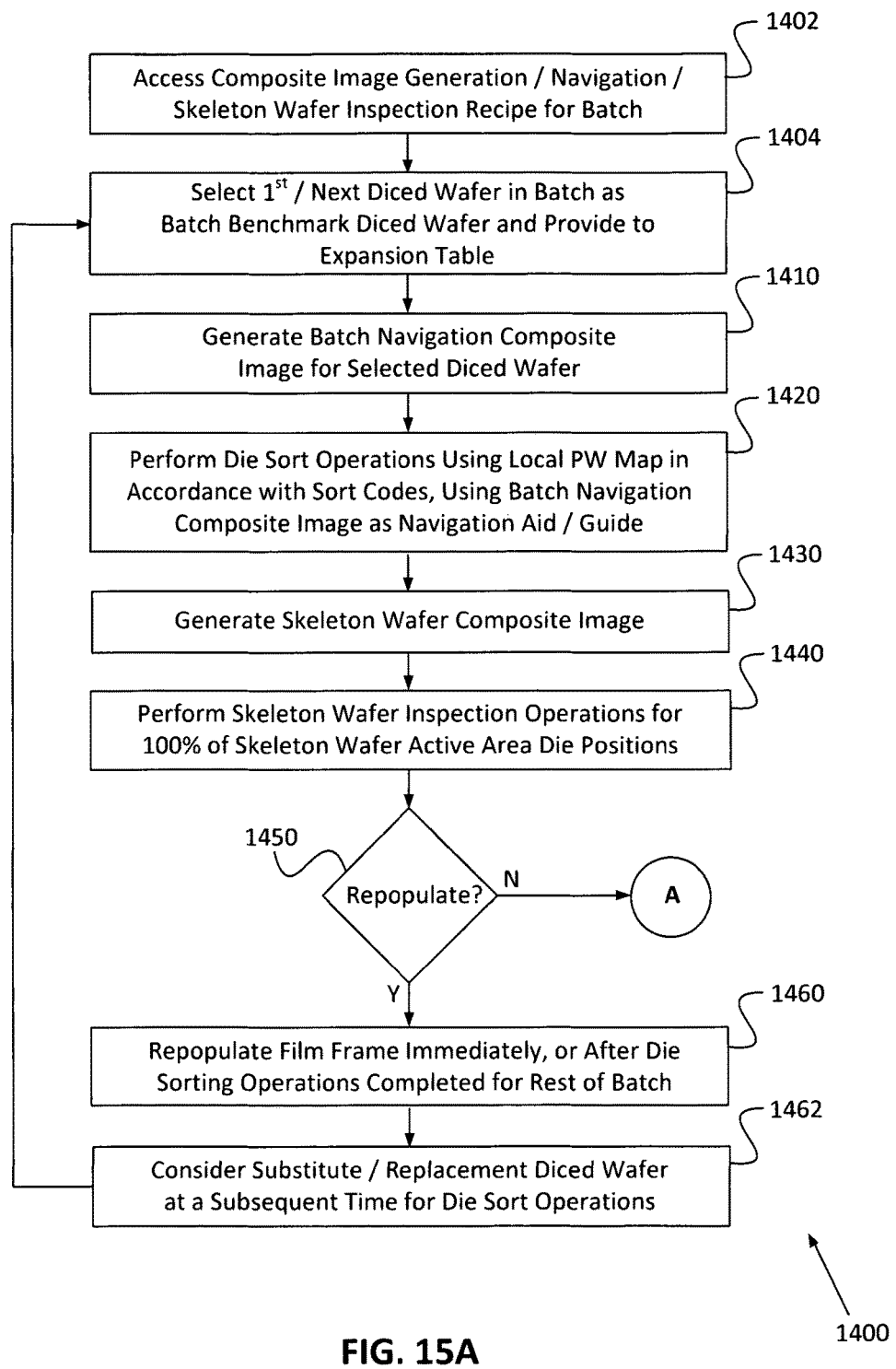
FIGS. 15A-15B are flow diagrams of a representative process involving composite image generation in accordance with an embodiment of the present disclosure.
Figure 15B:
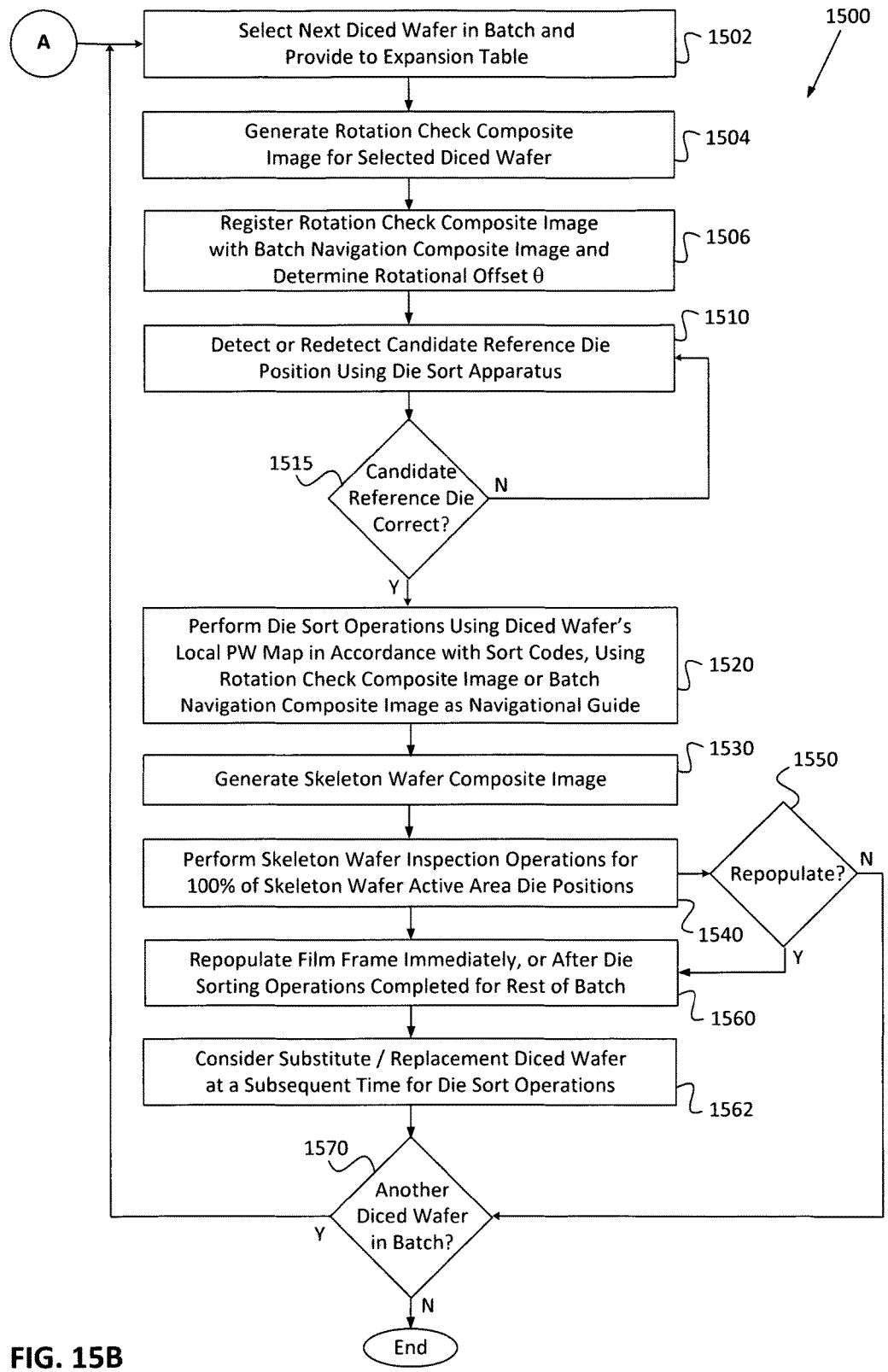

FIGS. 15A and 15B are a flow diagram illustrating a process 1400, 1500 relating to composite image generation in accordance with an embodiment of the present disclosure. The process 1400, 1500 involves (a) batch die sorting operations in which a batch navigation composite image is used as an aid or guide during pick and place operations; (b) skeleton wafer inspection operations upon each skeleton wafer 10 created in association with the die sorting operations; and possibly (c) film frame repopulation operations.

Figure 16:
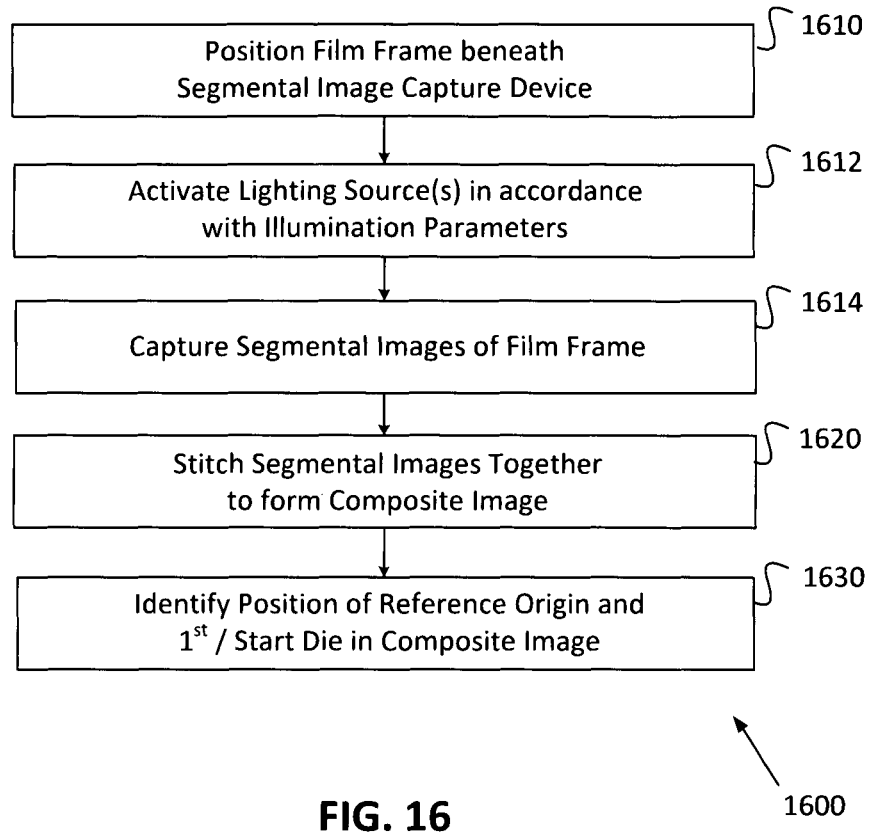
FIGS. 16 and 17 are flow diagrams of representative composite image generation and skeleton wafer inspection processes, respectively, in accordance with an embodiment of the present disclosure.

In an embodiment, composite image generation/navigation parameters, and skeleton wafer inspection parameters, are retrieved from a recipe in a first process portion 1402. A first or next diced wafer 5 in a batch is selected and transferred to an expansion table 210 in a second process portion 1404, and a batch navigation composite image is generated therefrom in a third process portion 1410. The batch navigation composite image can be generated in a manner identical, essentially identical, or analogous to that described above, such as illustrated in a composite image generation process 1600 in accordance with an embodiment of the present disclosure as shown in FIG. 16.

In a fourth process portion 1420, die sort operations are performed on the current diced wafer 5, using the batch navigation composite image as an aid or guide for direct navigation of the die sort apparatus 115 to the position of each die 20 that is designated for removal from the film frame 20 in accordance with the PW map corresponding to the diced wafer 5. After die sort operations are complete, a skeleton wafer composite image is generated in a fifth process portion 1430, such as in a manner indicated in FIG. 16.

Figure 17:
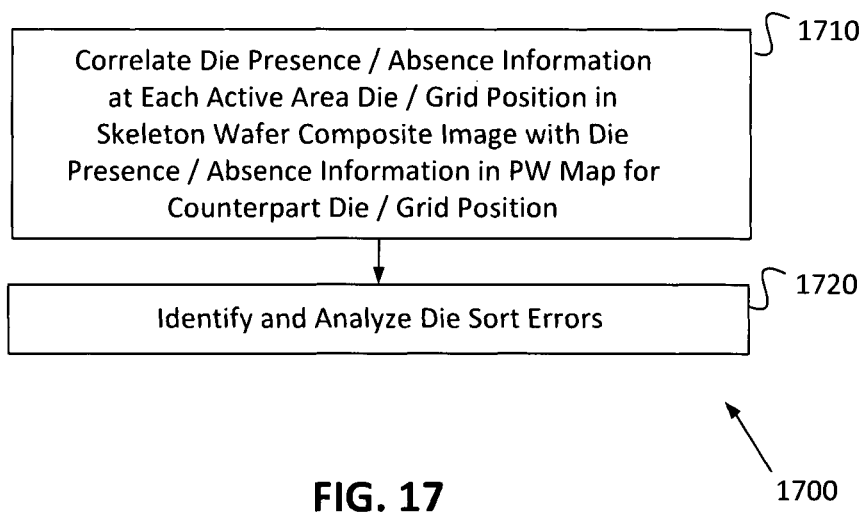

Inspection of 100% of the skeleton wafer's active area die positions then occurs in a sixth process portion 1440. Such 100% skeleton wafer inspection can occur in a manner identical, essentially identical, or analogous to that previously described, such as illustrated in a skeleton wafer inspection process 1700 in accordance with an embodiment of the present disclosure as shown in FIG. 17. It is to be noted that with respect to analyzing die sorting errors, such as in association with a second process portion 1720 of FIG. 17, a relative encoder position map can facilitate determination of the nature of a discrepancy between skeleton wafer composite image information content and PW map information content. For each occurrence of die presence 52 or die absence 50 as indicated in a skeleton wafer extraction map, relative encoder positions within the relative encoder position map for the appropriate die/grid position can be correlated with counterpart die sort apparatus encoder positions stored in the PW map. For instance, for stay-behind die 50 indicated by the skeleton wafer extraction map, differences between relative encoder positions thereof in the relative encoder position map for the stay-behind die 50 can be correlated or compared with differences between die sort apparatus encoder positions for counterpart die/grid-positions in the PW map. For active area die positions indicated as stay-behind die 50 by the skeleton wafer extraction map, if the magnitude of the relative encoder position difference exceeds the magnitude of the die sort apparatus encoder position difference by more than a predetermined amount, e.g., corresponding to a spatial positioning error of more than approximately 20% of the die size, this indicates that a defective die 20 has been incorrectly picked from the film frame 12, instead of remaining on the film frame 12 following completion of die sort operations.

With reference again to FIG. 15A, depending upon a number and/or nature of die extraction errors identified in association with skeleton wafer inspection, repopulation of the skeleton wafer 10 can be indicated or warranted. Repopulation can occur by way of seventh and eighth process portion 1450, 1460. A repopulated film frame 12 can be considered for again for die sort operations at a subsequent time (e.g., immediately after repopulation, or later) in a ninth process portion 1462. In some embodiments, if repopulation was warranted or indicated, an undesirable number of die extraction errors occurred. This may indicate that one or more problems exist with the previously created batch navigation composite image. Consequently, another diced wafer 5 can be selected for generating a replacement batch navigation composite image by way of a ninth process portion 1462, which returns to the second process portion 1404.

If in association with the seventh process portion 1450 no film frame repopulation is warranted or indicated, the selection of a next diced wafer 5; the generation of a rotation check composite image; the verification of whether the correct reference die 21 has been detected on the selected diced wafer 5; die sorting of the selected diced wafer 5; skeleton inspection of the corresponding skeleton wafer 10; and possibly repopulation operations are considered in a tenth through a twenty first process portion 1502-1570, as indicated in FIG. 15B. The tenth through twenty first process portions 1502-1570 can be repeated for each additional diced wafer 5 in the batch.

Figure 18:
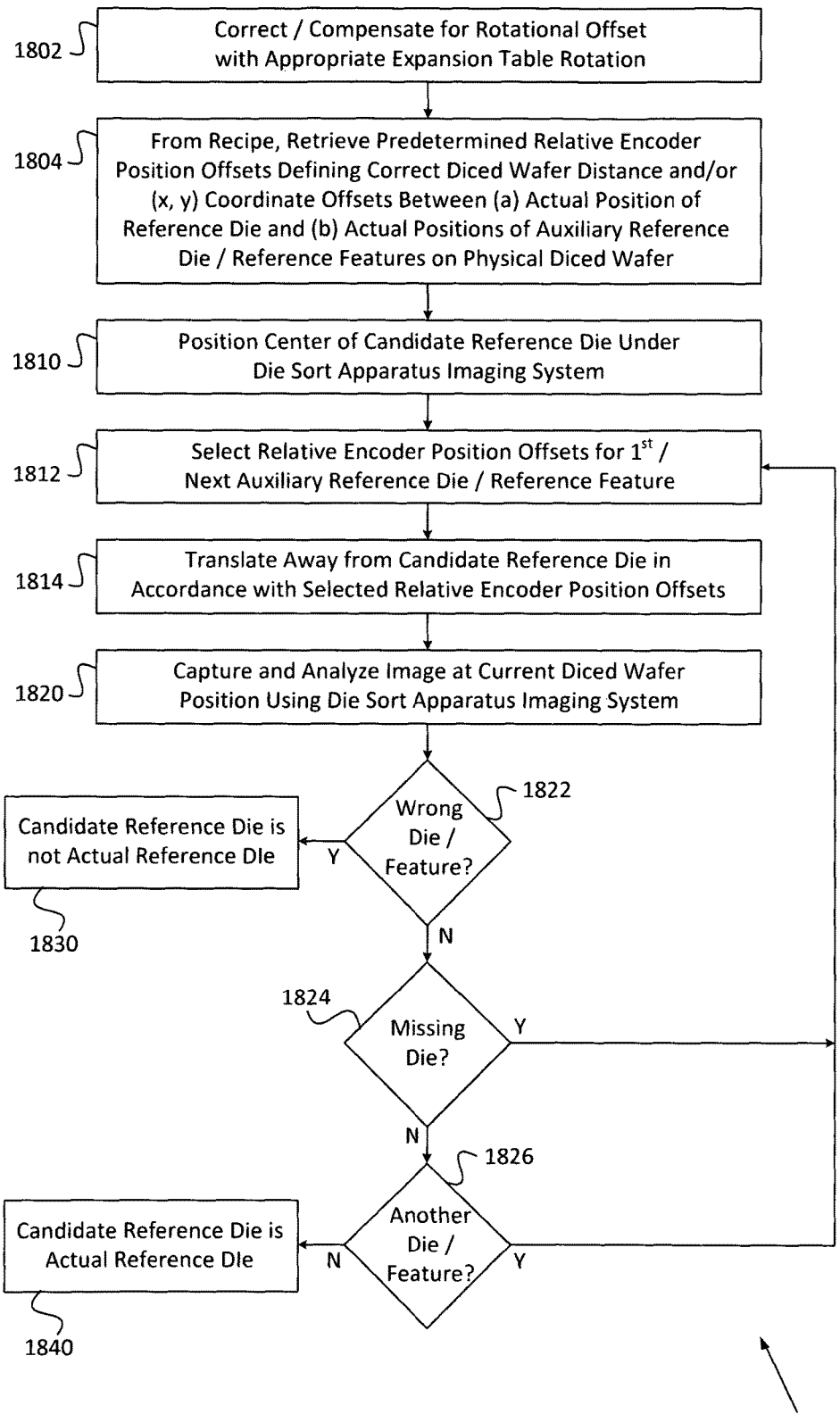
FIG. 18 is a flow diagram of a representative process for automatically verifying whether a reference die detected or selected by a die sorting apparatus is the correct reference die in accordance with an embodiment of the present disclosure.

FIG. 18 is a flow diagram illustrating a simplified process 1800 for verifying whether the correct reference die 21 has been selected on a diced wafer 5 in accordance with an embodiment of the present disclosure. The process 1800 includes a first through an eleventh process portion 1802-1840 directed to determining whether a candidate reference die is the actual reference die 21, in a manner essentially identical or analogous to that described above.

Figure 19:
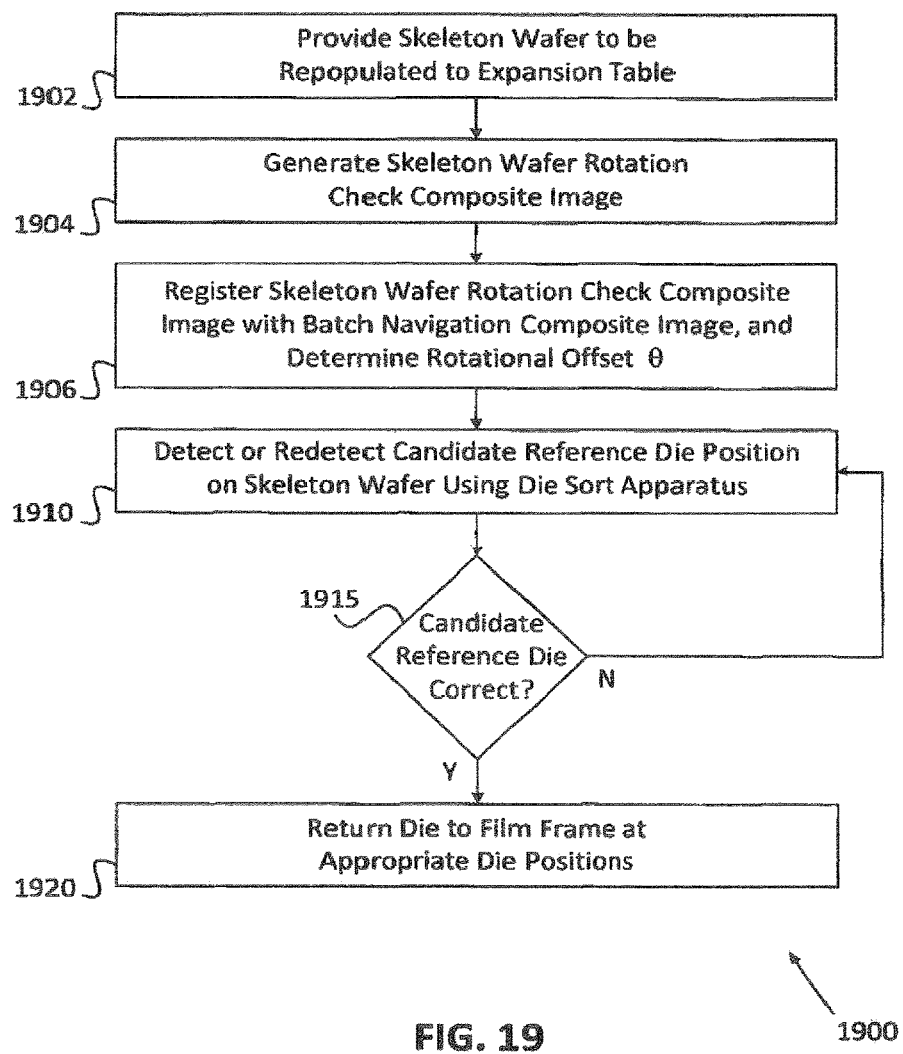
FIG. 19 is a flow diagram of a representative process for repopulating a film frame in accordance with an embodiment of the present disclosure.

FIG. 19 is a flow diagram illustrating a process 1900 for repopulating a film frame 12 from which die 20 have been selectively removed in accordance with an embodiment of the present disclosure. The process 1900 includes a first through a sixth process portion 1902-1920 directed to film frame repopulation in a manner essentially identical or analogous to that described above.

Aspects of particular embodiments of the present disclosure address at least one aspect, problem, limitation, and/or disadvantage associated with existing techniques for inspecting skeleton wafers. While features, aspects, and/or advantages associated with certain embodiments have been described in the disclosure, other embodiments may also exhibit such features, aspects, and/or advantages, and not all embodiments need necessarily exhibit such features, aspects, and/or advantages to fall within the scope of the disclosure. It will be appreciated by a person of ordinary skill in the art that several of the above-disclosed systems, components, processes, or alternatives thereof, may be desirably combined into other different systems, components, processes, and/or applications. In addition, various modifications, alterations, and/or improvements may be made to various embodiments that are disclosed by a person of ordinary skill in the art within the scope of the present disclosure. Such different systems, components, processes and/or modifications, alterations, and/or improvements are encompassed by the present disclosure and the following claims.

The invention claimed is:

1. An automated method for generating at least one composite image corresponding to at least one film frame carrying diced components, the method comprising:

providing a film frame on which diced components are disposed in accordance with a plurality of grid positions, the plurality of grid positions including a set of active area grid positions within which manufactured components reside;

capturing a set of segmental images of the film frame, each segmental image corresponding to a predetermined portion of the spatial area spanned by the film frame and including at least a subset of the active area grid positions;

generating a composite image corresponding to the film frame from the set of segmental images, the composite image including image data indicative of (a) each active area grid position in which a component can reside, and (b) component presence at or component absence from each active area grid position;

processing the composite image by way of image processing techniques to determine within the composite image a reference origin and a location of a first active area grid position, wherein the reference origin comprises a predetermined point or a predetermined active area grid position in the composite image that represents each of (a) a counterpart predetermined point or predetermined active area grid position on the film frame and (b) a predetermined active area grid position in a process map corresponding to the manufactured components, wherein the process map comprises a data structure storing information content corresponding to each active area grid position indicating for each active area grid position whether a component residing thereat is acceptable or rejected;

analyzing pixel data within the composite image at each active area grid position to determine component presence at or component absence from a counterpart active area grid position on the film frame;

correlating information content in the composite image with information content in the process map for each active area grid position within the set of active area grid positions; and automatically determining whether (a) one or more components were incorrectly removed from the film frame during component sorting operations, or (b) one or more components were incorrectly residing on the film frame after component sorting operations, wherein providing the film frame comprises at least one of (a) providing the film frame prior to performance of a set of component sorting operations directed to selectively removing components from the film frame, and (b) providing the film frame after performance of the set of component sorting operations.

2. The method of claim 1, wherein the components are semiconductor die corresponding to a wafer, and wherein the film frame carries (a) at least portions of a wafer on which components have been manufactured within the set of active area grid positions or (b) a strip on which components have been manufactured within the set of active area grid positions.

3. The method of claim 1, wherein the reference origin is different than a location of a reference die on the film frame that is utilized for performance of the set of component sorting operations.

4. The method of claim 3, wherein processing the composite image comprises:

recognizing in the composite image at least portions of a plurality of gridlines corresponding to at least portions of a plurality of corresponding dicing grooves between the components on the film frame;

defining the plurality of grid positions based upon pixel areas within the composite image bordered by adjacent parallel gridlines and adjacent vertical gridlines within the plurality of gridlines; and determining the active area grid positions within the plurality of grid positions using the reference origin and a predetermined spatial relationship between the reference origin and the first active area grid position.

5. The method of claim 1, wherein capturing the set of segmental images comprises directing illumination toward at least one of (a) a top surface of the film frame in accordance with a first set of illumination parameters, and (b) a bottom surface of the first film frame in accordance with a second set of illumination parameters.

6. The method of claim 5, wherein the first set of illumination parameters and the second set of illumination parameters facilitate reliable image processing to discriminate between component presence at a grid position, component absence from a grid position, and gridlines defining each grid position.

7. The method of claim 1, wherein the set of segmental images includes a plurality of images corresponding to predetermined portions of an overall area of the film frame, and wherein generating the composite image comprises digitally stitching together individual segmental images within the set of segmental images.

8. The method of claim 7, wherein digitally stitching together individual segmental images within the set of segmental images comprises digitally joining at least portions of individual segmental images that correspond to adjacent areas of the film frame, by way of aligning individual segmental images that (a) overlap along a common set of boundaries corresponding to component edges and/or component features of the same components, and/or (b) are directly adjacent to one another based upon encoder values indicating physical space coordinates of the film frame relative during capture of the set of segmental images.

9. The method of claim 1, further comprising accessing a recipe prior to generating the composite image, the recipe including at least one of: (a) grid information including a number of horizontal gridlines and a number of vertical gridlines defining the plurality of grid positions; (b) image capture device parameters including an image capture device resolution and an image capture device field of view relative to component size and the wafer size; (c) at least one set of illumination parameters for controlling characteristics of illumination incident upon the film frame during the capture of the set of segmental images; (d) a number of segmental images to be captured; (e) an extent of overlap between individual segmental images within the set of segmental images; (f) a set of reference origin parameters indicating or defining a location of the reference origin relative to the plurality of grid positions; (g) a first active area grid position identifying a location of a first component within the set of active area grid positions; and (h) a set of parameters enabling verification of the location of a reference die detected by a die sort apparatus.

10. The method of claim 1, wherein correlating information content comprises correlating pixel values corresponding to each active area grid position within the composite image with a digital code in the process map corresponding to that active area grid position.

11. The method of claim 1, wherein providing a film frame comprises providing a the film frame prior to the performance of the set of component sorting operations thereon, and wherein generating a composite image comprises generating a composite image for the film frame prior to the performance of the set of component sorting operations thereon.

12. The method of claim 1, wherein providing the film frame comprises providing the film frame after performance of the set of component sorting operations thereon, and wherein generating a composite image comprises generating a composite image for the film frame after performance of the set of component sorting operations thereon.

13. The method of claim 11, further comprising using the composite image generated for the film frame prior to performance of the set of component sorting operations thereon as an aid or guide for navigation during a set of pick and place operations to position at least one of:
    (a) a target active area grid position relative to a pick and place apparatus during or after performance of the set of component sorting operations on the same film frame or a different film frame;
    (b) each active area grid position relative to the pick and place apparatus during performance of the set of component sorting operations on the same film frame or a different film frame; and
    (c) at least some active area grid positions within the plurality of grid positions relative to the pick and place apparatus during a set of film frame repopulation operations by which components that had been removed from the same or a different film frame as a result of the set of component sorting operations.

14. The method of claim 13, wherein the film frame is a first film frame that carries a first diced wafer in a batch of diced wafers, wherein the composite image of the film frame includes a composite image of the first diced wafer, and wherein using the composite image as an aid or guide for navigation comprises:
    storing the composite image of the first diced wafer as a batch navigation composite image that can be used as a navigation aid or guide for each diced wafer in the batch;
    selecting a second film frame carrying a second diced wafer in the batch;
    generating a composite image of the second diced wafer;
    determining and correcting for a rotational offset between the batch navigation composite image and the composite image of the second diced wafer by way of an image registration technique.

15. The method of claim 14, further comprising:
    identifying a current die position on the second diced wafer and a counterpart current die position in the composite image of the second diced wafer;
    identifying a target die position on the second diced wafer and a counterpart target die position in the batch navigation composite image;
    calculating a relative encoder position corresponding to the current die position and a relative encoder position corresponding to the target die position using the batch navigation image and an image space to physical space conversion factor;
    generating updated encoder positions based upon each calculated relative encoder position; and
    directly navigating the pick and place apparatus from the current die position to or within a set of boundaries of the target die position using the updated encoder positions.

16. The method of claim 14, further comprising verifying detection of a correct reference die on the second diced wafer by a die sort apparatus by way of:
    retrieving from the recipe a relative encoder position offset corresponding to an auxiliary reference die;
    directly navigating the die sort apparatus from a candidate reference die position or a candidate reference origin to an expected position of the auxiliary reference die;
    automatically determining whether the auxiliary reference die is present at the expected position of the auxiliary reference die; and
    verifying whether the candidate reference die is the correct reference die based upon whether the auxiliary reference die is present at the expected position of the auxiliary reference die.

17. The method of claim 14, further comprising:
    selectively removing die from the second diced wafer to create a skeleton wafer;
    generating a composite image of the skeleton wafer; and
    determining and correcting for a rotational offset between the batch navigation composite image and the composite image of the skeleton wafer by way of an image registration technique.

18. The method of claim 17, further comprising:
    retrieving from the recipe a relative encoder position offset corresponding to an auxiliary reference die;
    directly navigating the pick and place apparatus from a candidate reference die position or a candidate reference origin on the skeleton wafer to an expected position of the auxiliary reference die;
    automatically determining whether the auxiliary reference die is present at the expected position of the auxiliary reference die;
    verifying whether the candidate reference die is the correct reference die based upon whether the auxiliary reference die is present at the expected position of the auxiliary reference die; and
    initiating a set of film frame repopulation operations based upon verification of whether the candidate reference die is the correct reference die, the set of film frame repopulation operations comprising returning die removed from the second diced wafer to the second film frame to create a substitute second diced wafer, and wherein one of the skeleton wafer composite image and the batch navigation composite image is used as an aid or guide for navigation to different die positions on the second film frame during the set of film frame repopulation operations.

19. The method of claim 1, wherein generating the composite image occurs in parallel with performance of the set of component sorting operations by way of a parallel computing process.

20. An automated method for generating at least one composite image corresponding to at least one film frame carrying diced components, the method comprising:
    providing a film frame on which diced components are disposed in accordance with a plurality of grid positions, the plurality of grid positions including a set of active area grid positions within which manufactured components reside;
    capturing a set of segmental images of the film frame, each segmental image corresponding to a predetermined portion of the spatial area spanned by the film frame and including at least a subset of the active area grid positions;
    generating a composite image corresponding to the film frame from the set of segmental images, the composite image including image data indicative of (a) each active area grid position in which a component can reside, and (b) component presence at or component absence from each active area grid position; and processing the composite image by way of image processing techniques to determine within the composite image a reference origin and a location of a first active area grid position, wherein the reference origin comprises a predetermined point or a predetermined active area grid position in the composite image that represents each of (a) a counterpart predetermined point or predetermined active area grid position on the film frame and (b) a predetermined active area grid position in a process map corresponding to the manufactured components, wherein the process map comprises a data structure storing information content corresponding to each active area grid position indicating for each active area grid position whether a component residing thereat is acceptable or rejected, wherein capturing the set of segmental images comprises capturing each segmental image using an image capture device having a resolution that is less than a resolution of an image capture device used for inspecting individual components for micron and submicron scale defects thereon and a field of view that is larger than a field of view of the image capture device used for inspecting individual components for micron or submicron scale defects thereon.

21. A system for generating at least one composite image corresponding to at least one film frame carrying diced components within an active grid area of a plurality of grid positions, the system comprising:

a processing unit;

an expansion table or a wafer table configured for carrying and securely retaining the film frame;

a set of lighting sources configured for directing illumination toward the film frame while the film frame is carried by the expansion table or the wafer table;

an image capture device; and a memory storing at least one set of program instructions which when executed cause the processing unit to perform an automated method for generating at least one composite image corresponding to at least one film frame carrying diced components, the method comprising:

providing a film frame on which diced components are disposed in accordance with a plurality of grid positions, the plurality of grid positions including a set of active area grid positions within which manufactured components reside;

capturing a set of segmental images of the film frame, each segmental image corresponding to a predetermined portion of the spatial area spanned by the film frame and including at least a subset of the active area grid positions;

generating a composite image corresponding to the film frame from the set of segmental images, the composite image including image data indicative of (a) each active area grid position in which a component can reside, and (b) component presence at or component absence from each active area grid position; and processing the composite image by way of image processing techniques to determine within the composite image a reference origin and a location of a first active area grid position, wherein the reference origin comprises a predetermined point or a predetermined active area grid position in the composite image that represents each of (a) a counterpart predetermined point or predetermined active area grid position on the film frame and (b) a predetermined active area grid position in a process map corresponding to the manufactured components, wherein the process map comprises a data structure storing information content corresponding to each active area grid position indicating for each active area grid position whether a component residing thereat is acceptable or rejected, wherein the image capture device has a resolution that is less than a resolution of an image capture device used for inspecting individual components for micron or submicron scale defects thereon and a field of view that is larger than a field of view of the image capture device used for inspecting individual components for micron or submicron scale defects thereon.

22. The system of claim 21, wherein the processing unit is coupled to a component sorting apparatus configured for performing a set of component sorting operations on the film frame, the set of component sorting operations directed to selectively removing components from the film frame based upon process map information content.

23. The system of claim 22, wherein (a) the system is integrated in-line with a component sorting apparatus configured to perform the set of component sorting operations, or (b) the system is separate from the component sorting apparatus.

24. The system of claim 21, wherein the set of lighting sources comprises at least one of (a) a first set of lighting sources configured for directing illumination toward a top surface of the film frame in accordance with a first set of illumination parameters during capture of the set of segmental images, and (b) a second set of lighting sources configured for directing illumination toward a bottom surface of the first film frame in accordance with a second set of illumination parameters during capture of the set of segmental images.

25. The system of claim 21, wherein the memory stores a recipe including at least some of: (a) grid information including a number of horizontal gridlines and a number of vertical gridlines defining the plurality of grid positions; (b) image capture device parameters including an image capture device resolution and an image capture device field of view (FOV) relative to component size and the wafer size; (c) at least one set of illumination parameters for controlling characteristics of illumination incident upon the film frame during the capture of the set of segmental images; (d) a number of segmental images to be captured; (e) an extent of overlap between individual segmental images within the set of segmental images; (f) a set of reference origin parameters indicating or defining a location of the reference origin relative to the plurality of grid positions; (g) a first active area grid position identifying a location of a first component within the set of active area grid positions; and (h) a set of parameters enabling verification of the location of a reference die detected by a die sort apparatus.

* * * * *

UNITED STATES PATENT AND TRADEMARK OFFICE
CERTIFICATE OF CORRECTION

PATENT NO. : 9,934,565 B2  
APPLICATION NO. : 14/896311  
DATED : April 3, 2018  
INVENTOR(S) : Ajharali Amanullah et al.

Page 1 of 1

It is certified that error appears in the above-identified patent and that said Letters Patent is hereby corrected as shown below:

In the Specification

Column 1, Line 9, Delete "PCT/SG2014/000251" and insert -- PCT/SG2014/000262 --

In the Claims

Column 61, Line 2, Claim 11, Delete "a the" and inset -- the --

Signed and Sealed this  
Tenth Day of July, 2018

Andrei Iancu  
*Director of the United States Patent and Trademark Office*